(12) United States Patent
Terada et al.

(10) Patent No.: US 10,115,669 B2
(45) Date of Patent: Oct. 30, 2018

(54) HIGH DENSITY NONVOLATILE MEMORY CELL UNIT ARRAY

(71) Applicant: SONY SEMICONDUCTOR SOLUTIONS CORPORATION, Kanagawa (JP)

(72) Inventors: Haruhiko Terada, Kanagawa (JP); Makoto Kitagawa, Chiba (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/509,575

(22) PCT Filed: Jul. 16, 2015

(86) PCT No.: PCT/JP2015/070393
§ 371 (c)(1),
(2) Date: Mar. 8, 2017

(87) PCT Pub. No.: WO2016/047254
PCT Pub. Date: Mar. 31, 2016

(65) Prior Publication Data
US 2017/0294375 A1    Oct. 12, 2017

(30) Foreign Application Priority Data
Sep. 22, 2014 (JP) ................................. 2014-192269

(51) Int. Cl.
*H01L 21/02* (2006.01)
*H01L 23/528* (2006.01)
(Continued)

(52) U.S. Cl.
CPC .......... *H01L 23/528* (2013.01); *H01L 27/222* (2013.01); *H01L 27/2481* (2013.01);
(Continued)

(58) Field of Classification Search
CPC . H01L 23/528; H01L 27/2481; H01L 27/222; H01L 27/101; H01L 27/1021;
(Continued)

(56) References Cited

U.S. PATENT DOCUMENTS

2014/0056055 A1* 2/2014 Ikeda ..................... G11C 13/00
365/148

FOREIGN PATENT DOCUMENTS

JP    2009-223971 A    10/2009
JP    2011-154754 A    8/2011

OTHER PUBLICATIONS

International Search Report prepared by the Japan Patent Office dated Aug. 20, 2015, for International Application No. PCT/JP2015/070393.

* cited by examiner

*Primary Examiner* — Thinh T Nguyen
(74) *Attorney, Agent, or Firm* — Sheridan Ross P.C.

(57) ABSTRACT

In a memory cell unit array, memory cell units each constituted of first wires, second wires, and a nonvolatile memory cell are arranged in a two-dimensional matrix form in a first direction and a second direction. Each of the memory cell units includes a control circuit below it. The control circuit is constituted of a first control circuit and a second control circuit. The second wires are connected to the second control circuit. Some of the first wires that constitute the memory cell unit are connected to the first control circuit that constitutes this memory cell unit. Others of the first wires are connected to the first control circuit that constitutes an adjacent memory cell unit adjacent thereto in the first direction.

20 Claims, 51 Drawing Sheets

(51) Int. Cl.
| | |
|---|---|
| *H01L 27/24* | (2006.01) |
| *H01L 27/22* | (2006.01) |
| H01L 45/00 | (2006.01) |
| H01L 27/10 | (2006.01) |
| G11C 19/08 | (2006.01) |
| H01L 27/102 | (2006.01) |
| G11C 13/00 | (2006.01) |

(52) U.S. Cl.
CPC ...... *G11C 13/0007* (2013.01); *G11C 19/0883* (2013.01); *H01L 27/101* (2013.01); *H01L 27/1021* (2013.01); *H01L 45/085* (2013.01); *H01L 45/145* (2013.01)

(58) Field of Classification Search
CPC ... H01L 27/2049; H01L 45/145; H01L 45/06; H01L 45/085; H01L 45/1233; H01L 45/141
USPC ........ 257/5, 295, 208, E29.166; 365/51, 158
See application file for complete search history.

HIGH DENSITY NONVOLATILE MEMORY CELL UNIT ARRAY

CROSS REFERENCE TO RELATED APPLICATIONS

This application is a national stage application under 35 U.S.C. 371 and claims the benefit of PCT Application No. PCT/JP2015/070393 having an international filing date of 16 Jul. 2015, which designated the United States, which PCT application claimed the benefit of Japanese Patent Application No. 2014-192269 filed 22 Sep. 2014, the disclosures of which are incorporated herein by reference in their entirety.

TECHNICAL FIELD

The present disclosure relates to a memory cell unit array and more particularly to a memory cell unit array constituted of a plurality of nonvolatile memory cells.

BACKGROUND ART

A so-called cross-point memory cell unit constituted of a plurality of nonvolatile memory cells is well-known. The cross-point memory cell unit is constituted of a plurality of first wires (bit lines) extending in a first direction, a plurality of second wires (word line) that are disposed separately from the first wires in upper and lower directions and extend in a second direction unlike the first wires, and a nonvolatile memory cell that is disposed in a region in which the first wires and the second wires overlap one another and connected to the first wires and the second wires. Information is written in and erased from the nonvolatile memory cell on the basis of a direction of voltage applied between the first wires and the second wires or a direction of current flowing between the first wires and the second wires.

In order to reduce a chip area in such a cross-point memory cell unit, a memory cell unit as disclosed in Japanese Patent Application Laid-open No. 2009-223971 includes two column-related control circuits and two row-related control circuits directly below a plurality of nonvolatile memory cells that constitutes it. The two column-related control circuits and the two row-related control circuits are arranged in a checker board form.

By the way, an indication generally used for expressing integration of semiconductor apparatuses is a minimum feature size "F". A configuration that can provide highest-density memory cells in the cross-point memory cell unit is a configuration in which the pitch of the bit line is 2F, the pitch of the word line is 2F, and an occupation area of a single memory cell is $4F^2$. It is necessary to form contact holes for connect the control circuits to the bit and word lines. It is often necessary to set a width between the wires to be larger than the minimum feature size "F" around the contact holes due to constraints (design rules) for enhancing manufacturing yield in manufacturing processes for semiconductor apparatuses. When a contact hole is formed at an end portion of a certain bit line, another contact hole cannot be formed at an end portion of a bit line adjacent to this bit line on the same side. It is because a distance between the bit line, which is widened for forming the contact hole therein, and the adjacent bit line would be smaller than the minimum feature size "F". Thus, in order to connect all the bit lines to the control circuits, an arrangement as schematically shown in FIG. 49 is employed, for example. In this arrangement, contact holes of odd-numbered bit lines as viewed in a plane are provided at end portions thereof on an upper side of FIG. 49. On the other hand, contact holes of even-numbered bit lines as viewed in the plane are provided at end portions thereof on a lower side of FIG. 49. The same applies to the word lines. Specifically, contact holes of odd-numbered word lines are provided at end portions thereof on a left side of FIG. 49 and contact holes of even-numbered word lines are provided at end portions thereof on a right side of FIG. 49.

CITATION LIST

Patent Literature

Patent Literature 1: Japanese Patent Application Laid-open No. 2009-223971

DISCLOSURE OF INVENTION

Technical Problem

FIG. 50A and FIG. 50B schematically show an arrangement of control circuits, contact holes, etc. in a cross-point memory cell unit as disclosed in the unexamined patent application publication above. FIG. 51A schematically shows an arrangement of the first wires (bit lines). FIG. 51B and FIG. 51C are schematic, partial cross-sectional views thereof which are taken along an arrow mark B-B and an arrow mark C-C of FIG. 50A. With this memory cell unit, an example in which a column-related control circuit 101A is connected to bit lines will be considered. In the column-related control circuit 101A, regarding odd-numbered bit lines 115 as viewed in a plane, one end portion of the column-related control circuit 101A is provided with contact holes 111. The odd-numbered bit lines 115 and the column-related control circuit 101A are connected to one another via the contact holes 111. On the other hand, regarding even-numbered bit lines 116 as viewed in the plane, contact holes 112 have to be provided at the other end portion of the column-related control circuit 101A. The column-related control circuit 101A and the even-numbered bit lines 116 are connected to one another via the contact holes 112, 113. If the contact holes 111, 112 are not arranged in this manner, a highest-density arrangement cannot be provided for the above-mentioned reason. The contact holes 112 and the contact holes 113 have to be connected to one another via wires 114 formed on an inter-layer insulating layer covering the column-related control circuits 101A, 101B and row-related control circuits 102A, 102B. The wires 114 are provided above the row-related control circuit 102B via the inter-layer insulating layer. Therefore, problems of occurrence of parasitic capacitance caused by the wires 114, noise occurrence in the wires 114, and interference between the wires 114 and the row-related control circuit 102B are likely to occur. Although not shown in the figures, similar problems occur also in wires that connect the column-related control circuit 101B and the odd-numbered bit lines to one another. In addition, similar problems occur also in wires that connect word lines and the row-related control circuits 102A, 102B to one another.

Thus, it is an object of the present disclosure to provide a memory cell unit array in which cross-point memory cell units are arranged in a two-dimensional matrix form, which has configurations and structures that can provide a highest-density arrangement of nonvolatile memory cells.

Solution to Problem

A memory cell unit array according to the present disclosure for accomplishing the above-mentioned object includes
memory cell units arranged in a two-dimensional matrix form in a first direction and a second direction, the memory cell units being each constituted of
a plurality of first wires extending in the first direction,
a plurality of second wires that are disposed separately from the first wires in upper and lower directions and extend in the second direction unlike the first wires, and
a nonvolatile memory cell that is disposed in a region in which the first wires and the second wires overlap one another and connected to the first wires and the second wires, in which
each of the memory cell units includes, below the memory cell unit, a control circuit that controls an operation of the memory cell unit,
the control circuit is constituted of
a first control circuit that controls an operation of the nonvolatile memory cell that constitutes the memory cell unit via the first wires, and
a second control circuit that controls an operation of the nonvolatile memory cell that constitutes the memory cell unit via the second wires,
the second wires that constitute the memory cell unit are connected to the second control circuit that constitutes the memory cell unit,
some of the first wires that constitute the memory cell unit are connected to the first control circuit that constitutes the memory cell unit, and
others of the first wires that constitute the memory cell unit are connected to a first control circuit that constitutes an adjacent memory cell unit adjacent thereto in the first direction.

Advantageous Effects of Invention

In the memory cell unit array according to the present disclosure, some of the first wires that constitute the memory cell unit are connected to the first control circuit that constitutes this memory cell unit, and others of the first wires that constitute the memory cell unit are connected to the first control circuit that constitutes the adjacent memory cell unit adjacent thereto in the first direction. Therefore, it is possible to provide a memory cell unit array in which cross-point memory cell units are arranged in a two-dimensional matrix form, which has configurations and structures that can provide a highest-density arrangement of nonvolatile memory cells. Note that effects described herein are merely examples and not limitative and additional effects may be provided.

BRIEF DESCRIPTION OF DRAWINGS

FIG. 32A and FIG. 3B are schematic, partial plan views of the memory cell unit array according to Example 2 as viewed along an arrow mark 32A and an arrow mark 32B of FIG. 27.

MODE(S) FOR CARRYING OUT THE INVENTION

Figure 1:
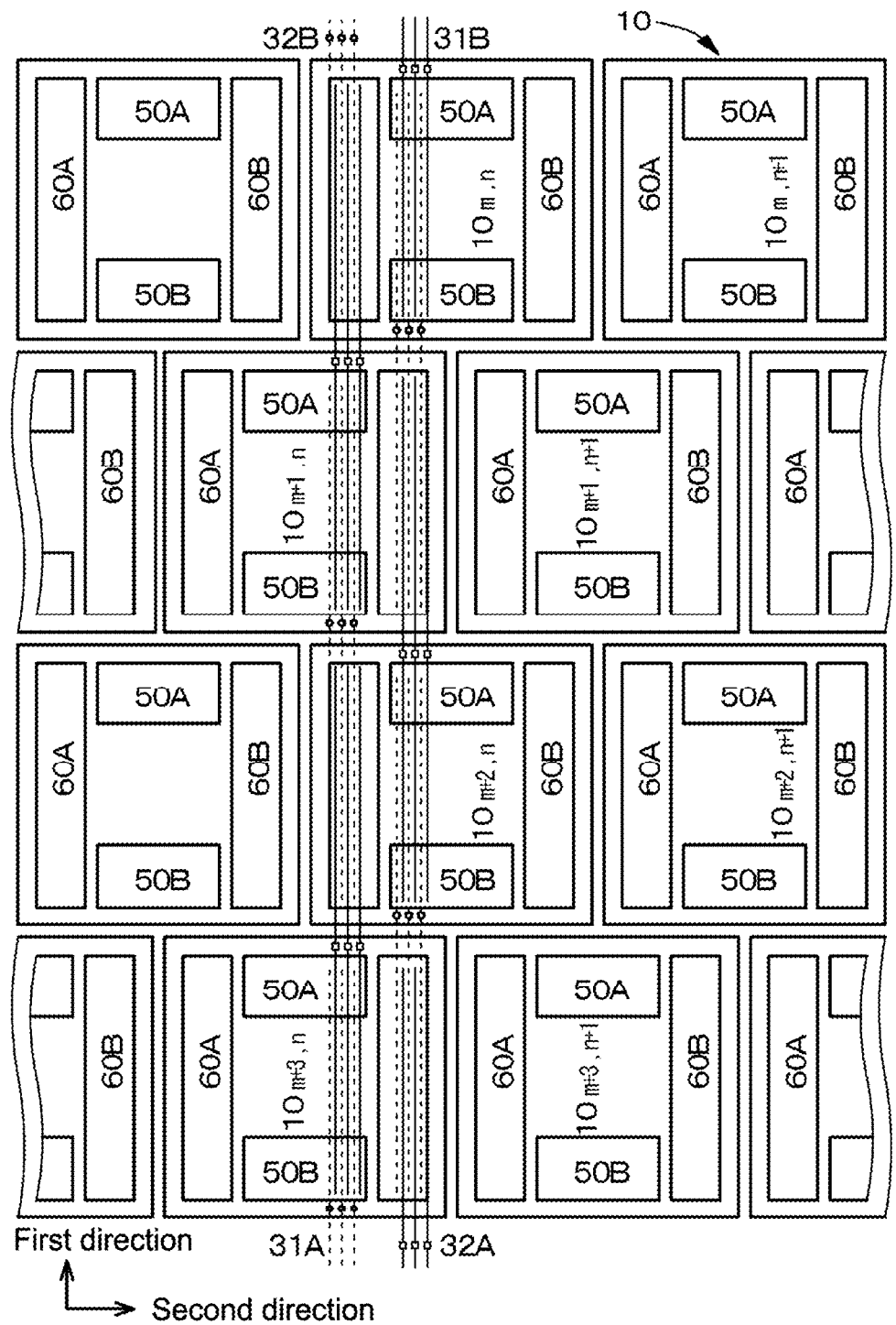
FIG. 1 is a plan view schematically showing a part of a memory cell unit array according to Example 1 and some of first wires.

Hereinafter, although the present disclosure will be described on the basis of Examples with reference to the drawings, the present disclosure is not limited to those Examples and various numerical values and materials in those Examples are examples. Note that descriptions thereof will be made in the following order.
1. Memory Cell Unit Array According to Present Disclosure, General Description
2. Example 1 (Memory Cell Unit Array According to Present Disclosure)
3. Example 2 (Modification of Example 1)
4. Example 3 (Another Modification of Example 1)
5. Example 4 (Still Another Modification of Example 1)
6. Example 5 (Modified Example of Arrangement of Control Circuit)
7. Others <Memory Cell Unit Array According to Present Disclosure, General Description>

In a memory cell unit array according to the present disclosure, it is possible to employ an embodiment in which, in each of memory cell units, first wires connected to a first control circuit that constitutes a memory cell unit and first wires connected to a first control circuit that constitutes an adjacent memory cell unit are alternately disposed.

In the memory cell unit array according to the present disclosure including the above-mentioned favorable embodiment, it is possible to employ an embodiment in which
the control circuit is covered with an inter-layer insulating layer, the first control circuit and the first wires are connected to one another via a first contact hole formed in the inter-layer insulating layer, and a second control circuit and second wires are connected to one another via a second contact hole formed in the inter-layer insulating layer.

Alternatively, the control circuit is covered with an inter-layer insulating layer, the first control circuit and the first wires are connected to one another via a first control wire and a first contact hole formed in the inter-layer insulating layer, the second control circuit and the second wires are connected to one another via a second control wire and a second contact hole formed in the inter-layer insulating layer, the first control circuit and the second control wire do not overlap each other in upper and lower directions, and the second control circuit and the first control wire do not overlap each other in the upper and lower directions. In these cases, when the first contact hole in one of the memory cell units and the first contact hole in a memory cell unit adjacent to this memory cell unit in the first direction are projected in a virtual perpendicular plane parallel to a second direction, positions of projection images of the first contact holes are positioned at equal intervals along the second direction.

In the memory cell unit array according to the present disclosure including the various favorable embodiments described above, it is possible to employ an embodiment in which the second wires are, at end portions thereof, connected to the second control circuit.

One ends of odd-numbered second wires as viewed in a plane are connected to one of second control circuits (to be described later), and one ends of even-numbered second wires as viewed in the plane are connected to the other of the second control circuits (to be described later). First wires belonging to one of the memory cell units are common to the first wires belonging to a memory cell unit adjacent to this memory cell unit along the first direction. The first wires are connected to a first control circuit at appropriately center portions of the first wires.

In addition, in the memory cell unit array according to the present disclosure including the various favorable embodiments described above, it is possible to employ an embodiment in which the memory cell units are arranged in-line along the second direction and arranged offset from each other along the first direction. In this case, it is possible to employ a configuration in which the memory cell units are arranged in-line along the second direction and arranged offset from each other along the first direction by ½ of a length of the memory cell unit along the second direction. In addition, it is possible to employ a configuration in which half of the first wires that constitute the memory cell unit are connected to the first control circuit that constitutes the memory cell unit, and the other half of the first wires that constitute the memory cell unit are connected to the first control circuit that constitutes an adjacent memory cell unit adjacent thereto in the first direction.

Alternatively, in the memory cell unit array according to the present disclosure including the various favorable embodiments described above, it is possible to employ a configuration in which the memory cell units are arranged in a stretcher bond pattern of brick patterns. In this case, it is possible to employ a configuration in which half of the first wires that constitute the memory cell unit are connected to the first control circuit that constitutes the memory cell unit, and the other half of the first wires that constitute the memory cell unit are connected to the first control circuit that constitutes an adjacent memory cell unit adjacent thereto in the first direction.

In addition, in the memory cell unit array according to the present disclosure including the above-mentioned various favorable embodiments and configurations, it is possible to employ an embodiment in which the first control circuit is constituted of two circuits, a first(I) control circuit and a first(II) control circuit, the second control circuit is constituted of two circuits, a second(I) control circuit and a second(II) control circuit, the first(I) control circuit is disposed along a first side, which extends in parallel to the second direction, the first(II) control circuit extends in parallel to the second direction and is disposed along a third side of the control circuit, which is opposed to the first side, the second(I) control circuit is disposed along a second side of the control circuit, which extends in parallel to the first direction, and the second(II) control circuit extends in parallel to the first direction and is disposed along a fourth of the control circuit, which is opposed to the second side. In this case, it is possible to employ a configuration in which the second(I) control circuit is disposed to occupy the entire second side and occupy a part of the first side and a part of the third side, the second(II) control circuit is disposed to occupy the entire fourth side and occupy a part of the first side and a part of the third side, the first(I) control circuit is disposed to occupy a part of the first side, and the first(II) control circuit is disposed to occupy a part of the third side. In addition, in these cases, it is possible to employ a configuration in which a region occupied by the first(I) control circuit and a region occupied by the first(II) control circuit are arranged in point symmetry (2-fold symmetry) with respect to a center of the control circuit, and a region occupied by the second(I) control circuit and a region occupied by the second(II) control circuit are disposed in point symmetry (2-fold symmetry) with respect to a center of the control circuit, or a configuration in which a region occupied by the first(I) control circuit and a region occupied by the first(II) control circuit are arranged in line symmetry with respect to an axis parallel to the second direction, the axis passing through a center of the control circuit, and a region occupied by the second(I) control circuit and a region occupied by the second(II) control circuit are arranged in line symmetry with respect to an axis parallel to the first direction, the axis passing through a center of the control circuit. Examples of a ratio of (a length of the first control circuit along the second direction)/(an entire length of the control circuit along the second direction) can include ⅓ to ⅔, favorably, ½. Note that, assuming that a length of a first control circuit along the second direction in one of the memory cell units is $L_1$, a length of a first control circuit along the second direction in an adjacent memory cell unit adjacent to the one memory cell unit (specifically, a length of a portion of the first control circuit along the second direction, which constitutes the adjacent memory cell unit, the first control circuit being connected to others of the first wires that constitute the one memory cell unit) is $L_1'$, and an entire length of the control circuit along the second direction is $L_0$, $L_0=L_1+L_1'$ is favorably satisfied. However, in some cases, $L_0>L_1+L_1'$ may be possible.

Alternatively, in the memory cell unit array according to the present disclosure including the above-mentioned various favorable embodiments and configurations, it is possible to employ a configuration in which the second control circuit is constituted of two circuits, a second(I) control circuit and a second(II) control circuit, the second(I) control circuit is disposed along a second side of the control circuit, which extends in parallel to the first direction, the second(II) control circuit extends in parallel to the first direction and is disposed along a fourth side of the control circuit, which is opposed to the second side, and the first control circuit is disposed to extend from the first side of the control circuit, which extends in parallel to the second direction, to the third side of the control circuit, which is opposed to the first side.

Alternatively, in the memory cell unit array according to the present disclosure including the above-mentioned various favorable embodiments and configurations, it is possible to employ a configuration in which the first control circuit is constituted of two circuits, a first(I) control circuit and a first(II) control circuit, the second control circuit is disposed to extend from a second side of the control circuit, which extends in parallel to the first direction, to a fourth side of the control circuit, which is opposed to the second side, the first(I) control circuit is disposed along a first side of the control circuit, which extends in parallel to the second direction, and the first(II) control circuit extends in parallel to the first direction and is disposed along a third side of the control circuit, which is opposed to the first side.

In addition, in the memory cell unit array according to the present disclosure including the above-mentioned various favorable embodiments and configurations, it is possible to employ an embodiment in which the nonvolatile memory cell is multi-layered having N layers (where N≥2). In this case, it is possible to employ a configuration in which the first wires are formed in first wire layers that are N layers, the second wires are formed in second wire layers that are N layers, and the nonvolatile memory cell is formed between the first wire layer and the second wire layer. Alternatively, it is possible to employ a configuration in which the first wires are formed in first wire layers that are (N/2+1) layers (where N is an even number equal to two or more), the second wires are formed in a second wire layer that is (N/2) layer, and the nonvolatile memory cell is formed between the first wire layer and the second wire layer. Alternatively, it is possible to employ a configuration in which the first wires are formed in a first wire layer that is (N/2) layer (where N is an even number equal to two or more), the second wires are formed in second wire layers that are (N/2+1) layers, and the nonvolatile memory cell is formed between the first wire layer and the second wire layer. Alternatively, it is possible to employ a configuration in which the first wires are formed in first wire layers that are {(N+1)/2} layers (where N is an odd number equal to three or more), the second wires are formed in second wire layers that are {(N+1)/2} layers, and the nonvolatile memory cell is formed between the first wire layer and the second wire layer.

In the memory cell unit array according to the present disclosure including the above-mentioned various favorable embodiments and configurations, the nonvolatile memory cell includes a nonvolatile memory device. Examples of the nonvolatile memory device can include (A) a phase-change nonvolatile memory device (Phase Change RAM, PCRAM), (B) a tunnel magnetoresistance effect device that is an MRAM (Magnetic Random Access Memory) using a TMR (Tunnel Magnetoresistance) effect, (C) a spin-transfer torque magnetoresistance effect device that writes and erases information using magnetization reversal of a storage layer due to spin torque, i.e., application of magnetization reversal due to spin transfer torque, (D) a ferroelectric nonvolatile semiconductor memory device (FeRAM, Ferroelectric Random Access Memory) using a ferroelectric material, (E) a nonvolatile memory device including an inter-electrode material layer between electrodes and containing a redox-active substance that can be an electrode reaction inhibition layer in a manner that depends on an application state of voltage applied between the electrodes, such that, in a manner that depends on the application state of voltage applied between the electrodes, the electrode reaction inhibition layer is formed along an interface region between the electrodes and the inter-electrode material layer, eliminated, or increased and reduced in area, (F) a carbon nanotube memory device (memory device that is constituted of a carbon nanotube itself or includes wires and electrodes in various nonvolatile memory cells (various nonvolatile memory devices), which are constituted of carbon nanotubes), and (G) an organic thin-film memory device (using an organic material for an organic compound layer that stores information). These configurations and structures of the nonvolatile memory devices can be well-known configurations and structures.

The phase-change nonvolatile memory device has a structure in which a memory unit that functions as a resistance-change layer is disposed between two electrodes. Here, in the resistance-change layer, information is stored using changes in electrical resistance value (hereinafter, sometimes simply referred to as "resistance value"). In this case, the phase-change (resistance-change) nonvolatile memory device can have, for example, (a) an embodiment in which it includes a resistance-change layer formed of an ion conductor including metal, (b) an embodiment in which it includes a resistance-change layer formed of a laminate structure of a high-resistance layer and an ion source layer (ion supply source layer), (c) an embodiment in which it includes a resistance-change layer formed of a chalcogenide-based material, (d) an embodiment in which it includes a resistance-change layer formed of a material having a Colossal Electro-Resistance effect (CER effect), or (e) an embodiment in which it includes a resistance-change layer formed of a material having a Colossal Magneto-Resistance effect (CMR effect). Further, there can be, for example, (f) a phase-change memory device (PRAM) or a PMC (Programmable metallization Cell) that is operated as a memory device, using the fact that a phase-change material that constitutes a resistance-change layer has electrical resistance different by several digits between an amorphous state and a crystalline state, and (g) an ReRAM (Resistance Random Access Memory) in which a metal oxide is sandwiched by two electrodes and a pulse voltage is applied on the electrodes.

When the resistance-change layer is constituted of an ion conductor including metal, specifically, the resistance-change layer can be constituted of an electrically conductive or semi-electrically conductive, thin film (e.g., thin film formed of GeSbTe, GeTe, GeSe, GeS, SiGeTe, SiGeSbTe)

containing at least one kind of element (atom) selected from a group of copper (Cu), silver (Ag), and zinc (Zn) and at least one kind of element (chalcogen) (atom) selected from a group of tellurium (Te), sulfur (S), and selenium (Se). Note that a laminate structure of such a thin film and a thin film formed of, for example, Ag, an Ag alloy, Cu, a Cu alloy, Zn, or a Zn alloy can be employed or it is also possible to employ a configuration in which a film (rare earth oxide thin film) formed of an oxide of at least one kind of rare earth elements selected from a group of La, Ce, Pr, Nd, Sm, Eu, Gd, Tb, Dy, Ho, Er, Yb and Y of rare earth elements or an oxide film such as Hf, Ta, and W is formed in the whole of that thin film or a part of that thin film in a film-thickness direction. Alternatively, the resistance-change layer can be constituted of an electrically conductive or semi-electrically conductive, thin film (e.g., amorphous thin film formed of GeSbTeGd) containing at least one kind of element (atom) selected from a group of germanium (Ge), silicon (Si), antimony (Sb), and indium (In) and at least one kind of element (chalcogen) (atom) selected from a group of tellurium (Te), sulfur (S), and selenium (Se).

When the resistance-change layer is formed of a laminate structure of a high-resistance layer and an ion source layer, specifically, it can have a configuration in which the ion source layer includes at least one kind of a metal element as an element that can be positively ionized and further includes at least one kind of element (chalcogen) (atom) selected from a group of tellurium (Te), sulfur (S), and selenium (Se) as an element negatively ionized. A metal element and chalcogen are coupled to form a metal chalcogenide layer (chalcogenide-based material layer). The metal chalcogenide layer mainly has an amorphous structure and functions as an ion supply source. Here, the ion source layer is formed having a resistance value lower than the high-resistance layer in an initial state or erasing state.

The metal element that constitutes the metal chalcogenide layer is favorably a chemically stable element that can be present in a metal state in the ion source layer containing chalcogen described above such that it is deoxidized on an electrode during writing operation and forms a conduction path (filament) in the metal state. Examples of such a metal element can include copper (Cu), aluminum (Al), germanium (Ge), and zinc (Zn), and, for example, transition metals of the 4A, 5A, and 6A Groups in the periodic table of the elements, i.e., Ti (titanium), Zr (zirconium), Hf (hafnium), V (vanadium), Nb (niobium), Ta (tantalum), Cr (chromium), Mo (molybdenum), and W (tungsten). One kind or two or more kinds of those elements can be used. Further, Al (aluminum), Cu (copper), Ge (germanium), Si (silicon), or the like may be an additive element added to the ion source layer.

Specific examples of a constituent material of the ion source layer can include ZrTeAl, TiTeAl, CrTeAl, WTeAl, TaTeAl, and CuTe. Further, such examples can also include CuZrTeAl obtained by adding Cu to ZrTeAl, CuZrTeAlGe obtained by further adding Ge to it, and CuZrTeAlSiGe obtained by further adding Si to it as an additive element. Alternatively, such examples can also include ZrTeMg obtained by replacing Al by Mg. Also if another transition metal element such as titanium (Ti) and tantalum (Ta) is selected as the metal element that constitutes the metal chalcogenide layer instead of zirconium (Zr), a similar additive element can be used. Specific examples of a constituent material of the ion source layer can also include TaTeAlGe. In addition, sulfur (S), selenium (Se), or iodine (I) may be used other than tellurium (Te). Specific examples of a constituent material of the ion source layer can include ZrSAl, ZrSeAl, and ZrIAl.

Alternatively, when the metal element that constitutes the metal chalcogenide layer is constituted of a metal element (M) that easily reacts with tellurium (Te) contained in the high-resistance layer and a laminate structure, that is, a Te/ion source layer (including the metal element M) is used, a stabilized structure, that is, M-Te/ion source layer can be obtained due to heat treatment after film deposition. Here, examples of the metal element (M) that easily reacts with tellurium (Te) can include aluminum (Al) and magnesium (Mg).

Note that, other elements may be added to the ion source layer for the purpose of, for example, preventing the film from being pealed off during high-temperature heat treatment for forming the resistance-change layer. For example, silicon (Si) is an additive element also capable of improving a retaining characteristic, and hence favorably added to the ion source layer together with zirconium (Zr), for example. It should be noted that the effect of preventing the film from being pealed off cannot be expected if added silicon (Si) is too little, and a favorable memory operation characteristic cannot be obtained if it is too much. Silicon (Si) content of the ion source layer is favorably within a range of approximately 10 to 45 atomic %.

When a predetermined voltage is applied on the nonvolatile memory device, at least one kind of metal element is diffused in the high-resistance layer as an element that can be positively ionized, and a resistance value of the high-resistance layer is lowered. The high-resistance layer has a function as a barrier in electric conduction. The high-resistance layer has a resistance value higher than that of the ion source layer when a predetermined voltage is applied between the electrode and the electrically conductive material layer (or wires) in an initialized state or erasing state. The high-resistance layer includes a layer formed of a compound having tellurium (Te) as a main component, which behaves as a negative ion component, for example, as described above. Specifically, examples of such a compound can include AlTe, MgTe, and ZnTe. Regarding a composition of a compound containing tellurium (Te), content of aluminum (Al) in AlTe is favorably 20 atomic % or more, 60 atomic % or less, for example. Alternatively, the high-resistance layer may contain an oxide such as an aluminum oxide ($AlO_x$). Further, an initial resistance value of the high-resistance layer is favorably 1 MΩ or more and a resistance value of the low-resistance state is favorably several hundreds kΩ or less. That is to say, the nonvolatile memory device stores information or the like by changing the resistance value of this high-resistance layer. In order to read out a resistance state of a miniaturized nonvolatile memory device at high speed, it is favorable to lower the resistance value in a low-resistance state as much as possible. However, a resistance value is 40 kΩ to 100 kΩ when information (data) or the like is written under a condition of 20 μA to 50 μA, 2V. Therefore, it is a premise that the initial resistance value of the nonvolatile memory device is higher than this value. In addition, in view of a resistance separation range corresponding to one digit, the above-mentioned resistance value is considered as being appropriate. Note that the high-resistance layer can have not only a mono-layer configuration but also a multi-layer configuration, in this case, a lower layer containing tellurium as a main, negative ion component is held in contact with an electrode on a high-resistance layer side and an upper layer contains an element that is a negative ion component other than tellurium. Alternatively, examples of the high-resistance layer can also include SiN, $SiO_2$, $Gd_2O_3$, and a material containing fluorine (e.g., $MgF_2$, $AlF_3$, $CaF_2$, LiF).

Here, if the high-resistance layer contains tellurium (Te) as a main, negative ion component, a metal element diffused in the high-resistance layer is stabilized when the resistance of the high-resistance layer is lowered, it becomes easy to retain the low-resistance state. On the other hand, tellurium (Te) has coupling force with the metal element, which is smaller than that of an oxide or silicon compound, and the metal element diffused in the high-resistance layer easily moves to the ion source layer. Therefore, an erasing characteristic is improved. That is to say, the retaining characteristic of writing data in the low-resistance state is improved and it becomes possible to lower the voltage when data is erased. In addition, variations in the resistance value in the erasing state can be reduced with respect to multiple writing/erasing operations. Note that, regarding electronegativity, for chalcogenide compound, an absolute value generally increases in the order of tellurium<selenium< sulfur<oxygen. Therefore, as less oxygen is present in the high-resistance layer and chalcogenide having a lower electronegativity is used, the effect of improvement is higher.

Examples of a constituent material of the electrode can include W (tungsten), WN (tungsten nitride), Cu (copper), Al (aluminum), Mo (molybdenum), Au (gold), Pt (platinum), Ti (titanium), TiN (titanium nitride), TiW (titanium-tungsten), Mo (molybdenum), Ta (tantalum), and silicide. Note that the electrode is constituted of a material such as copper (Cu), in which ion conduction may occur due to an electrical field, the surface of the electrode may be covered with a material such as tungsten (W), a tungsten nitride (WN), a titanium nitride (TiN), and a tantalum nitride (TaN), in which ion conduction and thermophoresis hardly occur. Further, when the ion source layer contains Al (aluminum), examples of a constituent material of the electrode can include a material more hardly ionized in comparison with Al (aluminum), for example, a metal film containing at least one kind of Cr (chromium), W (tungsten), Co (cobalt), Si (silicon), Au (gold), Pd (palladium), Mo (molybdenum), Ir (iridium), and Ti (titanium), and an oxide film or nitride film thereof. A well-known electrically conductive material including an electrically conductive material similar to the electrode can be used for the electrically conductive material layer (or wires). Alternatively, it may include a laminate structure of a base layer formed of Cr, Ti, or the like and a Cu layer, an Au layer, a Pt layer, or the like, which is formed thereon. In addition, it can also be constituted of a monolayer of Ta or the like or a laminate structure of Cu, Ti, and the like. The electrode and the electrically conductive material layer (or wires) can be formed by a PVD method or CVD method including sputtering, for example.

For storing (writing) information, a voltage pulse in a "positive direction" (e.g., the high-resistance layer is set to have a negative potential while the ion source layer is set to have a positive potential) is applied on the nonvolatile memory device in an initial state (high-resistance state). As a result, the metal element contained in the ion source layer is ionized, diffused in the high-resistance layer, coupled with electrons and precipitated on the electrode, or remains in the high-resistance layer and forms an impurity state. With this, a conduction path including the metal element is formed in the information storage layer, more specifically, the high-resistance layer, the resistance of the information storage layer is lowered (information-storing state). After that, even when application of voltage on the nonvolatile memory device is cancelled, the information storage layer is retained in the low-resistance state. In this manner, the information is written and retained. For the use of a write once storage apparatus, i.e., a so-called PROM (Programmable Read Only Memory), storing (recording) of information is completed only by this information storing process. On the other hand, a rewriting process is required for the use of a storage apparatus capable of rewriting information multiple times, i.e., a RAM (Random Access Memory) or EEPROM, for example. For rewriting information, a voltage pulse in a "negative direction" (e.g., the high-resistance layer is set to have a positive potential while the ion source layer is set to have a negative potential) is applied on the nonvolatile memory device in the low-resistance state. As a result, the metal element precipitated on the electrode is ionized and dissolved in the ion source layer. With this, the conduction path including the metal element disappears, and a state in which the resistance of the high-resistance layer is high (initial state or erasing state) is obtained. After that, even when the application of voltage on the nonvolatile memory device is cancelled, the information storage layer is retained in the high-resistance state. In this manner, the written information is erased. By repeating such processes, it is possible to repeat writing of information in the nonvolatile memory device and erasing of the written information. For reading out information stored in the nonvolatile memory device, voltage in, for example, a "positive direction" (e.g., the high-resistance layer is set to have a negative potential while the ion source layer is set to have a positive potential) is applied. However, that value is lower than the value of voltage applied when information is stored (written). For example, when the high-resistance state is set corresponding to information of "0" and the low-resistance state is set corresponding to information of "1", "0" is changed to in the information-writing process and "1" is changed to "0" in the information-erasing process. Note that, although the operation of providing the low-resistance state and the operation of providing the high-resistance state are respectively set corresponding to the writing operation and the erasing operation, the erasing operation and the writing operation may be set corresponding to opposite resistance states.

When the resistance-change layer is constituted of a chalcogenide-based material, examples of the chalcogenide-based material can include a compound of metal and Se or Te, such as GeSbTe, ZnSe, and GaSnTe.

Further, when the resistance-change layer is constituted of a material having a Colossal Electro-Resistance effect (CER effect), examples of such a material can include a 3-element-based perovskite type transition metal oxide ($PrCaMnO_3$ or $SrTiO_3$) and a 2-element-based transition metal oxide (CiO, NiO, CuO, $TiO_2$, $Fe_3O_4$).

Further, for operating it as a memory device by using the fact that a phase-change material that constitutes a resistance-change layer of the phase-change nonvolatile memory device has electrical resistance different by several digits between an amorphous state and a crystalline state, the resistance-change layer is constituted of a chalcogenide-based material. Pulsed, large current (e.g., 200 microamperes, 20 nanoseconds) is allowed to flow through the resistance-change layer in short time. After that, rapid cooling is performed, and the phase-change material that constitutes the resistance-change layer is brought into an amorphous state and exhibits high-resistance. On the other hand, pulsed, small current (e.g., 100 microamperes, 100 nanoseconds) is allowed to flow through the resistance-change layer in relatively long time. After that, slow cooling is performed, and the phase-change material that constitutes the resistance-change layer is brought into a crystalline state and exhibits low-resistance.

Further, the ReRAM is formed of a multi-element-based metal oxide constituted of a plurality of metal elements and oxygen such as a perovskite-type metal oxide or formed of a 2-element-based metal oxide constituted of one kind of metal element and oxygen. The ReRAM can be of a unipolar (non-polar) type or bipolar type or can also be of a filament type (fuse-antifuse type) or an interface type.

Alternatively, the nonvolatile memory device can be constituted of a nonvolatile, magnetic memory device having a so-called magnetoresistance effect. Specifically, examples of such a nonvolatile memory device can include a tunnel magnetoresistance effect device (MRAM) using a current/magnetic field-inverting method. Examples of such a nonvolatile memory device can also include a spin-transfer torque magnetoresistance effect device (spin-RAM) applying magnetization reversal due to spin transfer torque. The latter includes an in-plane magnetization method and a perpendicular magnetization method.

In the spin-transfer torque magnetoresistance effect device using the in-plane magnetization method and the perpendicular magnetization method, it is possible to employ a structure in which a storage layer for storing information (also called recording layer, magnetization reversal layer, or magnetization free layer), a middle layer, and a fixation layer (also called magnetization reference layer, magnetization fixed layer, or magnetization fixation layer) constitute a laminate structure having a TMR (Tunnel Magnetoresistance) effect or a GMR (Giant Magnetoresistance) effect. When a writing current (hereinafter, sometimes referred to as "spin polarization current") is allowed to flow from the storage layer to the fixation layer in an anti-parallel magnetization state, the magnetization of the storage layer is inverted due to spin torque that acts when electrons are implanted into the storage layer from the fixation layer, and the direction of magnetization of the storage layer, the direction of magnetization of the fixation layer, and the direction of magnetization of the storage layer become parallel. On the other hand, when the spin polarization current is allowed to flow from the fixation layer to the storage layer in a parallel magnetization state, the magnetization of the storage layer is inverted due to spin torque that acts when electrons are implanted into the fixation layer from the storage layer, and the direction of magnetization of the storage layer and the direction of magnetization of the fixation layer become anti-parallel. Alternatively, it is also possible to employ a structure (double spin filter structure) in which a plurality of fixation layers, a middle layer, a storage layer, a middle layer, and a plurality of fixation layers constitute a laminate structure having a TMR effect or GMR effect. With such a structure, it is necessary to set changes in magnetoresistance of the two middle layers located above and below the storage layer to different from each other in advance. The phrases "the fixation layers, the middle layer, and the storage layer constitute a laminate structure having a TMR effect" refer to a structure in which a middle layer formed of a non-magnetic film that functions as a tunnel insulating film is sandwiched between the fixation layer formed of a magnetic material and the storage layer formed of a magnetic material. Such a middle layer serves to interrupt magnetic coupling between the storage layer and the fixation layer and allow a tunnel current to flow.

Examples of a constituent material of the storage layer can include a ferromagnetic material such as nickel (Ni), iron (Fe), and cobalt (Co), an alloy (e.g., Co—Fe, Co—Fe—B, Co—Fe—Ni, Fe—Pt, Ni—Fe) of such a ferromagnetic material, an alloy obtained by adding gadolinium (Gd) to the alloy thereof, an alloy (e.g., Co—Fe—B) obtained by mixing a non-magnetic element (e.g., tantalum, boron, chromium, platinum, silicon, carbon, nitrogen) in the alloy thereof, an oxide (e.g., ferrite: Fe—MnO) including one or more kinds of Co, Fe, and Ni, a group of intermetallic compounds (Heusler alloy: NiMnSb, $Co_2MnGe$, $Co_2MnSi$, $Co_2CrAl$, etc.) called half-metallic ferromagnetic material, and an oxide (e.g., (La, Sr) $MnO_3$, $CrO_2$, $Fe_3O_4$). In addition, regarding the perpendicular magnetization type, for further increasing the perpendicular magnetic anisotropy, heavy rare-earth elements such as terbium (Tb), dysprosium (Dy), and holmium (Ho) may be added to such an alloy or an alloy containing them may be laminated. The storage layer and the fixation layer can essentially have any crystallinity. It may be polycrystalline, monocrystalline, or amorphous. Further, the storage layer can also have a mono-layer configuration, a lamination configuration in which a plurality of different ferromagnetic material layers described above are laminated, or a lamination configuration in which a ferromagnetic material layer and a non-magnetic material layer are laminated.

Examples of a constituent material of the fixation layer can include the above-mentioned constituent material (ferromagnetic material) of the storage layer. Otherwise, the fixation layer can be formed of a laminate of a Co layer and a Pt layer, a laminate of a Co layer and a Pd layer, a laminate of a Co layer and a Ni layer, a laminate of a Co layer and a Tb layer, a Co—Pt alloy layer, a Co—Pd alloy layer, a Co—Ni alloy layer, a Co—Fe alloy layer, a Co—Tb alloy layer, a Co layer, a Fe layer, or a Co—Fe—B alloy layer. Otherwise, by adding a non-magnetic element such as Ag, Cu, Au, Al, Si, Bi, Ta, B, C, O, N, Pd, Pt, Zr, Hf, Ir, W, Mo, and Nb to those materials, a magnetic characteristic may be adjusted or various physical properties such as a crystal structure, crystallinity, and substance stability may be adjusted. In addition, favorably, the fixation layer can be formed of a Co—Fe—B alloy layer. The direction of magnetization of the fixation layer is a reference of information. Therefore, the direction of magnetization has not be changed by storing (recording) or reading information. However, it does not necessarily need to be fixed in a particular direction. By increasing the coercivity, increasing the film thickness, or increasing a magnetic damping constant in comparison with that of the storage layer, configuration and structure only need to be provided such that it is more difficult for the direction of magnetization to change in comparison with that of the storage layer.

The fixation layer can also have a structure formed of a plurality of fixation layers. Such a structure is called lamination ferrimagnetic structure. The lamination ferrimagnetic structure is a laminate structure having antiferromagnetic coupling, i.e., a structure in which inter-layer exchange coupling between two magnetic material layers becomes antiferromagnetic. It is also called synthetic antiferromagnetic coupling (SAF: Synthetic Antiferromagnet). It refers to a structure in which inter-layer exchange coupling between the two magnetic material layers becomes antiferromagnetic or ferromagnetic in a manner that depends on a non-magnetic layer and has been reported in, for example, pp 2304-2307 of Physical Review Letters by S. S. Parkin et. al (7 May 1990). Examples of a constituent material of the non-magnetic layer can include ruthenium (Ru) and an alloy thereof and can also include Os, Re, Ir, Au, Ag, Cu, Al, Bi, Si, B, C, Cr, Ta, Pd, Pt, Zr, Hf, W, Mo, and Nb, and alloys thereof.

Alternatively, the fixation layer can have a magnetostatic coupling structure, and an antiferromagnetic layer may be disposed adjacent to the fixation layer. Here, the magnetostatic coupling structure is a structure by which antiferromagnetic coupling can be obtained due to a magnetic field leaked from end surfaces of two magnetic material layers. Specifically, examples of a constituent material of the antiferromagnetic layer can include an iron-manganese alloy, a nickel-manganese alloy, a platinum-manganese alloy, a platinum-chromium-manganese alloy, an iridium-manganese alloy, a rhodium-manganese alloy, a cobalt oxide, a nickel oxide, and an iron oxide ($Fe_2O_3$).

The middle layer is favorably formed of a non-magnetic film. That is to say, in the spin-transfer torque magnetoresistance effect device, the middle layer, which constitutes the laminate structure having the TMR effect, is favorably constituted of a non-magnetic film formed of an insulating material. Here, examples of a constituent material of the non-magnetic film formed of the insulating material can include various insulating materials, dielectric materials, and semiconductor materials such as a magnesium oxide (MgO), a magnesium nitride, a magnesium fluoride, an aluminum oxide ($AlO_x$), an aluminum nitride (AlN), a silicon oxide ($SiO_x$), a silicon nitride (SiN), $TiO_2$, $Cr_2O_3$, Ge, NiO, $CdO_x$, $HfO_2$, $Ta_2O_5$, $Bi_2O_3$, CaF, $SrTiO_3$, $AlLaO_3$, Al—N—O, BN, and ZnS. On the other hand, examples of a constituent material of the non-magnetic film that constitutes the laminate structure having the GMR effect can include electrically conductive materials such as Cu, Ru, Cr, Au, Ag, Pt, Ta, and an alloy thereof. If the electrical conductivity is high (the resistivity is several hundreds µΩcm or less), an arbitrary non-metal material may be employed. It is desirable to appropriately select a material in which interfacial reaction with the storage layer and the fixation layer hardly occurs.

The middle layer formed of the insulating material can be obtained by oxidation or nitriding of a metal film formed by sputtering, for example. More specifically, when an aluminum oxide ($AlO_x$) or magnesium oxide (MgO) is used as an insulating material that constitutes the middle layer, there can be, for example, a method of oxidizing aluminum or magnesium formed by sputtering in the atmosphere, a method of oxidizing aluminum or magnesium formed by sputtering in plasma, a method of oxidizing aluminum or magnesium formed by sputtering in IPC plasma, a method of naturally oxidizing aluminum or magnesium formed by sputtering in oxygen, a method of oxidizing aluminum or magnesium formed by sputtering with oxygen radicals, a method of emitting a ultraviolet ray when aluminum or magnesium formed by sputtering is subjected to natural oxidation in oxygen, a method of depositing a film of aluminum or magnesium by reactive sputtering, and a method of depositing a film of an aluminum oxide ($AlO_x$) or magnesium oxide (MgO) by sputtering.

The above-mentioned various layers can be formed by a physical vapor deposition method (PVD method), for example, sputtering, an ion beam deposition method, or a vacuum vapor deposition method or by a chemical vapor deposition method (CVD method) represented by an ALD (Atomic Layer Deposition) method. Further, patterning of the above-mentioned layers can be performed by a reactive ion etching method (RIE method) or an ion milling method (ion beam etching method). It is favorable to continuously form various layers in a vacuum apparatus. It is favorable to perform patterning thereafter.

As an electrically connection state between the fixation layer and the first wires (or the second wires), there can be, for example, an embodiment in which the first wires (or the second wires) are directly connected to the fixation layer or an embodiment in which the first wires (or the second wires) are connected to the fixation layer via the antiferromagnetic layer. By injecting the spin polarization current into the storage layer from the first wires via the fixation layer when the fixation layer is connected to the first wires, or from the second wires via the fixation layer when the fixation layer is connected to the second wires, the direction of magnetization in the storage layer is defined. In this manner, information is written in the storage layer. In order to improve the crystallinity of the antiferromagnetic layer, a base layer formed of Ta, Cr, Ru, Ti, or the like may be formed between the first wires (or the second wires) and the antiferromagnetic layer.

It is favorable to form a cap layer between the storage layer and the wires in order to prevent mutual diffusion of atoms that constitutes the wires and the connection portion and atoms that constitutes the storage layer, to lower contact resistance, and to prevent oxidation of the storage layer. Examples of the cap layer can include a laminate structure of a Ta layer, an Ru layer, a Pt layer, a Ti layer, a W layer, an MgO layer, and an Ru film/Ta film.

In the spin-transfer torque magnetoresistance effect device using the perpendicular magnetization method, it is desirable that a stereoscopic shape of the laminate structure be columnar (cylindrical), from the perspective of easiness of machining and for the purpose of ensuring directional uniformity of an axis of easy magnetization in the storage layer. However, it is not limited thereto. For example, a triangular cylinder, a quadrangular prism, a hexagonal prism, or an octagonal prism (including those having rounded lateral sides or lateral edges), or an elliptic cylinder can also be employed. By allowing a spin polarization current to flow through the laminate structure from the first wires to the second wires or from the second wires to the first wires, information is written in the storage layer by setting the direction of magnetization in the storage layer to a first direction or a second direction (direction opposite to the first direction). A base layer formed of Ta, Cr, Ru, Ti, or the like may be formed between the laminate structure and the wires in order to enhance the crystallinity of a magnetic layer of the laminate structure, which is brought into contact with the wires.

In the nonvolatile memory device in which the inter-electrode material layer is provided or the electrode reaction inhibition layer is formed/eliminated, or whose area is increased/reduced, a redox-active substance layer is constituted of at least one kind of a group of nickel (Ni), cobalt (Co), chromium (Cr), titanium (Ti), tantalum (Ta), iron (Fe), aluminum (Al), vanadium (V), a reductant ($H_xWO_3$) of a tungsten oxide ($WO_3$), and an oxide of vanadium (V). Further, the inter-electrode material layer includes an amorphous thin film as a base material, the amorphous thin film containing at least one kind of chalcogenide-based materials such as sulfur (S), selenium (Se), and tellurium (Te) and at least one kind of germanium (Ge), silicon (Si), antimony (Sb), and indium (In).

The first wires and the second wires may be formed of a mono-layer structure of copper (Cu), aluminum (Al), gold (Au), platinum (Pt), titanium (Ti), molybdenum (Mo), tantalum (Ta), tungsten (W), TiN, TiW, WN, silicide, or the like. Alternatively, the first wires and the second wires may have a laminate structure of a base layer formed of Cr, Ti, or the like and a Cu layer, an Au layer, a Pt layer, or the like formed thereon. In addition, it can also be constituted of a mono-layer of Ta or the like or a laminate structure of Cu, Ti, and the like. Those wires can be formed by the PVD method including sputtering, for example.

The first wires, the second wires are formed on the inter-layer insulating layer. Examples of a constituent material of the inter-layer insulating layer can include a silicon oxide ($SiO_2$), a silicon nitride (SiN), SiON, SOG, NSG, BPSG, PSG, BSG, and LTO. The inter-layer insulating layer can be formed by the CVD method or the PVD method including sputtering, for example. Examples of a constituent material of the contact hole can include polysilicon doped with impurities, tungsten, metal having a high-melting point such Ti, Pt, Pd, Cu, TiW, TiNW, $WSi_2$, and $MoSi_2$, and metal silicide. The contact hole be formed by the CVD method or the PVD method including sputtering, for example. The nonvolatile memory cell is formed between the first wires and the second wires. A selection device for controlling current flowing the nonvolatile memory cell is provided between the first wires and the nonvolatile memory cell or between the second wires and the nonvolatile memory cell. Here, examples of the selection device can include a device having a non-linear current-voltage characteristic, such as a bidirectional diode and a varistor. Examples of the control circuit can include a well-known circuit formed on a silicon semiconductor substrate. The control circuit includes, for example, various decoders and a sense amplifier.

Example 1

Figure 2:
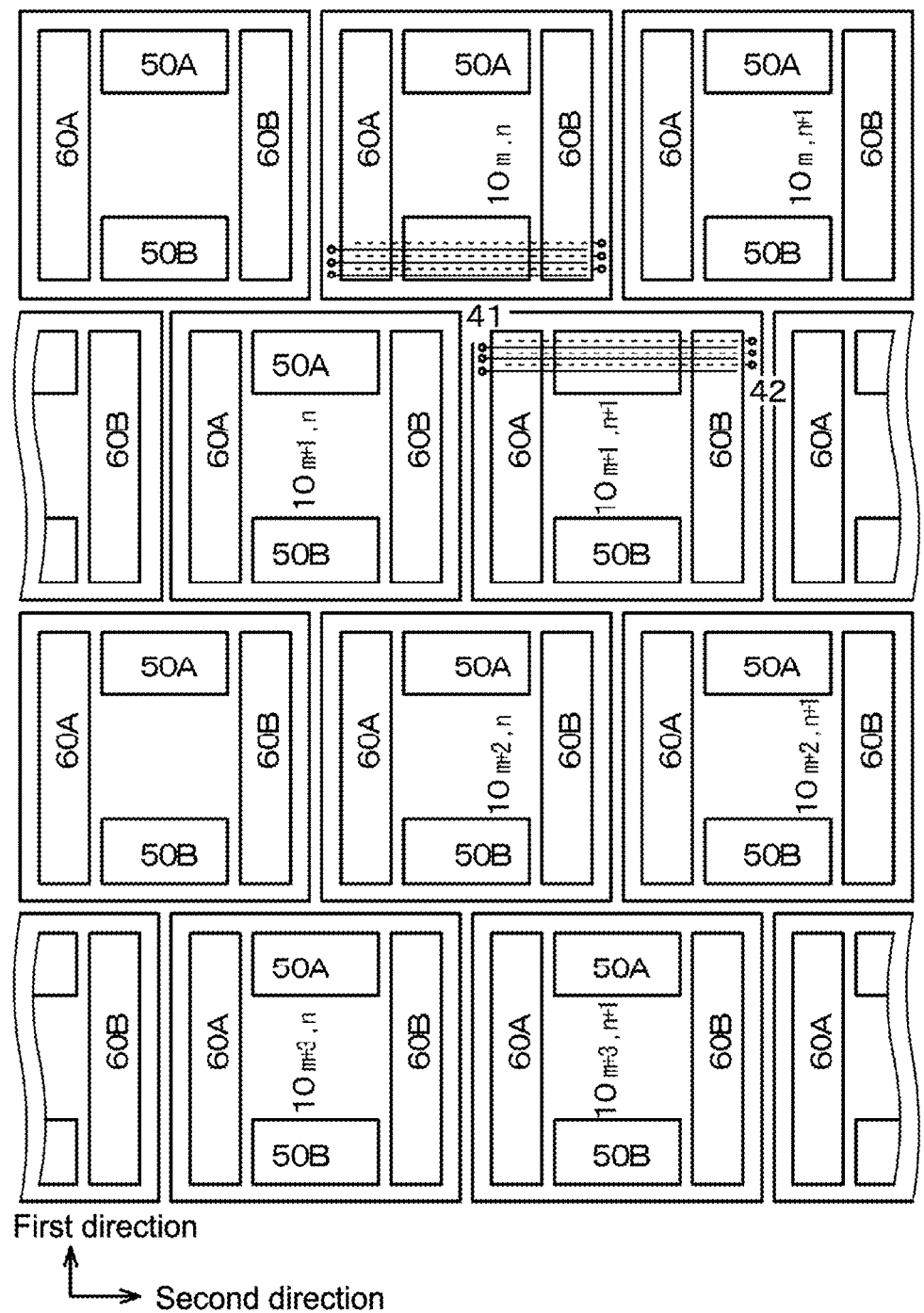
FIG. 2 is a plan view schematically showing a part of the memory cell unit array according to Example 1 and shows some of second wires.
Figure 3A:
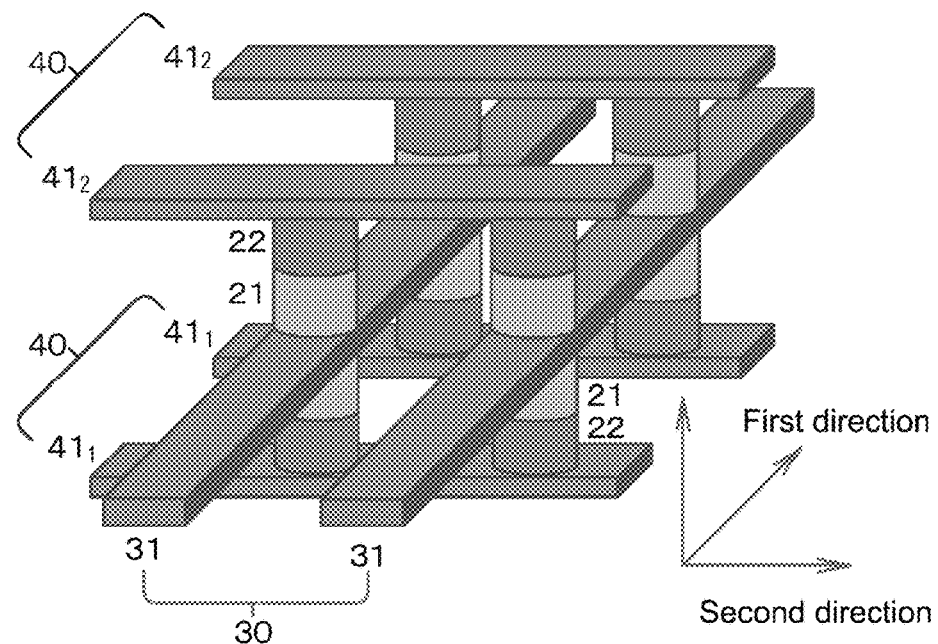
FIG. 3A is a perspective view schematically showing nonvolatile memory cells in Example 1 and FIG. 3B and FIG. 3C are equivalent circuit diagrams of the nonvolatile memory cells in Example 1.
Figure 3B:
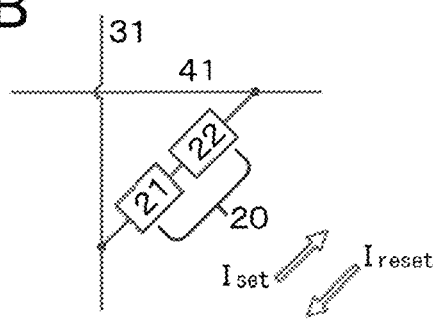
Figure 3C:
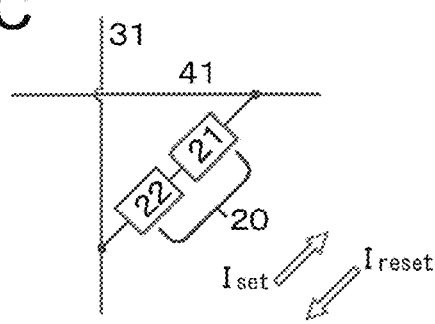
Figure 4:
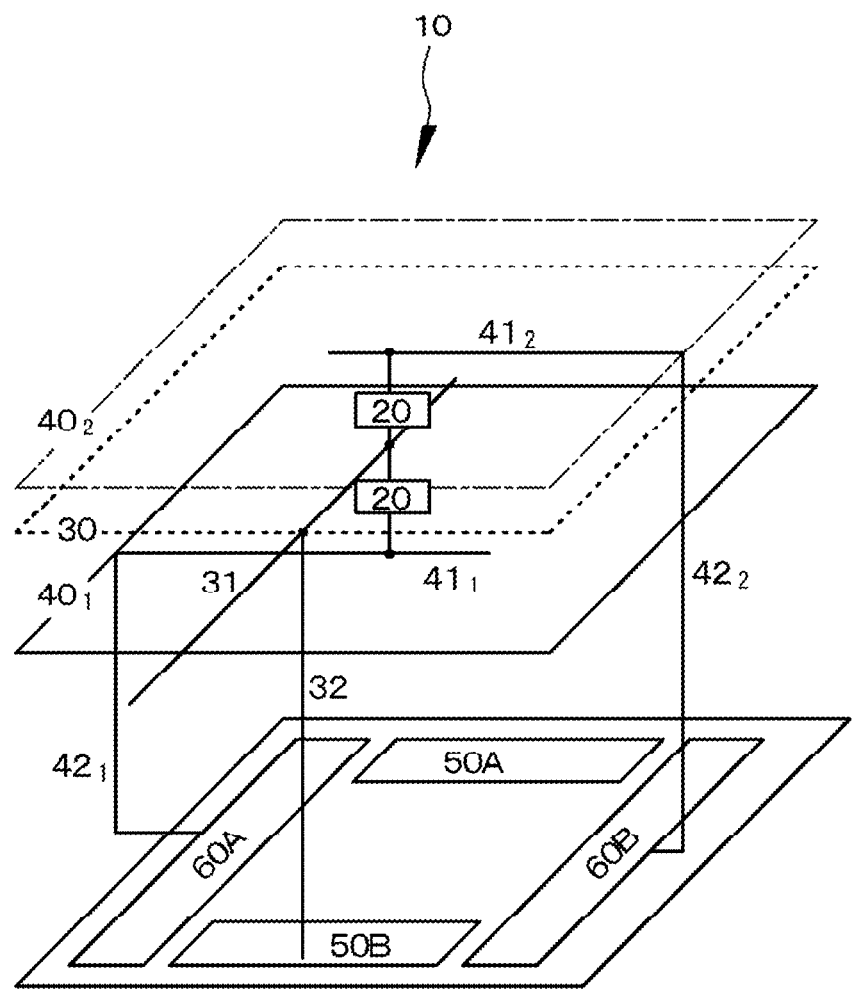
FIG. 4 is a perspective view conceptually showing the nonvolatile memory cells in Example 1.
Figure 4:
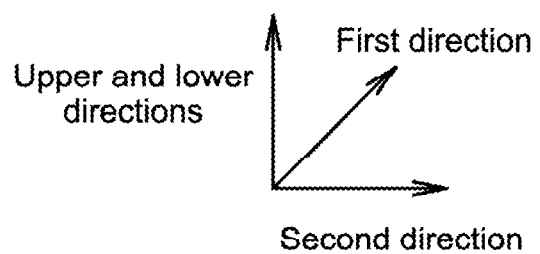
Figure 5:
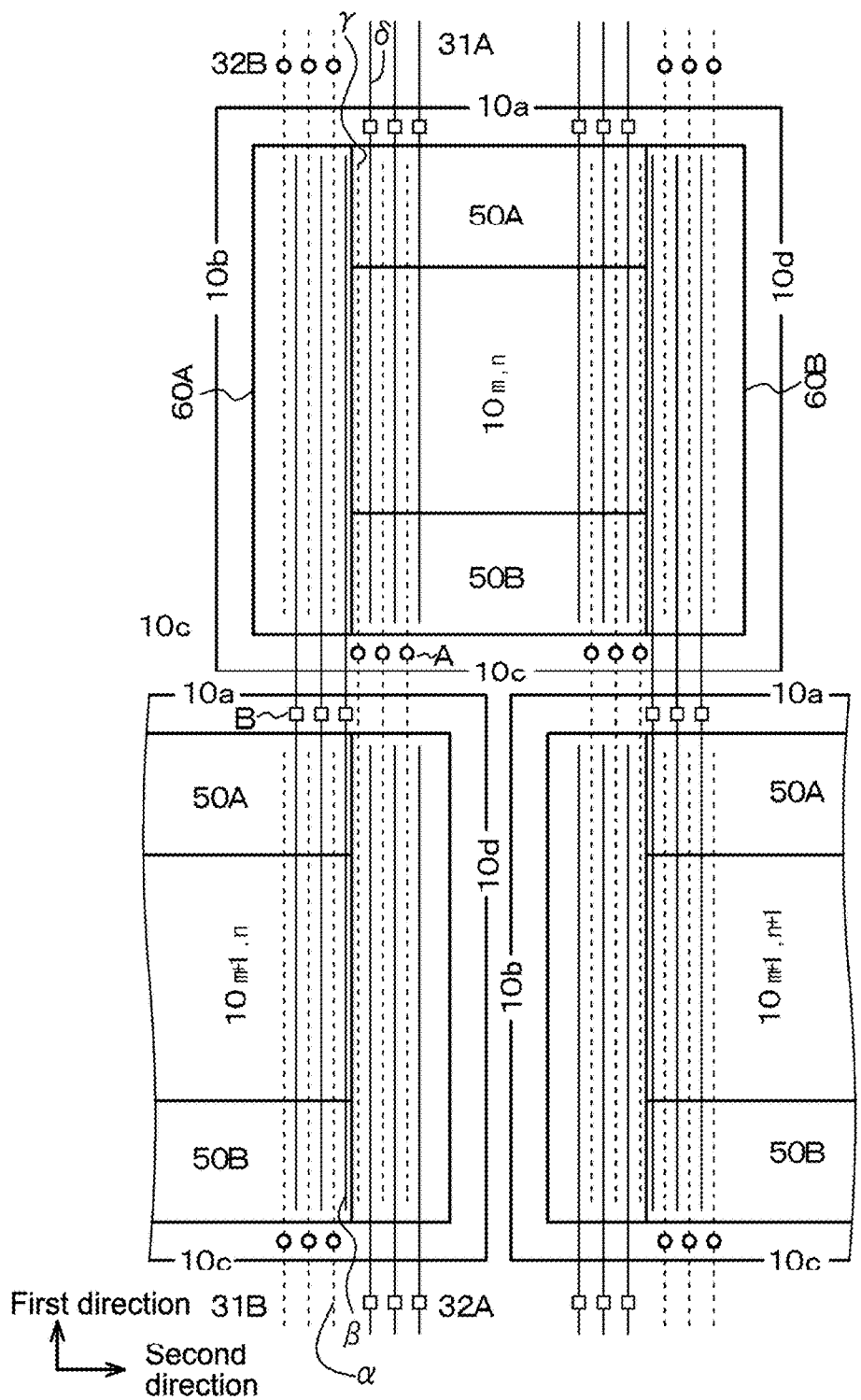
FIG. 5 is a plan view schematically showing a part of the memory cell unit array according to Example 1 and shows some of the first wires.
Figure 11A:
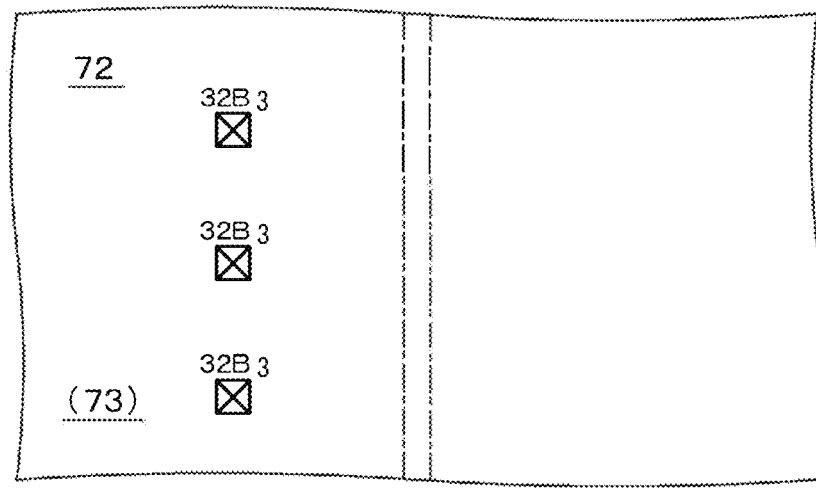
FIG. 11A and FIG. 11B are schematic, partial plan views of the memory cell unit array according to Example 1 as viewed along an arrow mark 11A and an arrow mark 11B of FIG. 6.
Figure 11B:
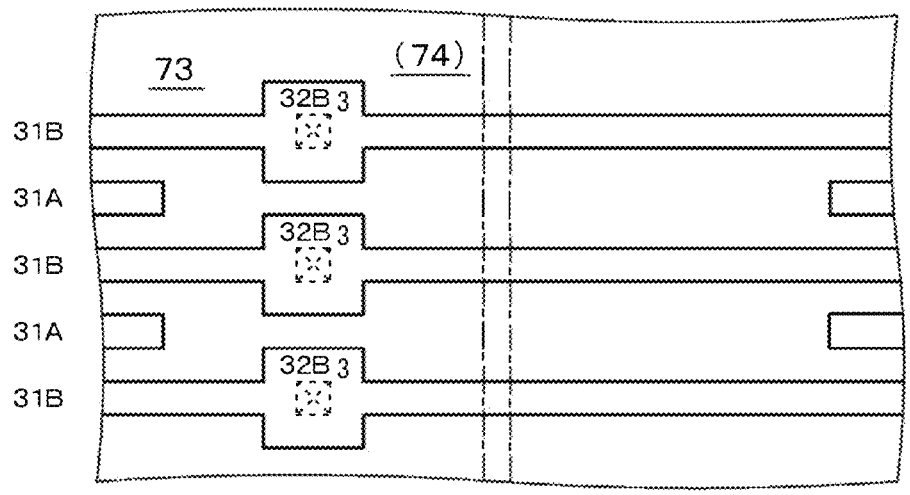
Figure 12A:
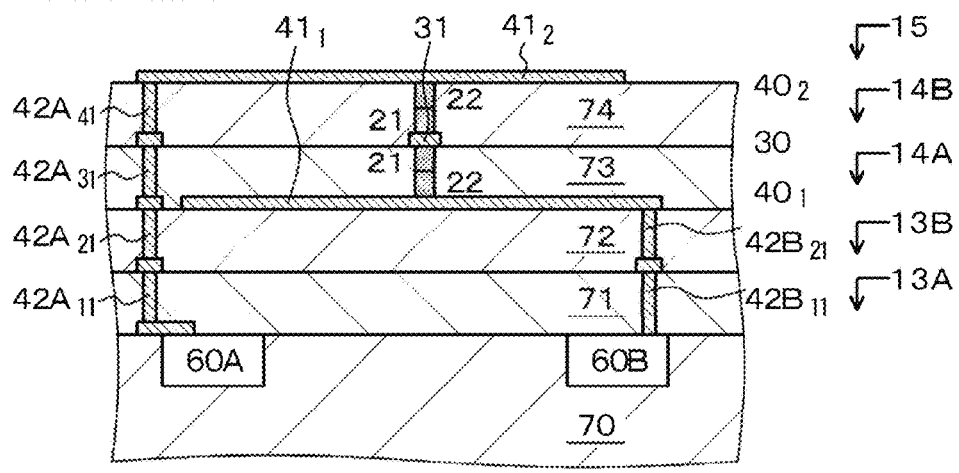
FIG. 12A and FIG. 12B are schematic, partial cross-sectional views of the memory cell unit array according to Example 1 as it is cut along a virtual perpendicular plane parallel to a second direction.
Figure 12B:
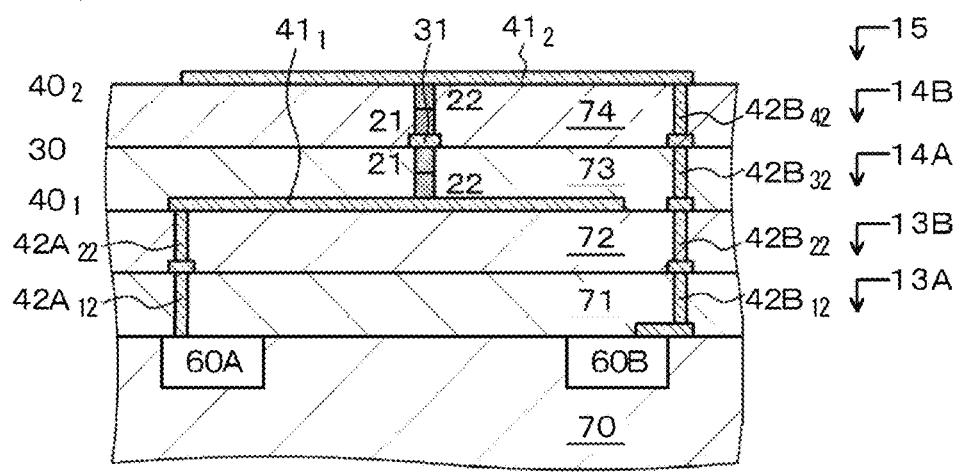

Example 1 relates to a memory cell unit array according to the present disclosure. FIG. 1 and FIG. 2 show schematic plan views of a part of a memory cell unit array according to Example 1. Note that FIG. 1 shows some of first wires and FIG. 2 shows some of second wires. Further, a perspective view of FIG. 3A schematically shows nonvolatile memory cells. FIG. 3B and FIG. 3C show equivalent circuit diagrams of the nonvolatile memory cells. In addition, FIG. 4 shows a perspective view conceptually showing the nonvolatile memory cells. FIG. 5 shows a plan view schematically showing a part of the memory cell unit array, which is a plan view showing some of the first wires. In addition, FIG. 6, FIG. 7, FIG. 8, and FIG. 9 show schematic, partial cross-sectional views of the memory cell unit array as it is cut along the virtual perpendicular plane parallel to the first direction. FIG. 10A, FIG. 10B, FIG. 11A, and FIG. 11B show schematic, partial plan views thereof as viewed along an arrow mark 10, an arrow mark 10B, an arrow mark 11A, and an arrow mark 11B of FIG. 6A. Further, FIG. 12A and FIG. 12B show schematic, partial cross-sectional views of the memory cell unit array as it is cut along another virtual perpendicular plane parallel to the second direction. FIG. 13A, FIG. 13B, FIG. 14A, FIG. 14B, and FIG. 15 show schematic, partial plan views of the memory cell unit array as viewed along an arrow mark 13A, an arrow mark 13B, an arrow mark 14A, an arrow mark 14B, and an arrow mark 15 of each of FIG. 12A and FIG. 12B. Note that, in the schematic, partial plan views, boundaries of the memory cell unit are indicated by long dashed short dashed lines and these schematic, partial plan views are schematic, partial plan views of a portion of a region "A" of FIG. 8.

Regarding the memory cell unit array according to Example 1, memory cell units 10 are arranged in a two-dimensional matrix form in the first direction and the second direction, the memory cell units 10 being each constituted of a plurality of first wires 31 extending in the first direction, a plurality of second wires 41 that are disposed separately from the first wires 31 in the upper and lower directions and extend in the second direction unlike the first wires 31, and nonvolatile memory cells 20 that are disposed in a region in which the first wires 31 and the second wires 41 overlap one another and connected to the first wires 31 and the second wires 41.

Each of the memory cell units 10 includes, below the memory cell unit 10, a control circuit that controls an operation of the memory cell unit 10.

The control circuit is constituted of a first control circuit that controls an operation of the nonvolatile memory cell 20 that constitutes the memory cell unit 10 via the first wires 31, and a second control circuit that controls an operation of the nonvolatile memory cell 20 that constitutes the memory cell unit 10 via the second wires 41.

The second wires 41 that constitute the memory cell unit 10 are connected to the second control circuit that constitutes this memory cell unit 10.

The control circuit is disposed below the memory cell unit 10. Note that, specifically, a projection image of the control circuit may be positioned in a projection image of the memory cell unit 10, the projection image of the control circuit and the projection image of the memory cell unit 10 may overlap each other, or a part of the projection image of the control circuit may be positioned in the projection image of the memory cell unit 10 (i.e., the control circuit and the memory cell unit 10 may be slightly offset from each other in the upper and lower directions).

Some of the first wires 31 that constitute the memory cell unit 10 are connected to the first control circuit that constitutes this memory cell unit 10 and others of the first wires 31 that constitute the memory cell unit 10 are connected to the first control circuit that constitutes an adjacent memory cell unit 10 adjacent thereto in the first direction.

In each of the memory cell units 10, the first wires 31 connected to the first control circuit that constitutes this memory cell unit 10 and the first wires 31 connected to the first control circuit that constitutes the adjacent memory cell unit 10 are alternately disposed. For example, as shown in FIG. 5, regarding a memory cell unit $10_{m,n}$ and a memory cell unit $10_{m+1,n}$, first wires 31B (shown by the dotted lines) connected to a first(II) control circuit 50B that constitutes the memory cell unit $10_{m+1,n}$ and first wires 31A (shown by the thin, solid lines) connected to a first(I) control circuit 50A that constitutes the adjacent memory cell unit $10_{m,n}$ a are alternately disposed.

In addition, the control circuit is covered with inter-layer insulating layers 71, 72, 73, 74. The first control circuit and first wires 31A, 31B are connected to one another via first contact holes 32A, 32B formed in the inter-layer insulating layers (in some cases, subscripts will be omitted). The second control circuit and the second wires 41 are connected to one another via second contact holes formed in the inter-layer insulating layers 42A, 42B (in some cases, subscripts will be omitted). When the first contact holes in one of the memory cell units 10 and the first contact holes in the memory cell unit 10 adjacent to this memory cell unit 10 in the first direction are projected in a virtual perpendicular plane parallel to the second direction, positions of projection images of the first contact holes are positioned at equal intervals along the second direction (e.g., see first contact holes 32A and first contact holes 32B shown by white circle symbols "A" and white square symbols "B" of FIG. 5). Note that, although the contact holes are positioned outside of the control circuit in FIG. 1, FIG. 2, FIG. 5, and FIG. 16, they are actually provided within the control circuit.

Further, the second wires 41 are, at end portions thereof, connected to the second control circuit. Note that one ends of odd-numbered second wires 41 as viewed in a plane are connected to a second(I) control circuit 60A (to be described later) and one ends of even-numbered second wires 41 as viewed in the plane are connected to a second(II) control circuit 60B (to be described later).

Here, the memory cell units 10 are arranged in-line along the second direction and arranged offset from each other along the first direction. Specifically, the memory cell units 10 are arranged in-line along the second direction and arranged offset from each other along the first direction by ½ of a length of the memory cell unit 10 along the second direction. Alternatively, the memory cell units 10 are arranged in a stretcher bond pattern of brick patterns.

In Example 1, half of the first wires 31 that constitute the memory cell unit 10 are connected to the first control circuit that constitutes this memory cell unit 10. The other half of the first wires 31 that constitute the memory cell unit 10 are connected to the first control circuit that constitutes the adjacent memory cell unit 10 adjacent thereto in the first direction.

In the memory cell unit array according to Example 1, the first control circuit is constituted of two circuits, the first(I) control circuit 50A and the first(II) control circuit 50B.

The second control circuit is constituted of two circuits, the second(I) control circuit 60A and the second(II) control circuit 60B.

The first(I) control circuit 50A is disposed along a first side 10a of the control circuit, which extends in parallel to the second direction.

The first(II) control circuit 50B extends in parallel to the second direction and is disposed along a third side 10c of the control circuit, which is opposed to the first side 10a.

The second(I) control circuit 60A is disposed along a second side 10b of the control circuit, which extends in parallel to the first direction.

The second(II) control circuit 60B extends in parallel to the first direction and is disposed along a fourth side 10d of the control circuit, which is opposed to the second side 10b. In this case, the second(I) control circuit 60A is disposed to occupy the entire second side 10b and occupy a part of the first side 10a and a part of the third side 10c.

The second(II) control circuit 60B is disposed to occupy the entire fourth side 10d and occupy a part of the first side 10a and a part of the third side 10c.

The first(I) control circuit 50A is disposed to occupy a part of the first side 10a.

The first(II) control circuit 50B is disposed to occupy a part of the third side 10c. Note that, in Example 1, a region occupied by the first(I) control circuit 50A and a region occupied by the first(II) control circuit 50B are arranged in point symmetry with respect to a center of the control circuit. A region occupied by the second(I) control circuit 60A and a region occupied by the second(II) control circuit 60B are arranged in point symmetry with respect to the center of the control circuit. In addition, a region occupied by the first(I) control circuit 50A and a region occupied by the first(II) control circuit 50B are arranged in line symmetry with respect to an axis parallel to the second direction, the axis passing through the center of the control circuit. A region occupied by the second(I) control circuit 60A and the region occupied by the second(II) control circuit 60B are arranged in line symmetry with respect to an axis parallel to the first direction, the axis passing through the center of the control circuit. Note that, in Example 1, $$L_0 = L_1 + L_1'$$

is satisfied and $$L_1 = L_1'$$

is satisfied.

In Example 1, the nonvolatile memory cell 20 is multi-layered having N layers (where N≥2). Specifically, the nonvolatile memory cell 20 has two layers (=N). The first wires 31 are formed in a first wire layer that is (N/2) layer (one layer, first wire layer 30). The second wires 41 are formed in second wire layers that are (N/2+1) layers (two layers, second wire layers $40_1$, $40_2$). The nonvolatile memory cells 20 are formed between the first wire layer and the second wire layers. That is to say, one of the nonvolatile memory cell 20 is formed between the first wires 31 and the second wires $41_1$. Further, the other of the nonvolatile memory cell 20 is formed between the first wires 31 and the second wires $41_2$. The first wire $41_1$ and the second wires $41_2$ are independently and separately driven. Writing, reading, and erasing of information are independently performed in the two nonvolatile memory cells 20 provided sandwiching two first wires 31.

The nonvolatile memory cell 20 according to Example 1 is formed of a phase-change nonvolatile memory device, specifically, a resistance-change nonvolatile memory device. More specifically, a resistance-change layer is formed of a laminate structure of a high-resistance layer and an ion source layer. Further, in Example 1, the nonvolatile memory cell 20 is constituted of nonvolatile memory devices 21 and selection devices 22 each having a non-linear current-voltage characteristic, such as bidirectional diodes. The selection devices 22 are provided between the first wires 31 and the nonvolatile memory devices 21 or between the second wires 41 and the nonvolatile memory devices 21. The selection devices 22 control current flowing through the nonvolatile memory devices 21. For example, when a current $I_{set}$ flows from the first wires 31 to the second wires 41, information is written in the nonvolatile memory devices 21. Further, by causing a fine current to flow from the first wires 31 to the second wires 41 and measuring electrical resistance values of the nonvolatile memory devices 21, it is possible to read out information stored in the nonvolatile memory devices 21. In addition, when a current $I_{reset}$ flows from the second wires 41 to the first wires 31, information of the nonvolatile memory devices 21 is erased. The directions in which the currents $I_{set}$, $I_{reset}$, and the like flow may be opposite.

Specifically, the high-resistance layer is formed of an aluminum oxide ($AlO_x$) and the ion source layer is formed of a copper-tellurium (Cu—Te) alloy film. Further, the first wires 31 and the second wires 41 are formed of copper (Cu), the contact holes are formed of tungsten (W), and the inter-layer insulating layer is formed of $SiO_2$. The control circuit having well-known configuration and structure is formed in a silicon semiconductor substrate 70 on the basis of a well-known method. Although, for example, a power supply line and various signal lines are provided in a portion of the silicon semiconductor substrate 70 between the memory cell unit and the memory cell unit and a drive circuit that drives the memory cell unit is provided as a peripheral circuit in a periphery of the memory cell unit array, illustrations thereof are omitted.

Figure 6:
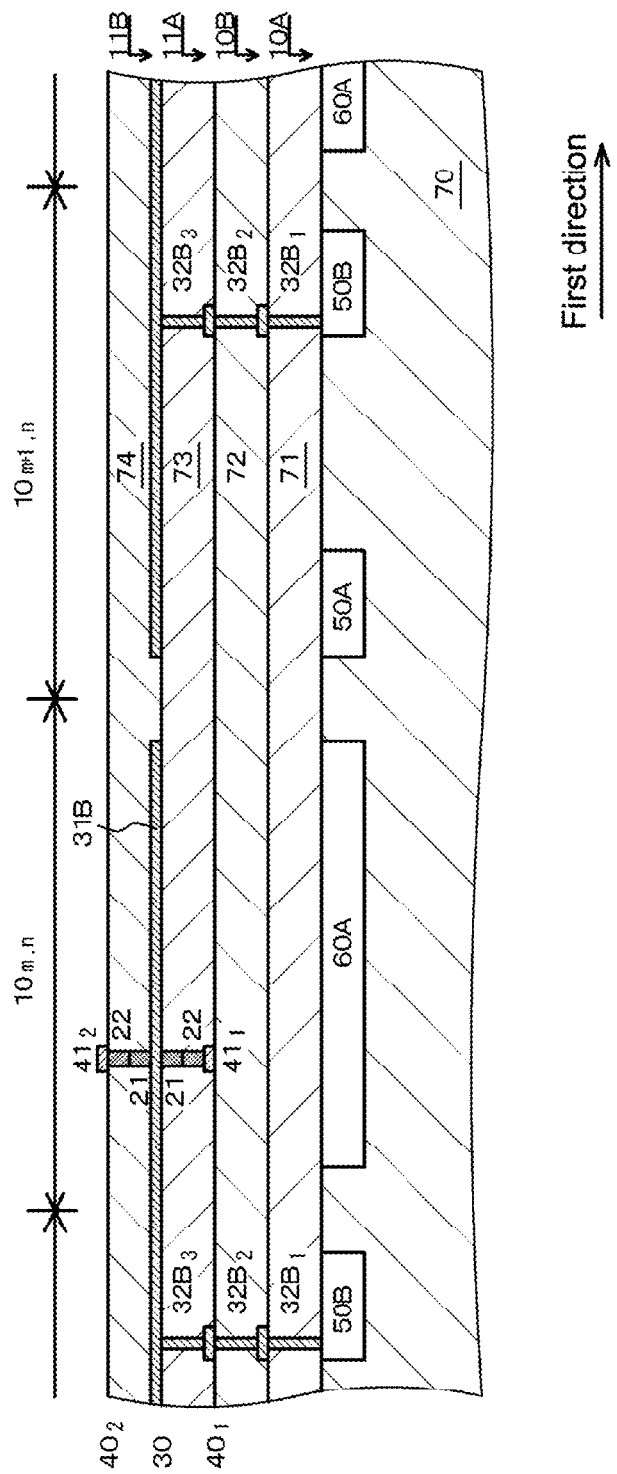
FIG. 6 is a schematic, partial cross-sectional view of the memory cell unit array according to Example 1 as it is cut along a virtual perpendicular plane parallel to a first direction.
Figure 7:
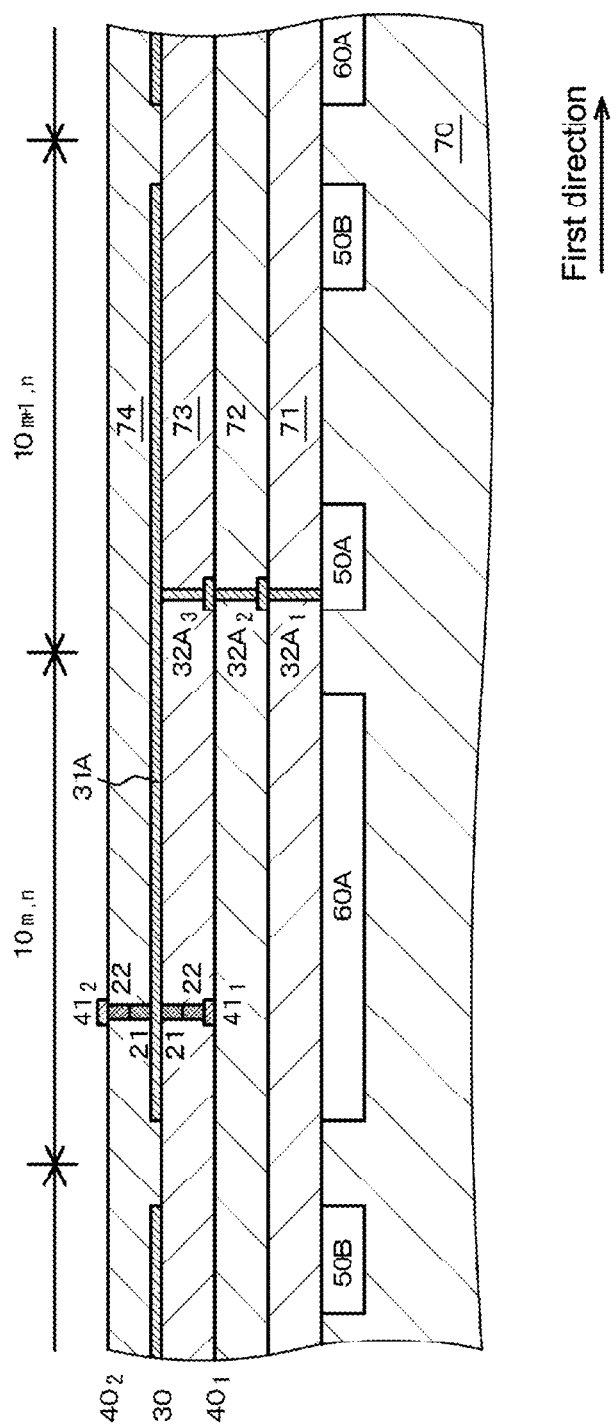
FIG. 7 is a schematic, partial cross-sectional view of the memory cell unit array according to Example 1 as it is cut along another virtual perpendicular plane parallel to the first direction.
Figure 8:
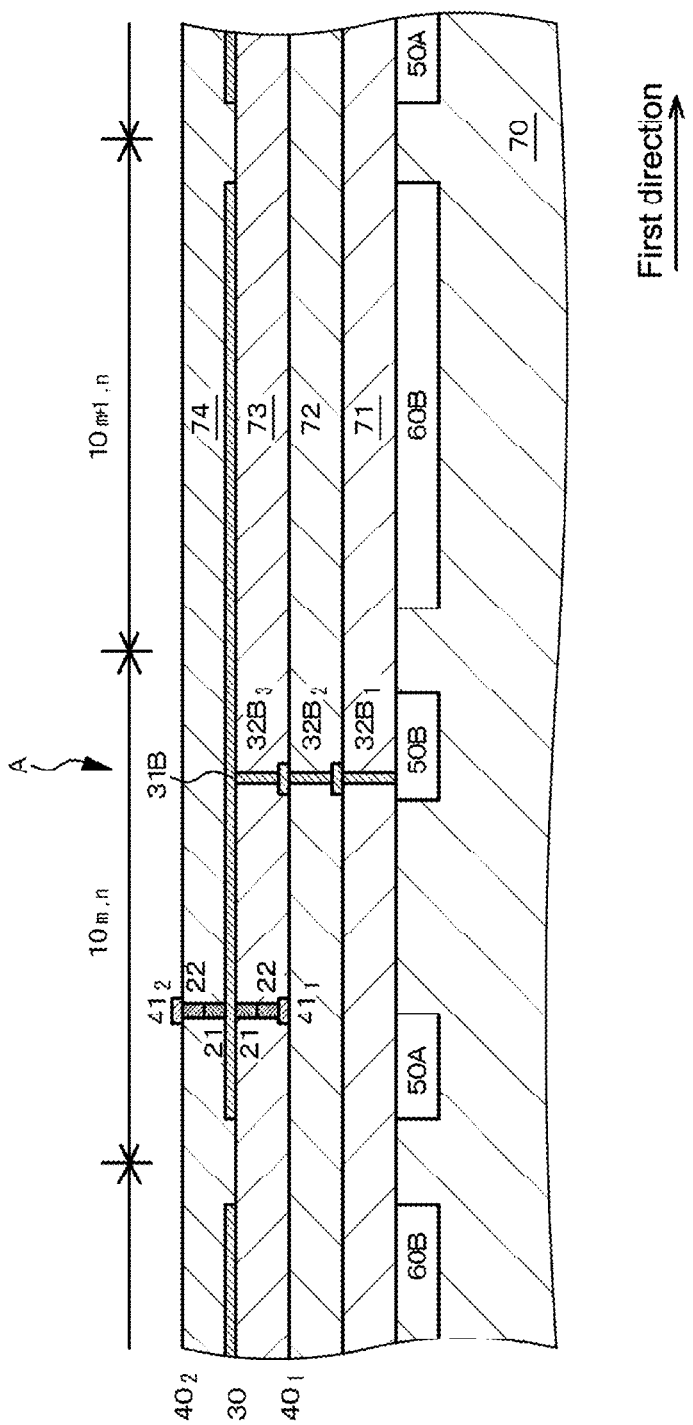
FIG. 8 is a schematic, partial cross-sectional view of the memory cell unit array according to Example 1 as it is cut along another virtual perpendicular plane parallel to the first direction.
Figure 9:
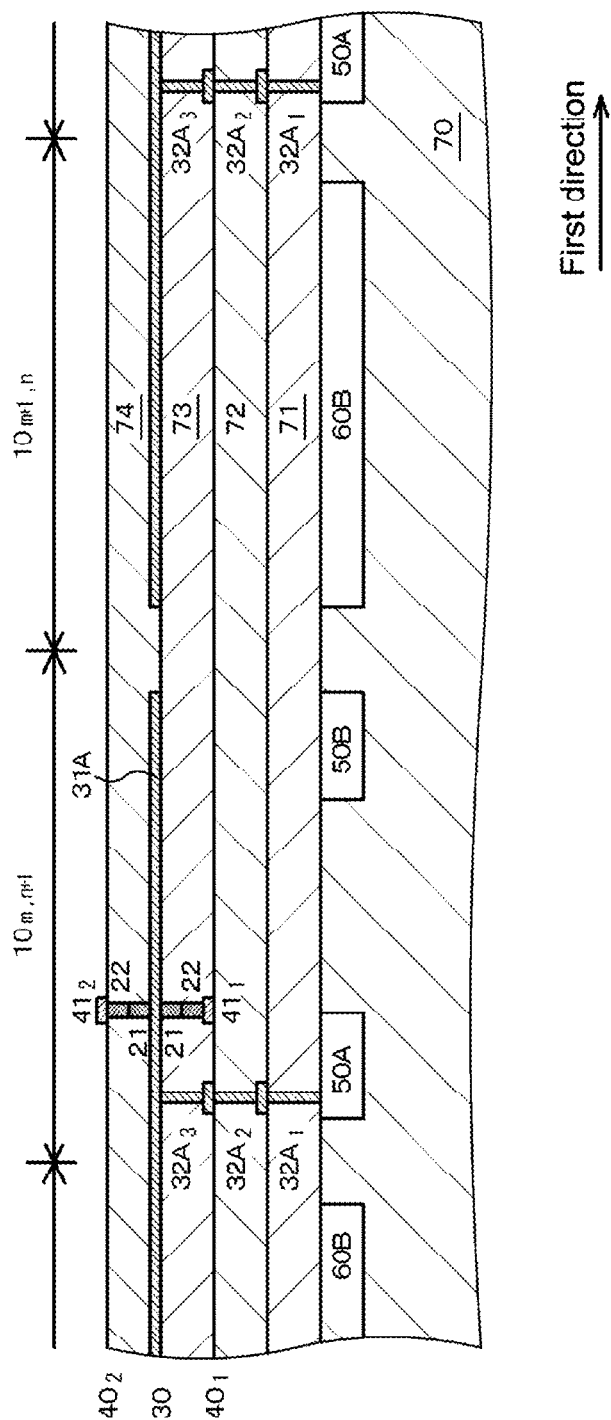
FIG. 9 is a schematic, partial cross-sectional view of the memory cell unit array according to Example 1 as it is cut along another virtual perpendicular plane parallel to the first direction.

The memory cell unit array according to Example 1 will be further described with reference to FIG. 6, FIG. 7, FIG. 8, and FIG. 9 that are schematic, partial cross-sectional views of the memory cell unit according to Example 1 as it is cut along the virtual perpendicular plane parallel to the first direction, FIG. 12A and FIG. 12B that are schematic, partial cross-sectional views of the memory cell unit array according to Example 1 as it is cut along another virtual perpendicular plane parallel to the second direction, and FIG. 10A, FIG. 10B, FIG. 11A, FIG. 11B, FIG. 13A, FIG. 13B, FIG. 14A, FIG. 14B, and FIG. 15 that are schematic, partial plan views thereof. FIG. 6 is a schematic, partial cross-sectional view of the memory cell unit as it is cut along a perpendicular virtual plane including a first wire 31B indicated as "α" of FIG. 5. FIG. 7 is a schematic, partial cross-sectional view of the memory cell unit as it is cut along a perpendicular virtual plane including a first wire 31A indicated as "β" of FIG. 5. FIG. 8 is a schematic, partial cross-sectional view of the memory cell unit as it is cut along a perpendicular virtual plane including a first wire 31B indicated as "γ" of FIG. 5. FIG. 9 is a schematic, partial cross-sectional view of the memory cell unit as it is cut along a perpendicular virtual plane including a first wire 31A indicated as "δ" of FIG. 5.

Figure 10A:
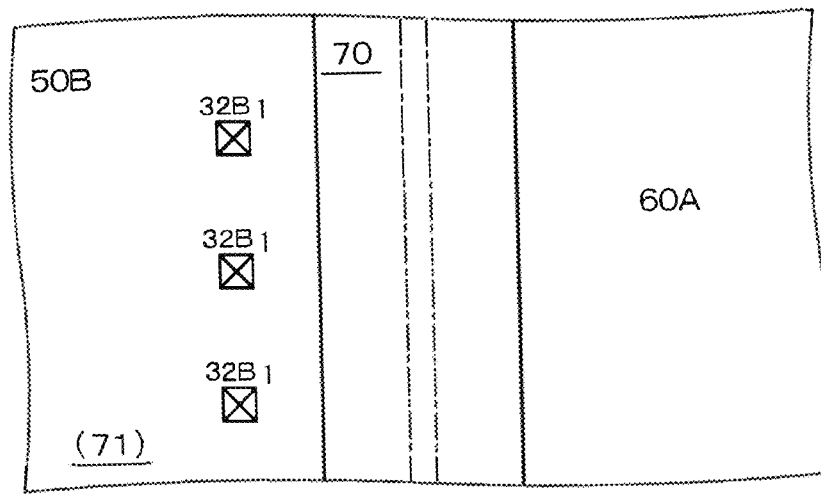
FIG. 10A and FIG. 10B are schematic, partial plan views of the memory cell unit array according to Example 1 as viewed along an arrow mark 10A and an arrow mark 10B of FIG. 6.
Figure 10B:
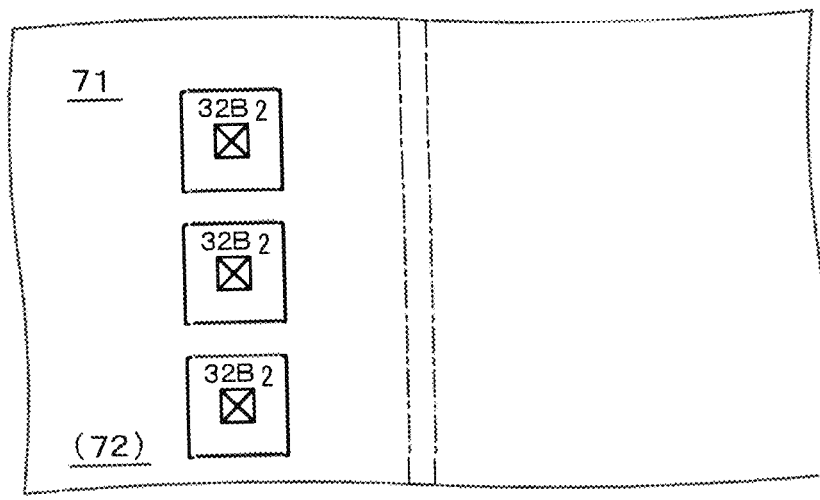
Figure 13A:
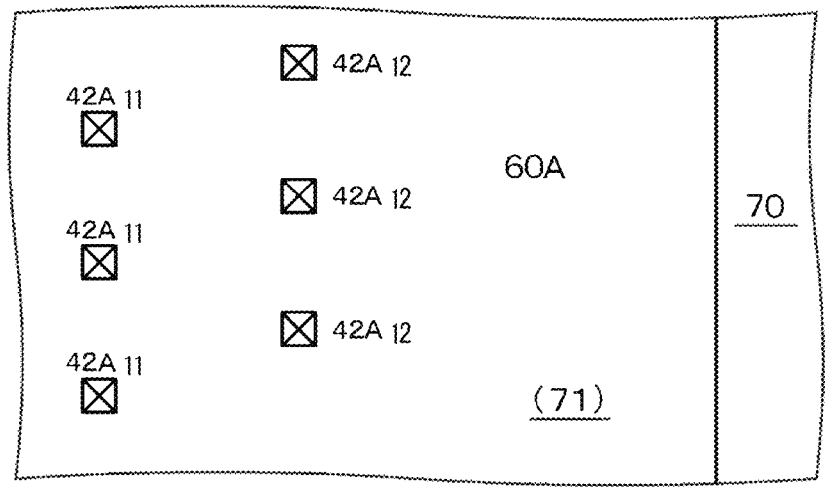
FIG. 13A and FIG. 13B are schematic, partial plan views of the memory cell unit array according to Example 1 as viewed along an arrow mark 13A and an arrow mark 13B of FIG. 12A and FIG. 12B.
Figure 13B:
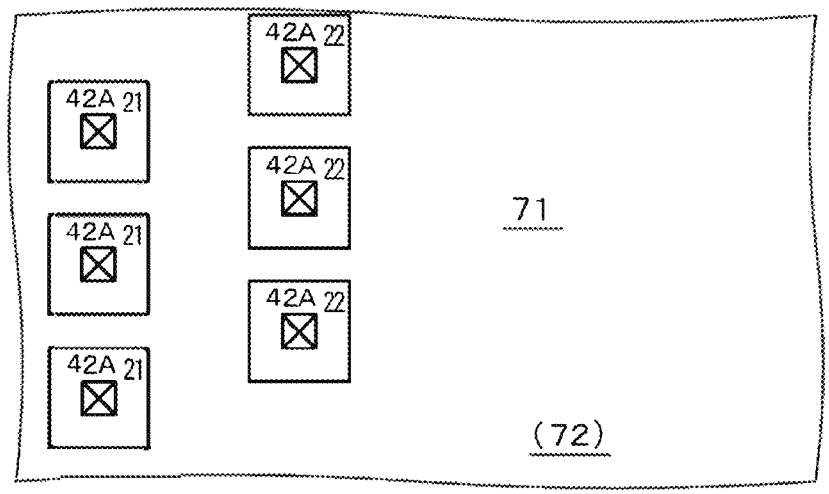
Figure 14A:
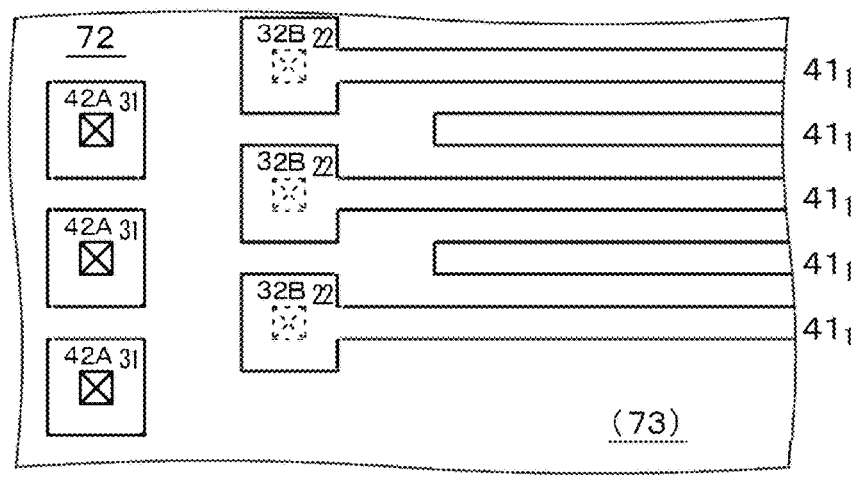
FIG. 14A and FIG. 14B are schematic, partial plan views of the memory cell unit array according to Example 1 as viewed along an arrow mark 14A and an arrow mark 14B of FIG. 12A and FIG. 12B.
Figure 14B:
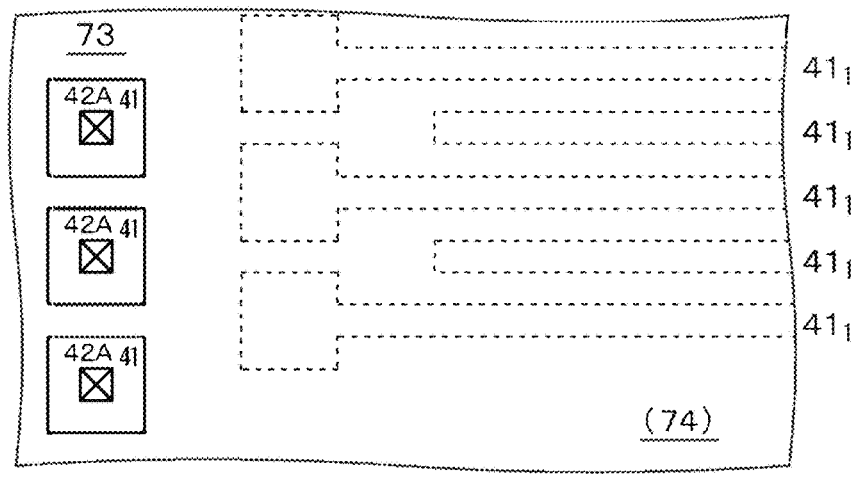
Figure 15:
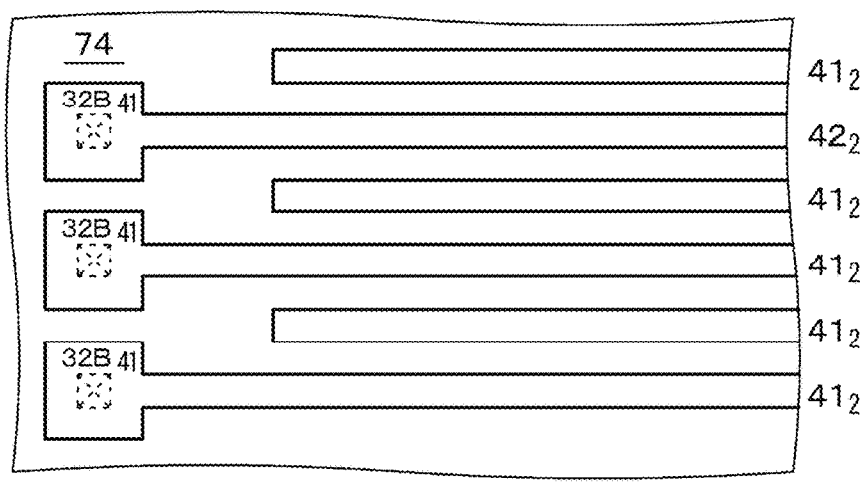
FIG. 15 is a schematic, partial plan view of the memory cell unit array according to Example 1 as viewed along an arrow mark 15 of FIG. 12A and FIG. 12B.

As shown in FIG. 10A, first contact holes $32B_1$ extend upwardly from the first(II) control circuit 50B through the inter-layer insulating layer 71. Further, as shown in FIG. 13A, second contact holes $42A_{11}$, $42A_{12}$ extend upwardly from the second(I) control circuit 60A through the inter-layer insulating layer 71. In addition, as shown in FIG. 10B, first contact holes $32B_2$ extend upwardly from the first contact holes $32B_1$ through the inter-layer insulating layer 72. Further, as shown in FIG. 13B, second contact holes $42A_{21}$, $42A_{22}$ extend upwardly from second contact holes $42A_{11}$, $42A_{12}$ through the inter-layer insulating layer 72. In addition, as shown in FIG. 11A, first contact holes $32B_3$ extend upwardly from the first contact holes $32B_2$ through the inter-layer insulating layer 73. Further, as shown in FIG. 14A, the second wires $41_1$ extend in the second direction from the second contact holes $42A_{22}$ on the inter-layer insulating layer 72 and second contact holes $42A_{31}$ extend upwardly from the second contact holes $42A_{21}$ through the inter-layer insulating layer 73. In addition, as shown in FIG. 11B, the first wires 31 extend in the first direction from the first contact holes $32B_3$ on the inter-layer insulating layer 73. Further, as shown in FIG. 14B, second contact holes $42A_{41}$ extend upwardly from the second contact holes $42A_{31}$ through the inter-layer insulating layer 74. As shown in FIG. 15, the second wires $41_1$ extend in the second direction from the second contact holes $42A_{41}$ on the inter-layer insulating layer 74.

In the above-mentioned memory cell unit array according to Example 1, one first wire 31 is connected to the first(II) control circuit 50B via one set of the first contact holes $32B_1$, $32B_2$, $32B_3$ upwardly extending from the first(II) control circuit 50B. It should be noted that it is not limited to such a configuration.

Figure 16:
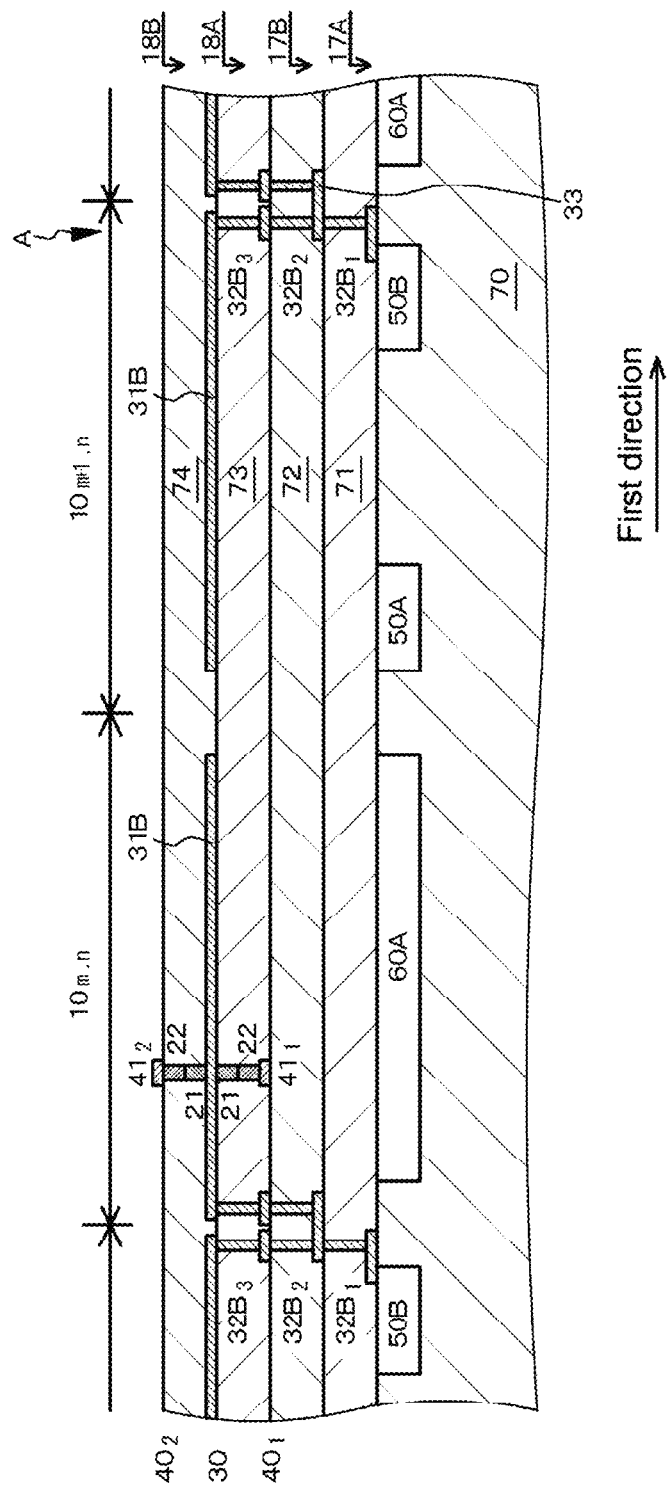
FIG. 16 is a schematic, partial cross-sectional view of a modified example of the memory cell unit array according to Example 1 as it is cut along the virtual perpendicular plane parallel to the first direction.
Figure 17A:
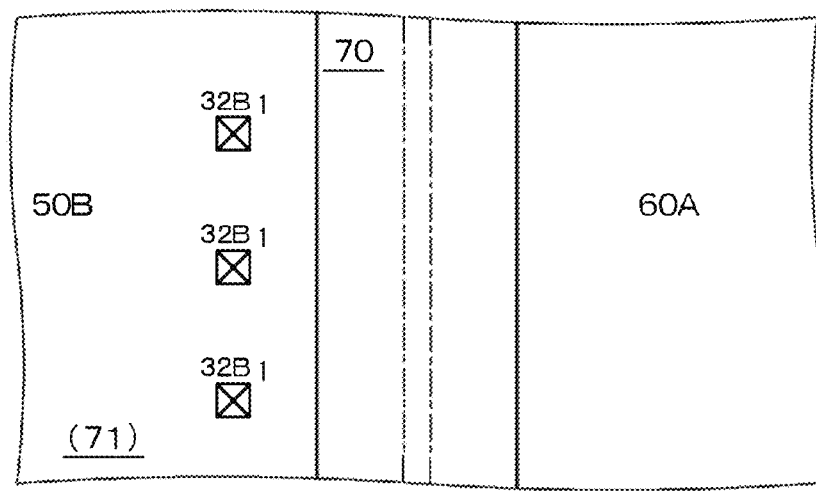
FIG. 17A and FIG. 17B are schematic, partial plan views of the modified example of the memory cell unit array according to Example 1 as it is viewed an arrow mark 17A and an arrow mark 17B of FIG. 16.
Figure 17B:
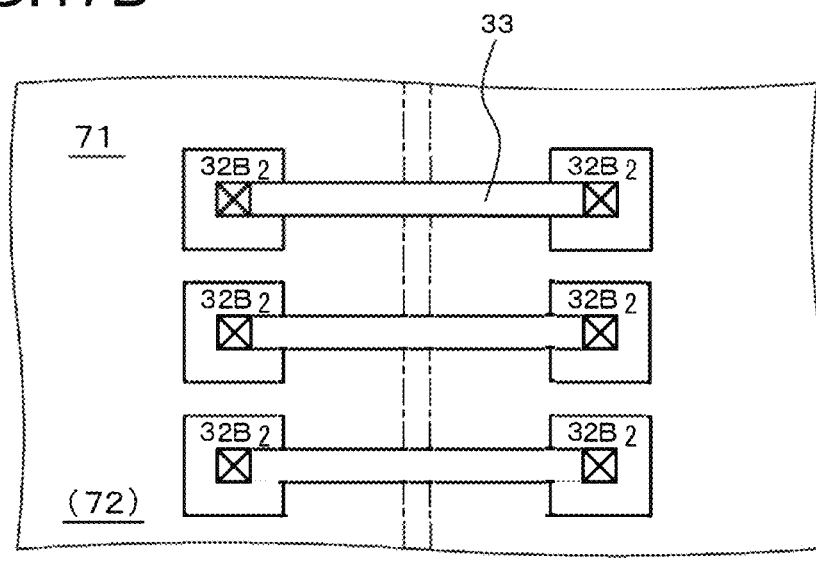
Figure 18A:
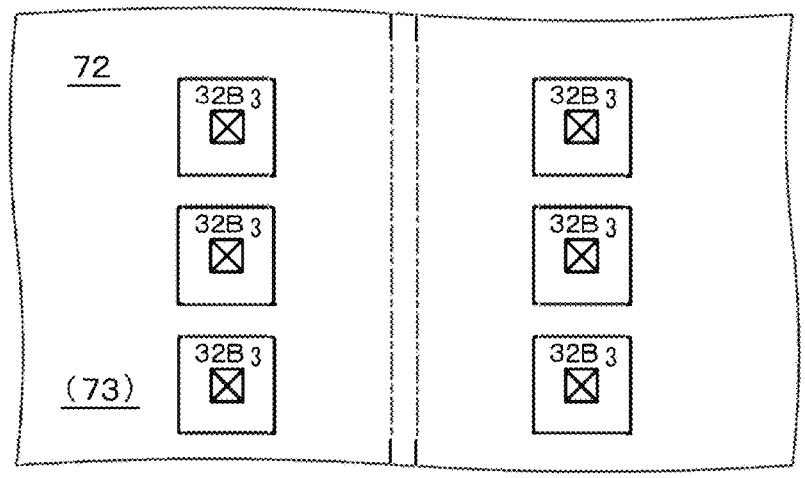
FIG. 18A and FIG. 18B are schematic, partial plan views of the modified example of the memory cell unit array according to Example 1 as viewed along an arrow mark 18A and an arrow mark 18B of FIG. 16.
Figure 18B:
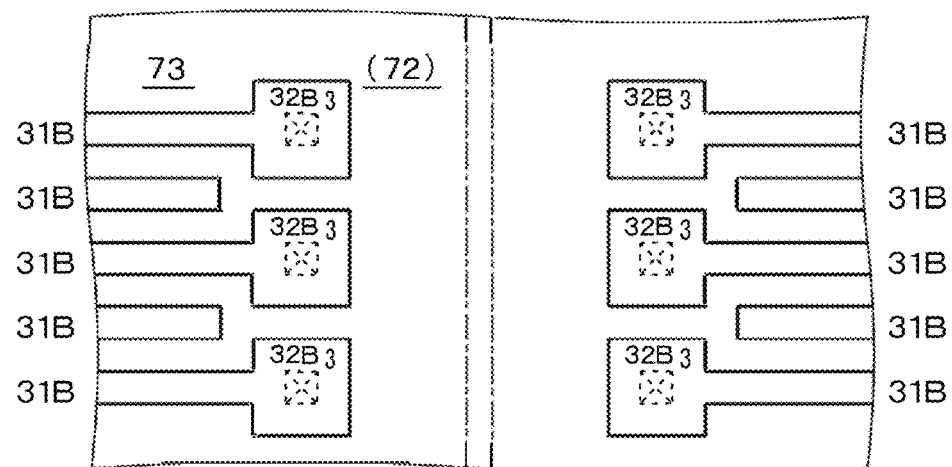

FIG. 16 shows a schematic, partial cross-sectional view of a modified example of the memory cell unit array according to Example 1 as it is cut along the virtual perpendicular plane parallel to the first direction. FIG. 17A, FIG. 17B, FIG. 18A, and FIG. 18B show schematic, partial plan views of the modified example of the memory cell unit array according to Example 1 as viewed along an arrow mark 17, an arrow mark 17B, an arrow mark 18A, and an arrow mark 18B of FIG. 16A. Note that FIG. 16 is a schematic, partial cross-sectional view similar to FIG. 6, and further, those schematic, partial plan views are schematic, partial plan views of a portion of a region "A" of FIG. 16. In this modified example of the memory cell unit array according to in Example 1, the first contact holes 32131 extend upwardly from the first(II) control circuit 50B through the inter-layer insulating layer 71 as shown in FIG. 17A and first control wires 33 extend from the first contact holes $32B_1$ on the inter-layer insulating layer 71 toward the adjacent memory cell unit, as shown in FIG. 17B. As shown in FIG. 17B, the first contact holes $32B_2$ extend upwardly from the first control wires 33 through the inter-layer insulating layer 72. In addition, as shown in FIG. 18A, the first contact holes $32B_3$ extend upwardly from the first contact holes $32B_2$ through the inter-layer insulating layer 73. As shown in FIG. 18B, first wires 31B extend in the first direction from the first contact holes $32B_3$ on the inter-layer insulating layer 73. Note that the first wires 31B are separated from one another but electrically connected to one another through the first control wires 33.

In the memory cell unit array according to Example 1, some of the first wires that constitute the memory cell unit are connected to the first control circuit that constitutes this memory cell unit and others of the first wires that constitute the memory cell unit are connected to the first control circuit that constitutes an adjacent memory cell unit adjacent thereto in the first direction. In addition, the plurality of nonvolatile memory cells and the control circuit overlap one another in upper and lower directions. Therefore, a highest-density arrangement of nonvolatile memory cells can be provided. A memory cell unit array in which cross-point memory cell units are arranged in a two-dimensional matrix form, which has configuration and structure with high area efficiency, can be provided. Thus, manufacturing yield can be improved. In addition, wires (control wires) are not basically provided directly on the control circuit. Therefore, without problems of occurrence of parasitic capacitance caused by wires, noise occurrence in wires, and interference between wires and the control circuit, a memory cell unit array having a high reliability can be provided.

Example 2

Figure 19:
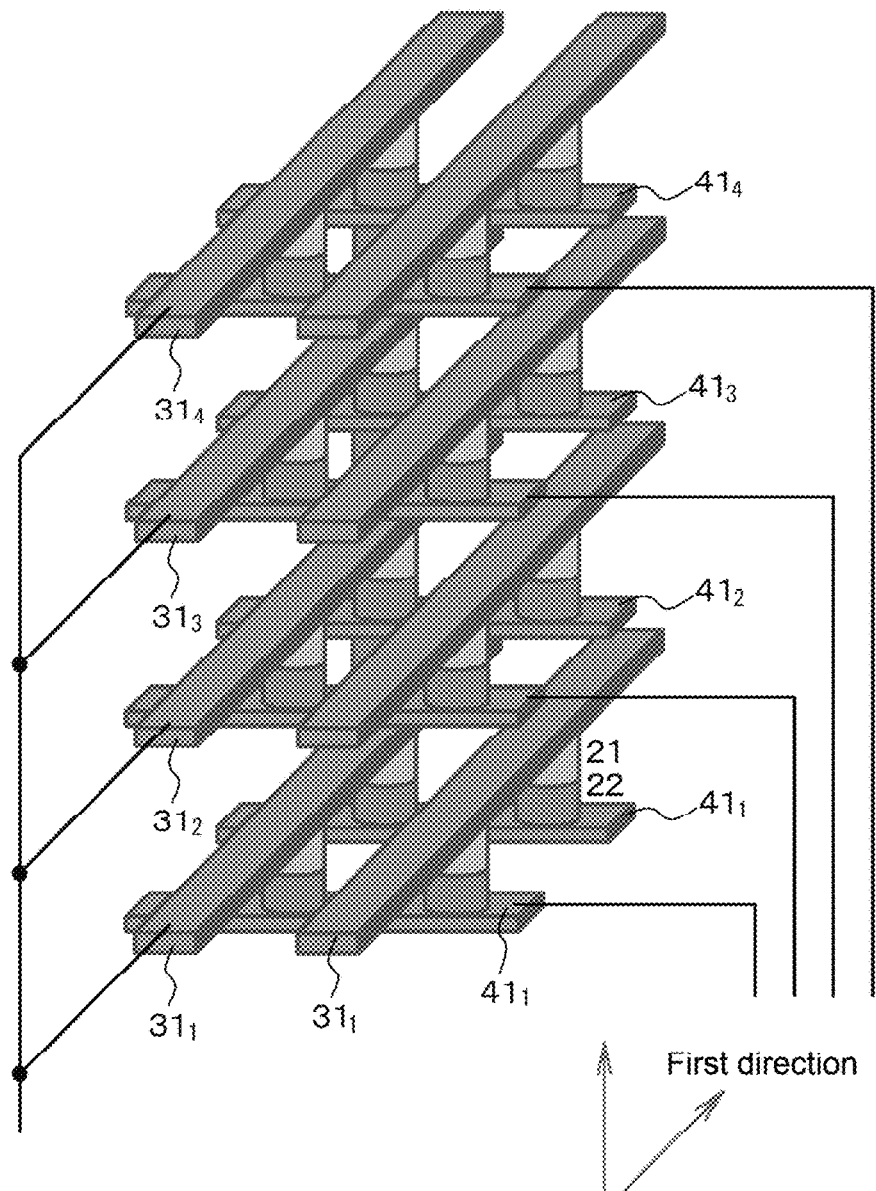
FIG. 19 is a perspective view schematically showing nonvolatile memory cells in Example 2.
Figure 20:
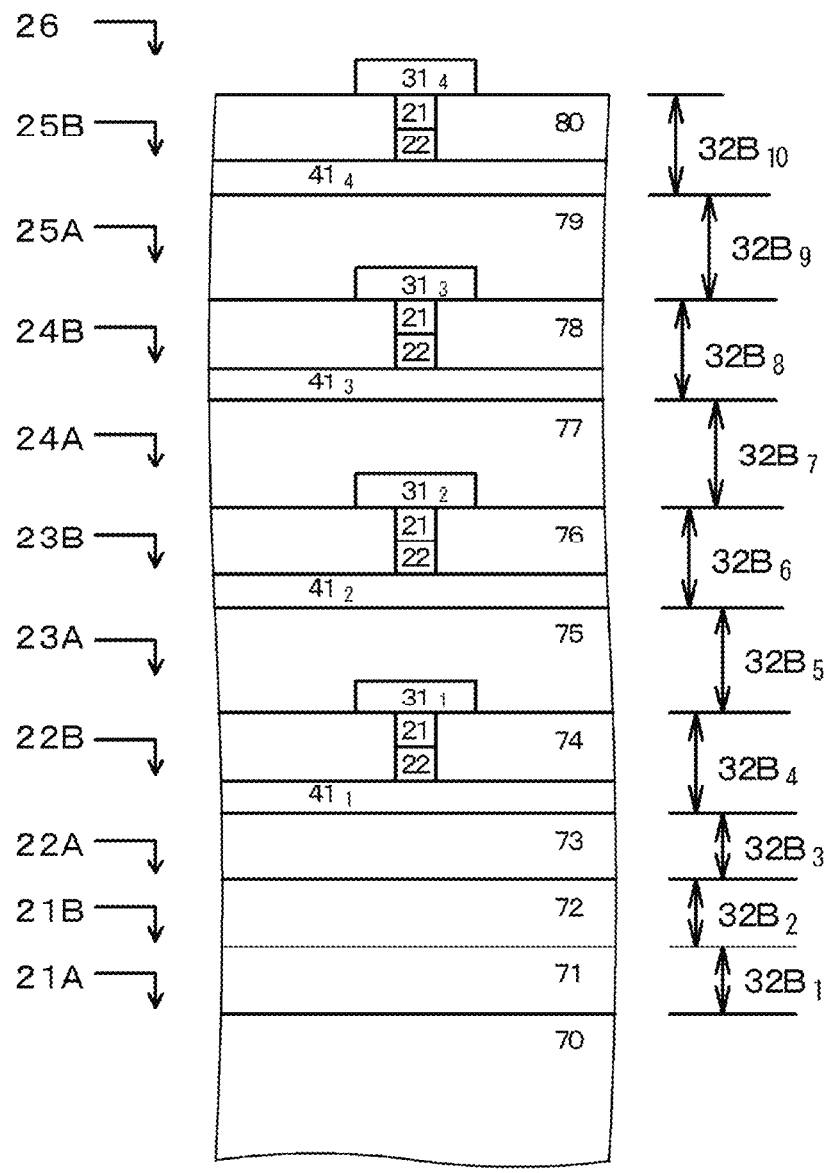
FIG. 20 is a conceptual, partial cross-sectional view for describing components of a memory cell unit array according to Example 2.
Figure 26:
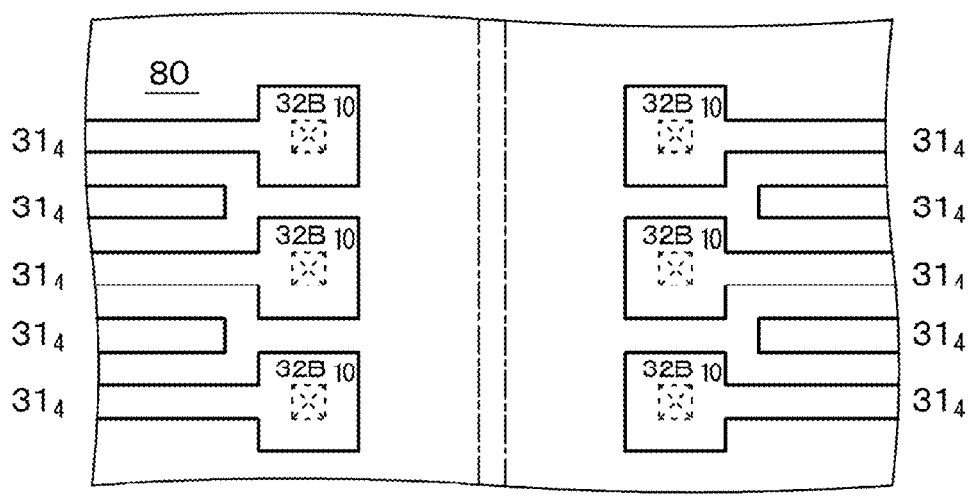
FIG. 26 is a schematic, partial plan view of the memory cell unit array according to Example 2 as viewed along an arrow mark 26 of FIG. 20.
Figure 27:
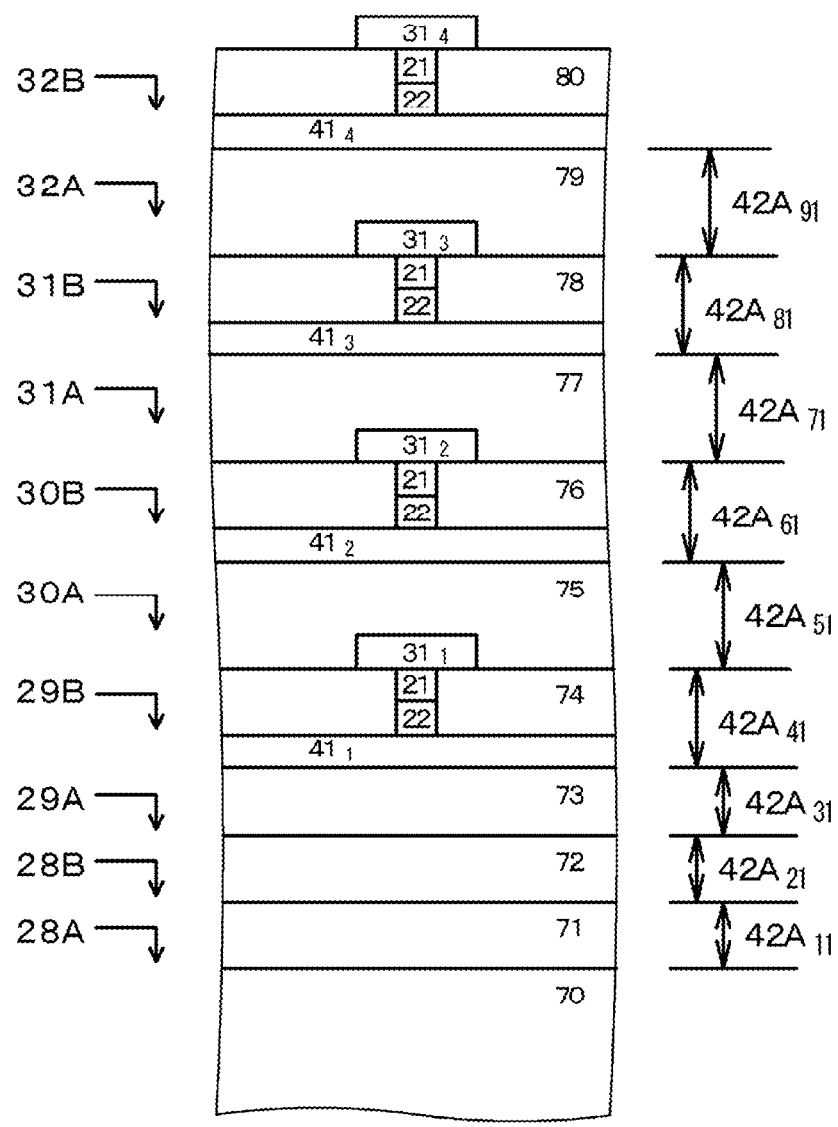
FIG. 27 is a conceptual, partial cross-sectional view for describing components of the memory cell unit array according to Example 2.

Example 2 is a modification of Example 1. FIG. 19 shows a perspective view schematically showing nonvolatile memory cells in Example 2. FIG. 20 and FIG. 27 show conceptual, partial cross-sectional views for describing components of a memory cell unit array according to Example 2. Further, FIG. 21A, FIG. 21B, FIG. 22A, FIG. 22B, FIG. 23A, FIG. 23B, FIG. 24A, FIG. 24B, FIG. 25A, FIG. 25B, FIG. 26, FIG. 28A, FIG. 28B, FIG. 29A, FIG. 29B, FIG. 30A, FIG. 30B, FIG. 31A, FIG. 31B, FIG. 32A, and FIG. 32B show schematic, partial plan views of the memory cell unit array according to Example 2 as it is viewed along an arrow mark 21, an arrow mark 21B, an arrow mark 22A, an arrow mark 22B, an arrow mark 23A, an arrow mark 23B, an arrow mark 24A, an arrow mark 24B, an arrow mark 25A, an arrow mark 25B, and an arrow mark 26 of FIG. 20A and an arrow mark 28, an arrow mark 28B, an arrow mark 29A, an arrow mark 29B, an arrow mark 30A, an arrow mark 30B, an arrow mark 31A, an arrow mark 31B, an arrow mark 32A, and an arrow mark 32B of FIG. 27A.

In the memory cell unit array according to Example 2, first wires $31_1$, $31_2$, $31_3$, $31_4$ are formed in first wire layers that are N layers (where N is an even number equal to two or more, specifically, in Example 2, N=4) and second wires $41_1$, $41_2$, $41_3$, $41_4$ are formed in second wire layers that are N layers (=4). A nonvolatile memory cell 20 is formed between the first wire layer and the second wire layer. The second wires $41_1$, $41_2$, $41_3$, $41_4$ are independently and separately driven. On the other hand, although the first wires $31_1$, $31_2$, $31_3$, $31_4$ are similarly driven at the same time, they may be independently and separately driven.

Connection of the first wires $31_1$, $31_2$, $31_3$, $31_4$ to first control circuits 50A, 50B is as follows.

Note that the control circuits are covered with inter-layer insulating layers 71, 72, 73, 74 and the first control circuits 50A, 50B and the first wires 31 are connected to one another via the first control wires 33 and first contact holes 32A, 32B formed in the inter-layer insulating layers. Second control circuits 60A, 60B and the second wires 41 are connected to one another via second control wires 43 and second contact holes 42A, 42B formed in inter-layer insulating layers. The first control circuits 50A, 50B and the second control wires 43 do not overlap each other in the upper and lower directions and the second control circuits 60A, 60B and the first control wires 33 do not overlap each other in the upper and lower directions. Further, when first contact holes 32A, 32B in one of the memory cell units 10 and first contact holes 32A, 32B in a memory cell unit 10 adjacent to this memory cell unit 10 in the first direction are projected in the virtual perpendicular plane parallel to the second direction, positions of projection images of the first contact holes 32A, 32B are positioned at equal intervals along the second direction.

Figure 21A:
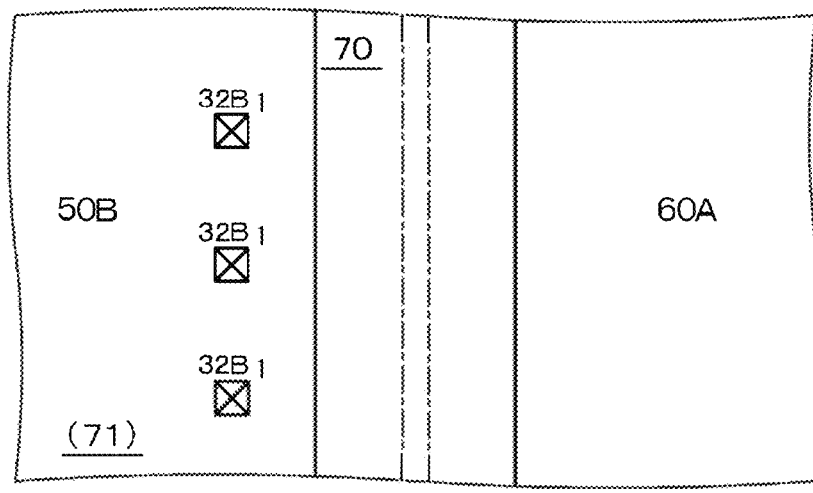
FIG. 21A and FIG. 21B are schematic, partial plan views of the memory cell unit array according to Example 2 as viewed along an arrow mark 21A and an arrow mark 21B of FIG. 20.
Figure 21B:
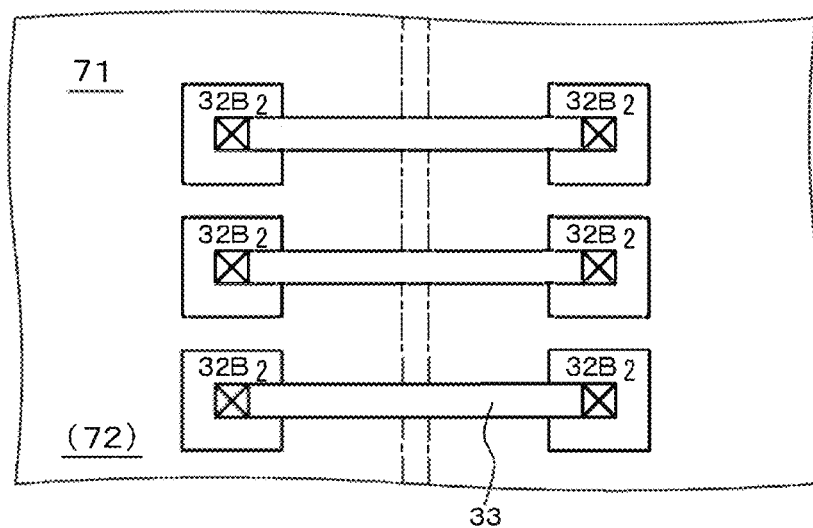
Figure 22A:
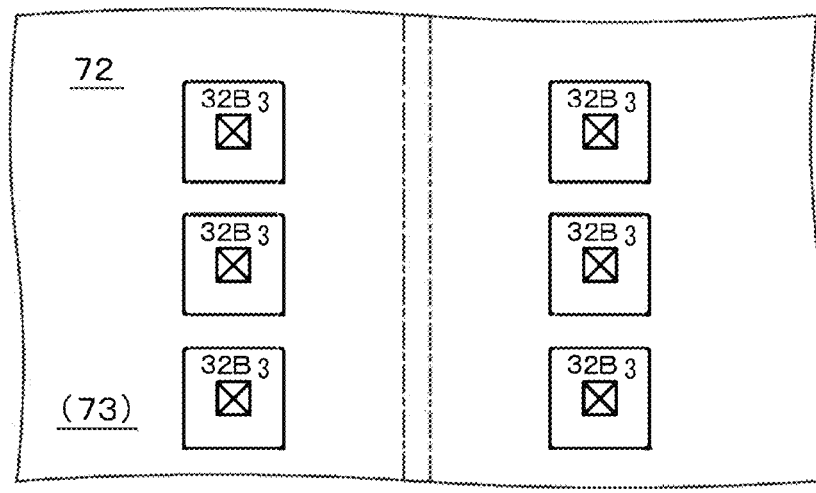
FIG. 22A and FIG. 22B are schematic, partial plan views of the memory cell unit array according to Example 2 as viewed along an arrow mark 22A and an arrow mark 22B of FIG. 20.
Figure 22B:
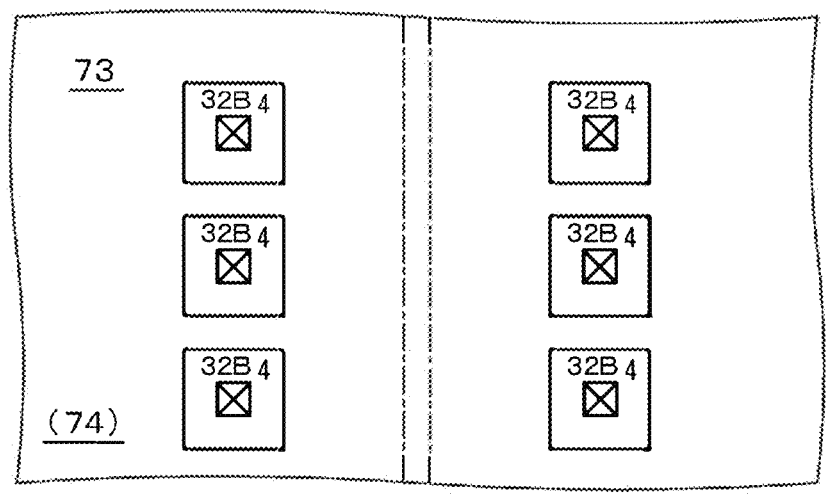
Figure 23A:
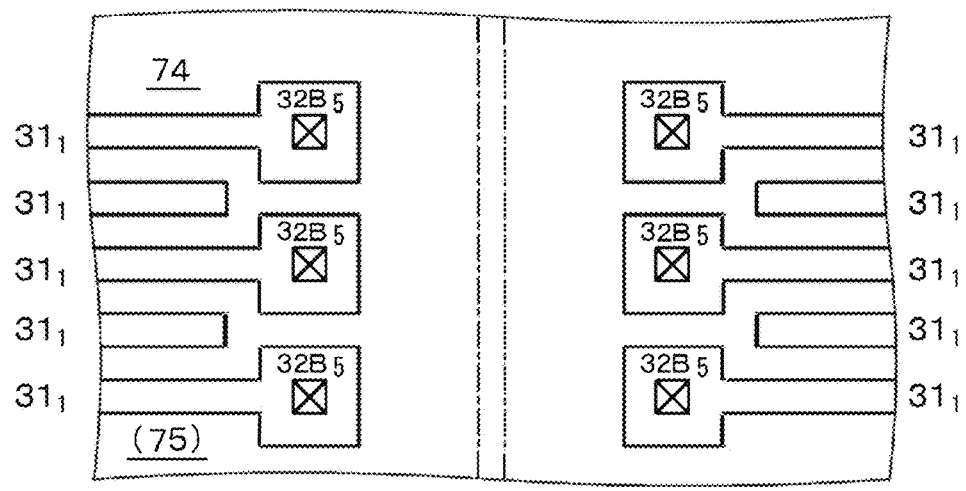
FIG. 23A and FIG. 23B are schematic, partial plan views of the memory cell unit array according to Example 2 as viewed along an arrow mark 23A and an arrow mark 23B of FIG. 20.

As shown in FIG. 21A, first contact holes $32B_1$ extend upwardly from the first(II) control circuit 50B through the inter-layer insulating layer 71. As shown in FIG. 21B, the first control wires 33 extend from the first contact holes $32B_1$ on the inter-layer insulating layer 71 toward the adjacent memory cell unit. As shown in FIG. 21B, the first contact holes $32B_2$ extend upwardly from the first control wires 33 through the inter-layer insulating layer 72. In addition, as shown in FIG. 22A, the first contact holes $32B_3$ extend upwardly from the first contact holes $32B_2$ through the inter-layer insulating layer 73. As shown in FIG. 22B, the first contact holes $32B_4$ extend upwardly from the first contact holes $32B_3$ through the inter-layer insulating layer 74. As shown in FIG. 23A, the first wires $31_1$ extend in the first direction from the first contact holes $32B_4$ on the inter-layer insulating layer 74.

Figure 23B:
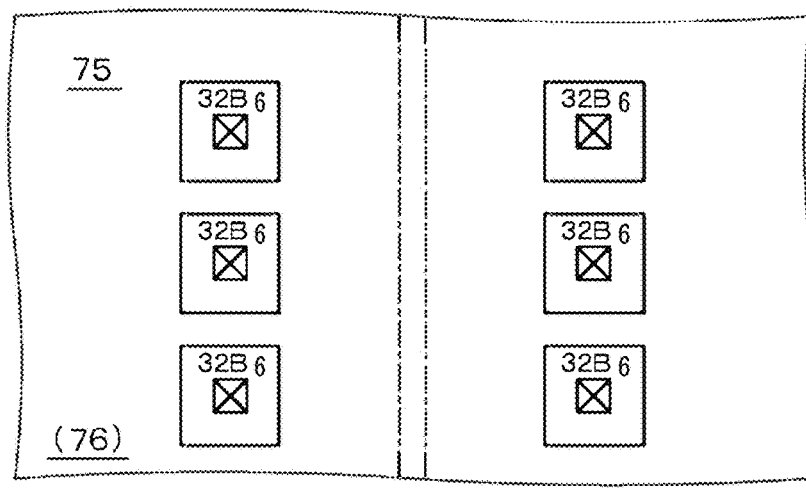
Figure 24A:
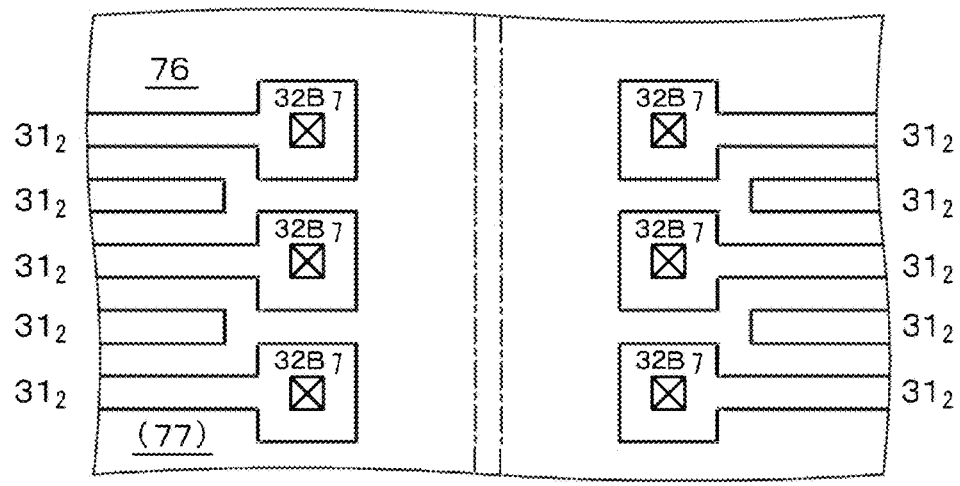
FIG. 24A and FIG. 24B are schematic, partial plan views of the memory cell unit array according to Example 2 as viewed along an arrow mark 24A and an arrow mark 24B of FIG. 20.

In addition, as shown in FIG. 23A, first contact holes $32B_5$ extend upwardly from the first wires $31_1$ through an inter-layer insulating layer 75. As shown in FIG. 23B, first contact holes $32B_6$ extend upwardly from the first contact holes $32B_5$ through an inter-layer insulating layer 76. As shown in FIG. 24A, the first wires $31_2$ extend in the first direction from the first contact holes $32B_6$ on the inter-layer insulating layer 76.

Figure 24B:
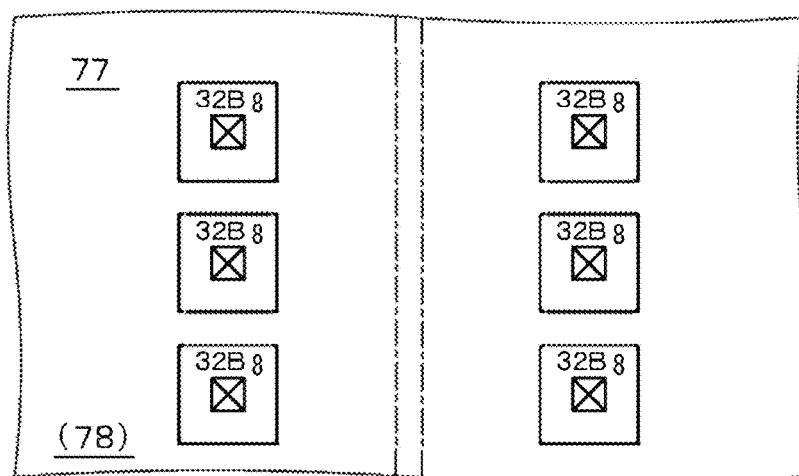
Figure 25A:
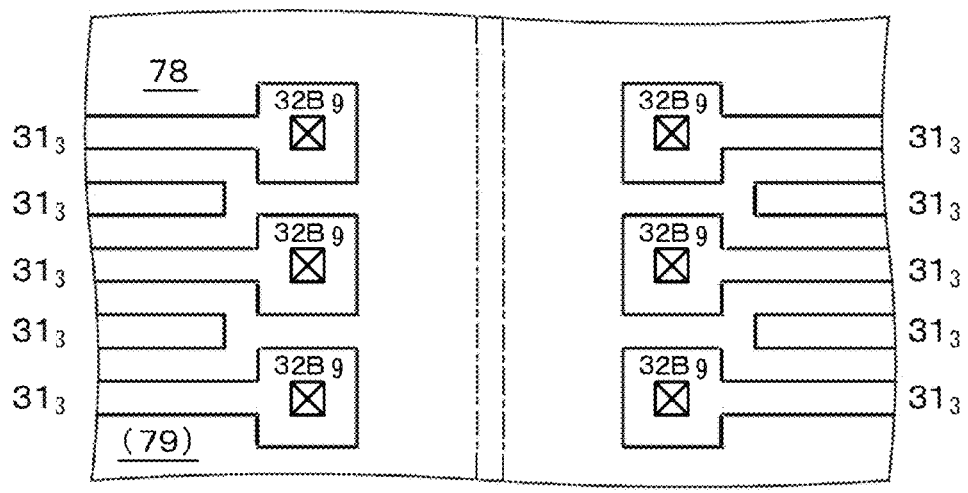
FIG. 25A and FIG. 25B are schematic, partial plan views of the memory cell unit array according to Example 2 as viewed along an arrow mark 25A and an arrow mark 25B of FIG. 20.

In addition, as shown in FIG. 24A, first contact holes $32B_7$ extend upwardly from the first wires $31_2$ through an inter-layer insulating layer 77. As shown in FIG. 24B, first contact holes $32B_8$ extend upwardly from the first contact holes $32B_7$ through an inter-layer insulating layer 78. As shown in FIG. 25A, the first wires $31_3$ extend in the first direction from the first contact holes $32B_8$ on the inter-layer insulating layer 78.

Figure 25B:
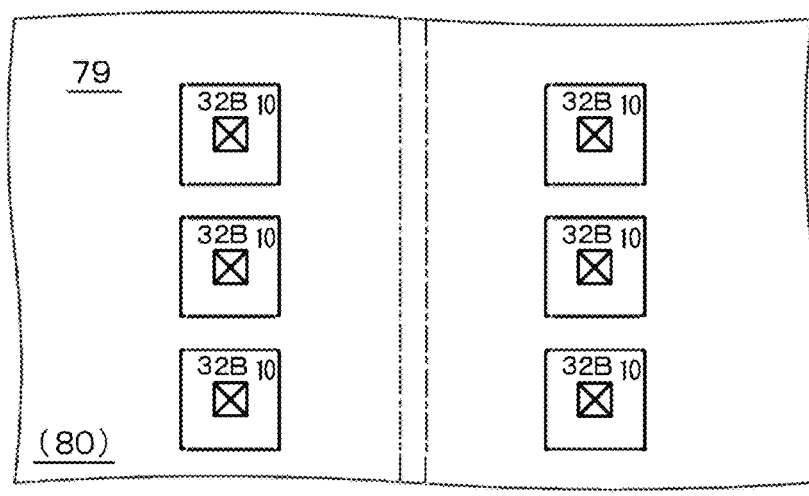

In addition, as shown in FIG. 25A, first contact holes $32B_9$ extend upwardly from the first wires $31_3$ through an inter-layer insulating layer 79. As shown in FIG. 25B, first contact holes $32B_{10}$ extend upwardly from the first contact holes $32B_9$ through an inter-layer insulating layer 80. As shown in FIG. 26, the first wires $31_4$ extend in the first direction from the first contact holes $32B_{10}$ on the inter-layer insulating layer 80. Note that, although the first wires $31_1$, $31_2$, $31_3$, $31_4$ are separated from one another, they are electrically connected to one another through the first control wires 33.

Figure 28A:
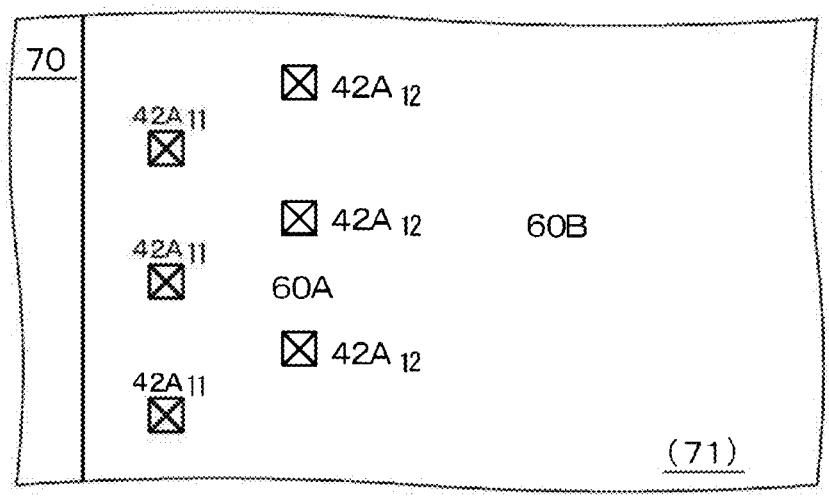
FIG. 28A and FIG. 28B are schematic, partial plan views of the memory cell unit array according to Example 2 as viewed along an arrow mark 28A and an arrow mark 28B of FIG. 27.
Figure 28B:
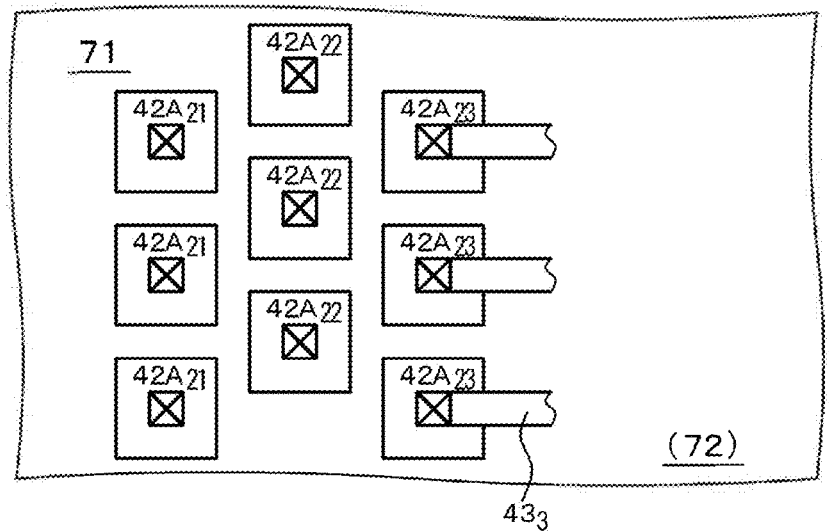
Figure 29A:
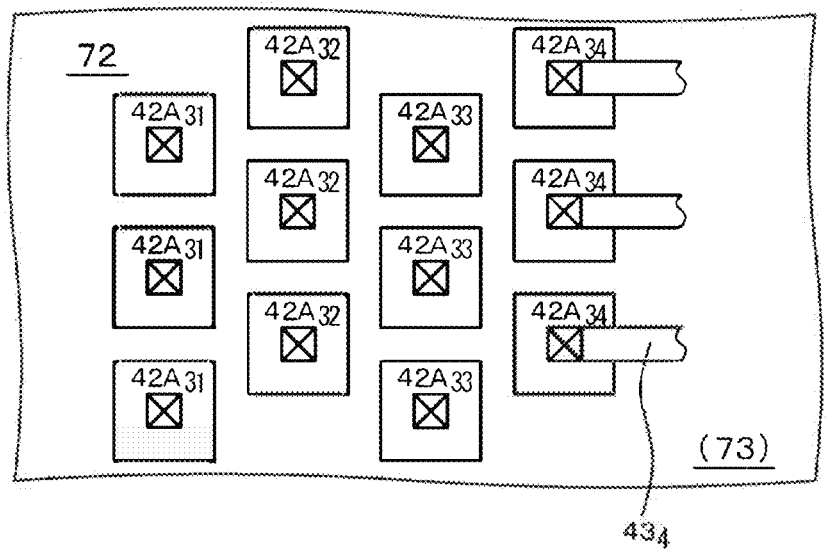
FIG. 29A and FIG. 29B are schematic, partial plan views of the memory cell unit array according to Example 2 as viewed along an arrow mark 29A and an arrow mark 29B of FIG. 27.
Figure 29B:
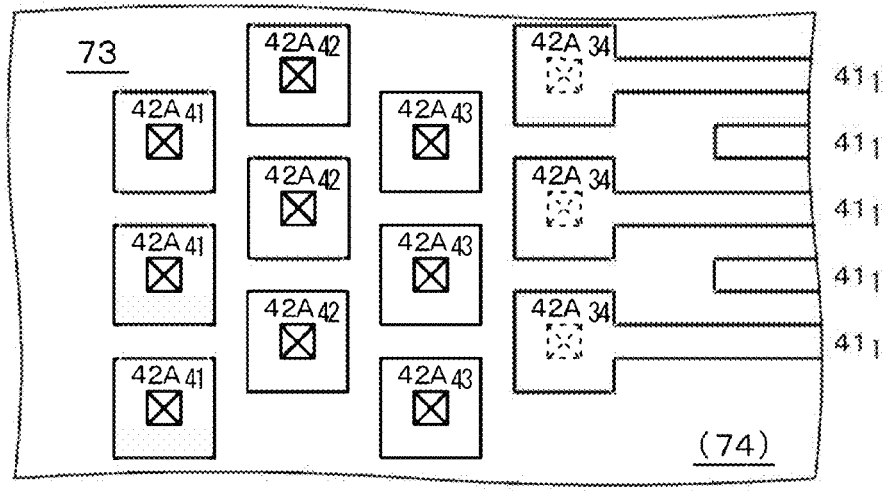

Further, connection of the second control circuits 60A, 60B of the second wires $41_1$, $41_2$, $41_3$, $41_4$ is as follows. That is to say, as shown in FIG. 28A, the second contact holes $42A_{11}$, $42A_{12}$ extend upwardly from the second(I) control circuit 60B through the inter-layer insulating layer 71. Further, second contact holes $42A_{13}$, $42A_{14}$ (not shown) upwardly extend. As shown in FIG. 28B, first control wires $43_3$ extend from second contact holes $42A_{13}$ (not shown) on the inter-layer insulating layer 71 up to regions in which second contact holes $42A_{23}$ should be formed. As shown in FIG. 28B, the second contact holes $42A_{21}$, $42A_{22}$, $42A_{23}$, second contact holes $42A_{24}$ (not shown) upwardly extend through the inter-layer insulating layer 72. As shown in FIG. 29A, first control wires $43_4$ extend from the second contact holes $42A_{24}$ (not shown) on the inter-layer insulating layer 72 up to regions in which second contact holes $42A_{34}$ should be formed. Note that the first control wires $43_3$, $43_4$ are connected to the second(I) control circuit 60B. In addition, as shown in FIG. 29A, second contact holes $42A_{31}$, $42A_{32}$, $42A_{33}$, $42A_{34}$ upwardly extend through the inter-layer insulating layer 73. As shown in FIG. 29B, the second wires $41_1$ extend in the second direction from the second contact holes $42A_{34}$ on the inter-layer insulating layer 73.

Figure 30A:
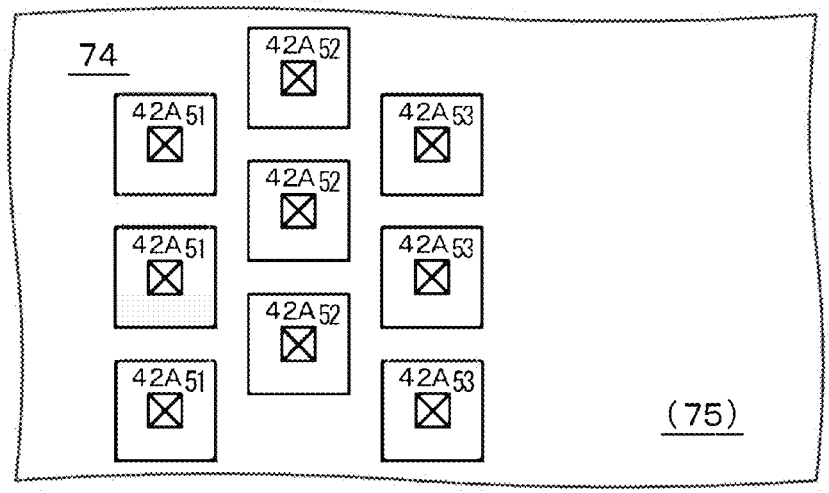
FIG. 30A and FIG. 30B are schematic, partial plan views of the memory cell unit array according to Example 2 as viewed along an arrow mark 30A and an arrow mark 30B of FIG. 27.
Figure 30B:
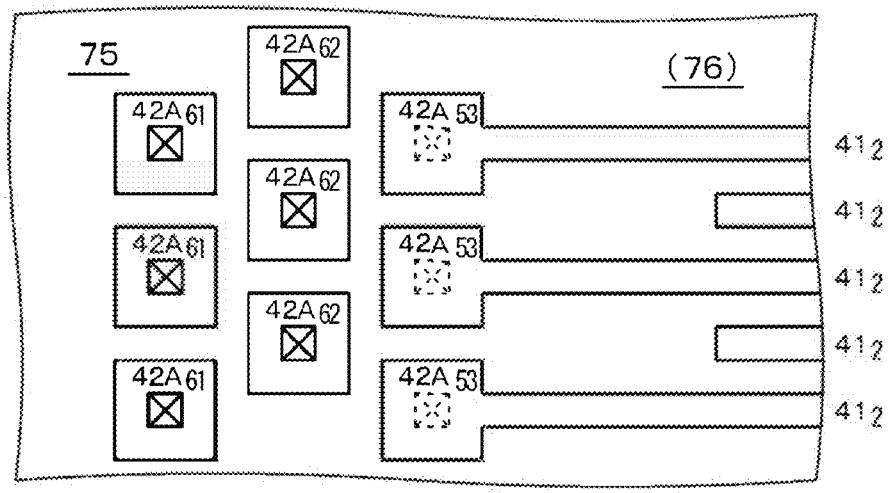

In addition, as shown in FIG. 29B, second contact holes $42A_{41}$, $42A_{42}$, $42A_{43}$ upwardly extend through the inter-layer insulating layer 74. As shown in FIG. 30A, second contact holes $42A_{51}$, $42A_{52}$, $42A_{53}$ extend upwardly from the second contact holes $42A_{41}$, $42A_{42}$, $42A_{43}$ through the inter-layer insulating layer 75. As shown in FIG. 30B, the second wires $41_2$ extend in the second direction from the second contact holes $42A_{53}$ on the inter-layer insulating layer 75.

Figure 31A:
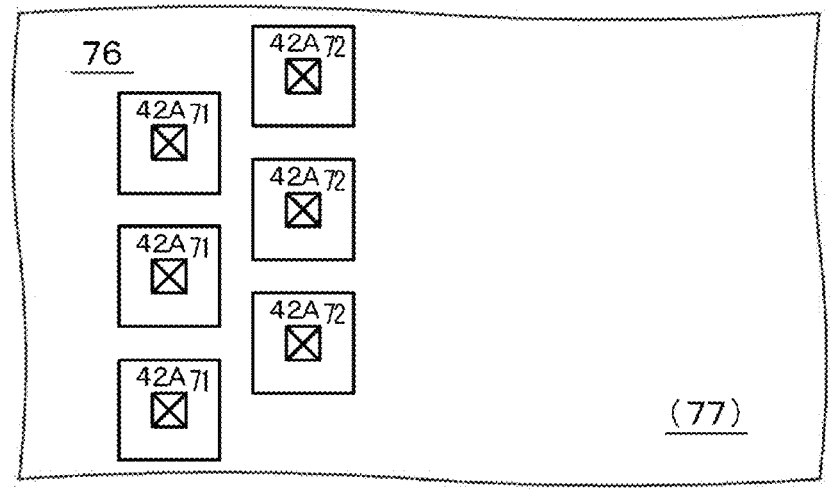
FIG. 31A and FIG. 31B are schematic, partial plan views of the memory cell unit array according to Example 2 as viewed along an arrow mark 31A and an arrow mark 31B of FIG. 27.
Figure 31B:
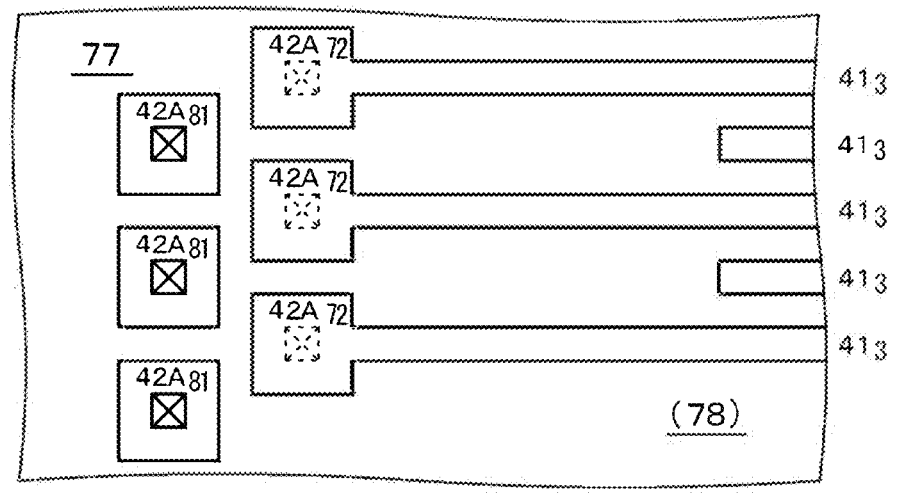

In addition, as shown in FIG. 30B, second contact holes $42A_{61}$, $42A_{62}$ upwardly extend through the inter-layer insulating layer 76. As shown in FIG. 31A, second contact holes $42A_{71}$, $42A_{72}$ extend upwardly from the second contact holes $42A_{61}$, $42A_{62}$ through the inter-layer insulating layer 77. As shown in FIG. 31B, the second wires $41_3$ extend in the second direction from the second contact holes $42A_{72}$ on the inter-layer insulating layer 77.

Figure 32A:
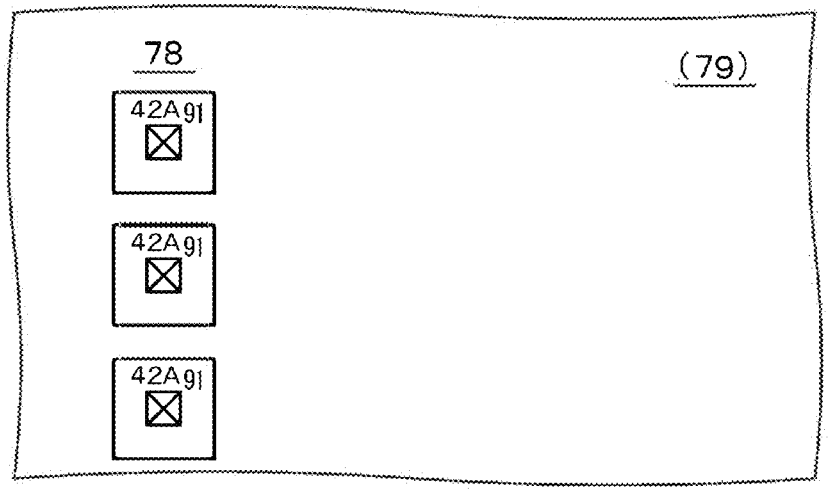
Figure 32B:
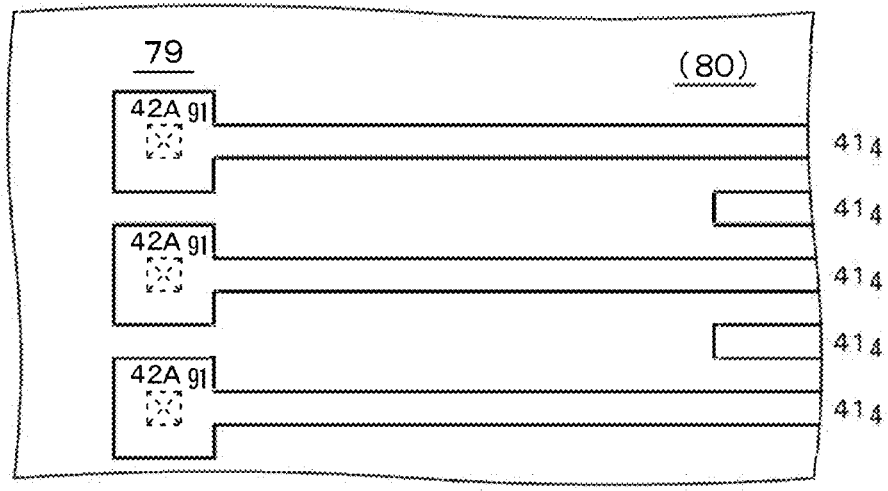

In addition, as shown in FIG. 31B, second contact holes $42A_{81}$ upwardly extend through the inter-layer insulating layer 78. As shown in FIG. 32A, second contact holes $42A_{91}$ extend upwardly from the second contact holes $42A_{81}$ through the inter-layer insulating layer 79. As shown in FIG. 32B, the second wires $41_4$ extend in the second direction from the second contact holes $42A_{91}$ on the inter-layer insulating layer 79.

Except for the above-mentioned points, configuration and structure of the memory cell unit array according to Example 2 can be similar to the configuration and structure of the memory cell unit array described in Example 1, and hence detailed descriptions thereof will be omitted.

Example 3

Figure 33:
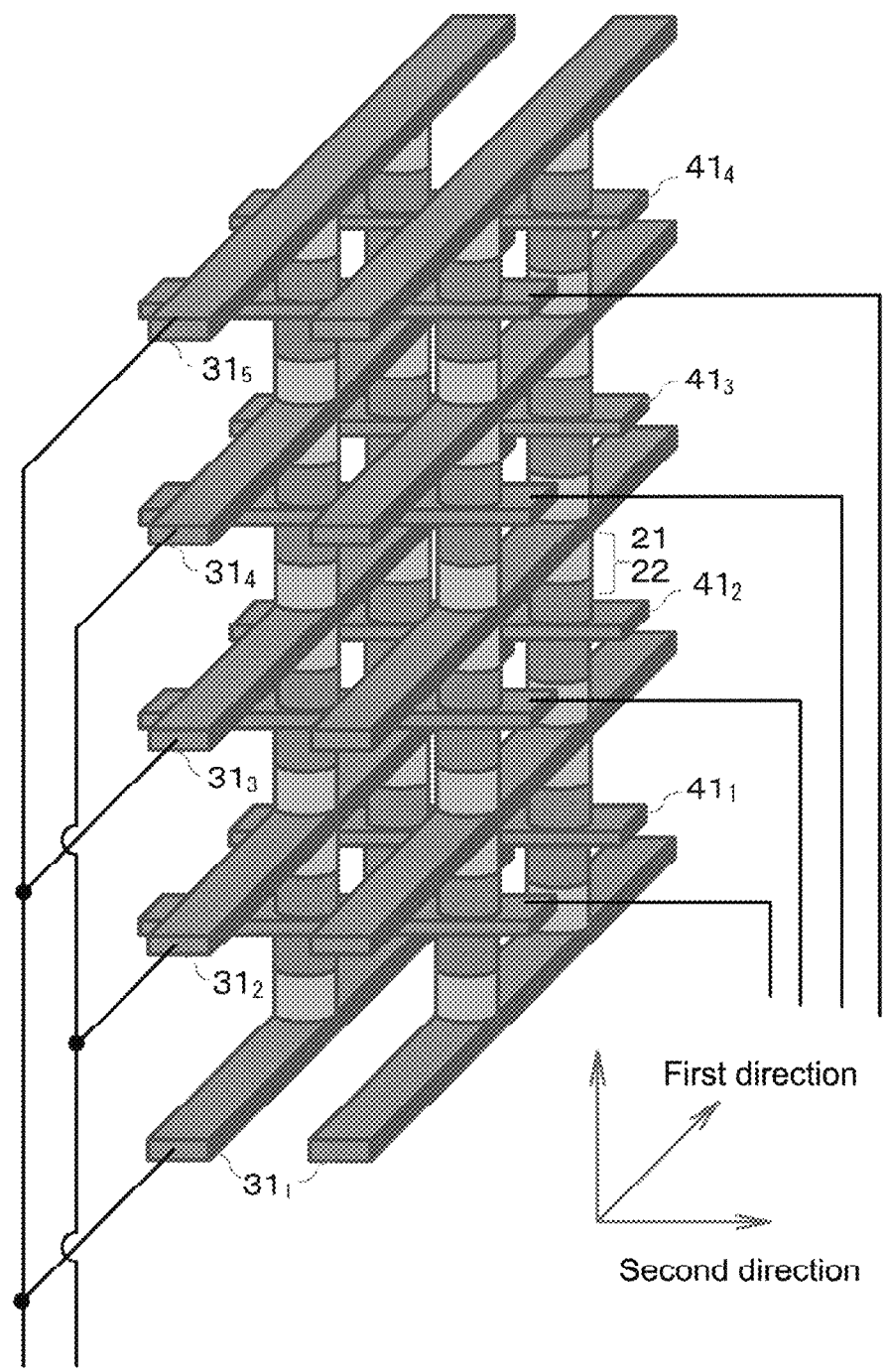
FIG. 33 is a perspective view schematically showing nonvolatile memory cells in Example 3.
Figure 34:
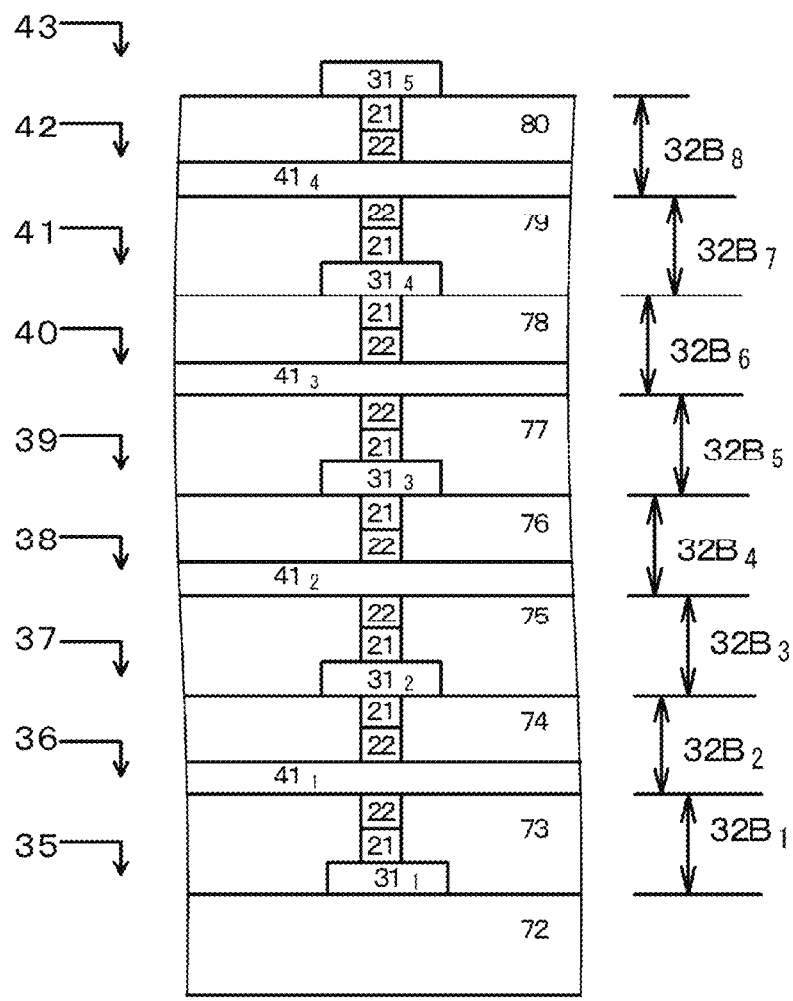
FIG. 34 is a conceptual, partial cross-sectional view for describing components of a memory cell unit array according to Example 3.

Example 3 is also a modification of Example 1. FIG. 33 shows a perspective view schematically showing nonvolatile memory cells in Example 3. FIG. 34 shows a conceptual, partial cross-sectional view for describing components of a memory cell unit array according to Example 3. Further, FIG. 35, FIG. 36, FIG. 37, FIG. 38, FIG. 39, FIG. 40, FIG. 41, FIG. 42, and FIG. 43 show schematic, partial plan views of the memory cell unit array according to Example 3 as it is viewed along an arrow mark 35, an arrow mark 36, an arrow mark 37, an arrow mark 38, an arrow mark 39, an arrow mark 40, an arrow mark 41, an arrow mark 42, and an arrow mark 43 of FIG. 34.

In the memory cell unit array according to Example 3, first wires 31 are formed in first wire layers that are (N/2+1) layers (where N is an even number equal to two or more). Second wires 41 are formed in a second wire layer that is (N/2) layer and a nonvolatile memory cell 20 is formed between each of the first wire layers and the second wire layer. Here, in Example 3, N=8 is set.

That is to say, first wires $31_1$, $31_2$, $31_3$, $31_4$, $31_5$ are formed in first wire layers that are five layers and second wires $41_1$, $41_2$, $41_3$, $41_4$ are formed in second wire layers that are four layers. The nonvolatile memory cell 20 is formed between the first wire layer and the second wire layer. The second wires $41_1$, $41_2$, $41_3$, $41_4$ are independently and separately driven. Further, the first wires $31_1$, $31_3$, $31_5$ are similarly driven at the same time. On the other hand, the first wires $31_2$, $31_4$ are similarly driven at the same time. The first wires $31_1$, $31_3$, $31_5$ and the first wires $31_2$, $31_4$ are separately driven. Note that the first wires $31_1$, $31_2$, $31_3$, $31_4$, $31_5$ may be separately driven.

Connection of the first wires $31_1$, $31_2$, $31_3$, $31_4$, $31_5$ to the first control circuits 50A, 50B is as follows. Note that, in the figures, the four first wires 31 are set as one group and will be shown as first wires $31_{n-1}$, $31_{n-2}$, $31_{n-3}$, $31_{n-4}$ (where n=1, 2, 3, 4) for the sake of convenience. Connection of the second wires $41_1$, $41_2$, $41_3$, $41_4$ to the second control circuits 60A, 60B can be similar to that described in Example 2.

Although not shown in the figures, the first contact holes 32B extend upwardly from, for example, the first(II) control circuit 50B through an inter-layer insulating layer and the first control wires extend toward an adjacent memory cell unit on the inter-layer insulating layer.

Figure 35:
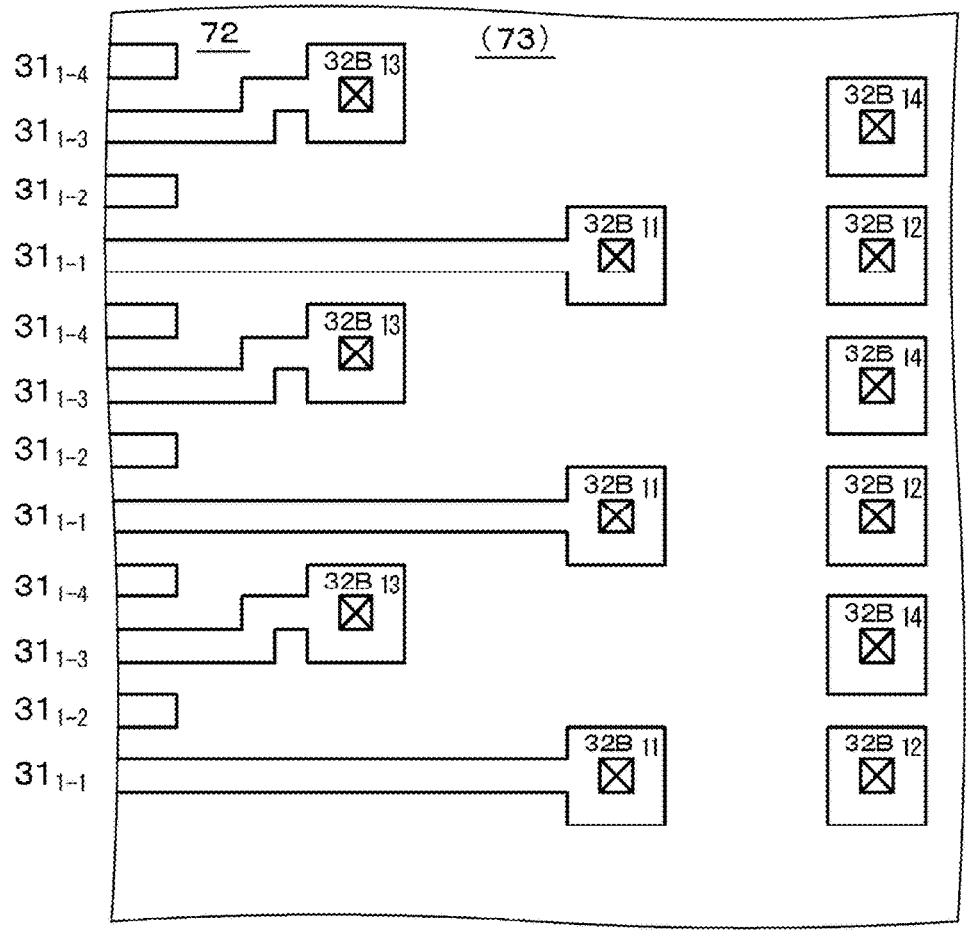
FIG. 35 is a schematic, partial plan view of the memory cell unit array according to Example 3 as viewed along an arrow mark 35 of FIG. 34.

As shown in FIG. 35, first contact holes $32B_{11}$, $32B_{12}$, $32B_{13}$, $32B_{14}$ extend upwardly from the first control wires (not shown) through an inter-layer insulating layer 72. In addition, first wires $31_{1-1}$, $31_{1-3}$ extend in the first direction from the first contact holes $32B_{11}$, $32B_{13}$ on the inter-layer insulating layer 72.

Figure 36:
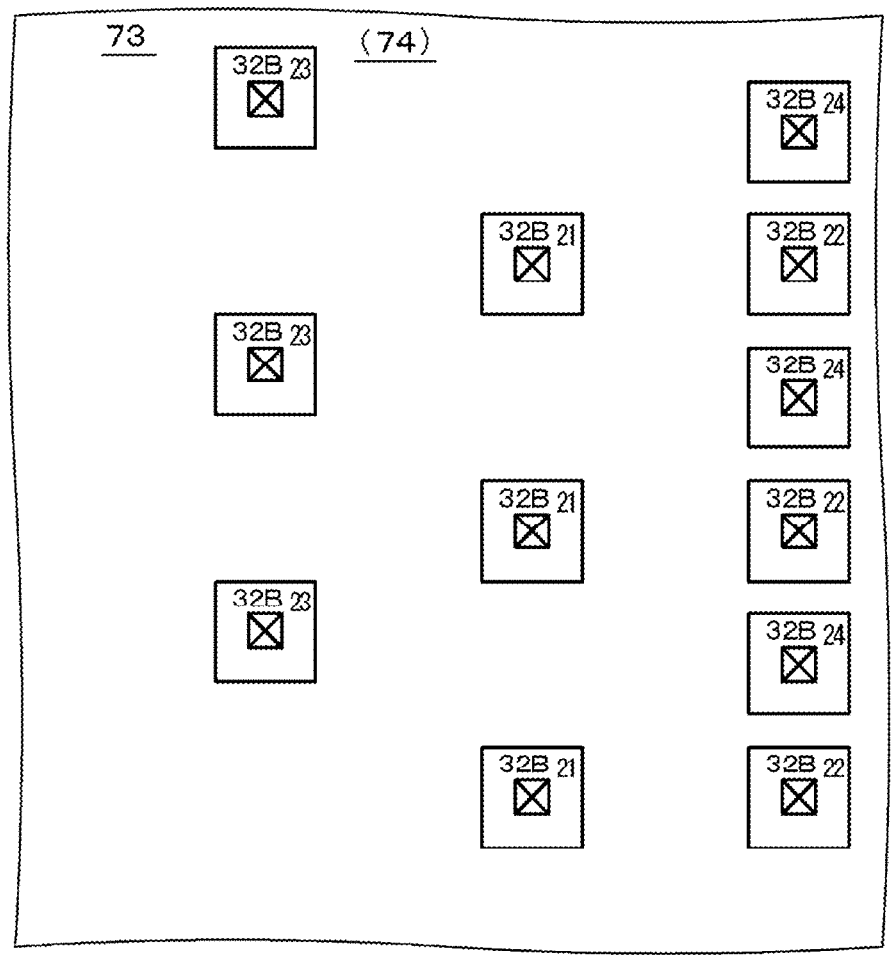
FIG. 36 is a schematic, partial plan views of the memory cell unit array according to Example 3 as viewed along an arrow mark 36 of FIG. 34.
Figure 37:
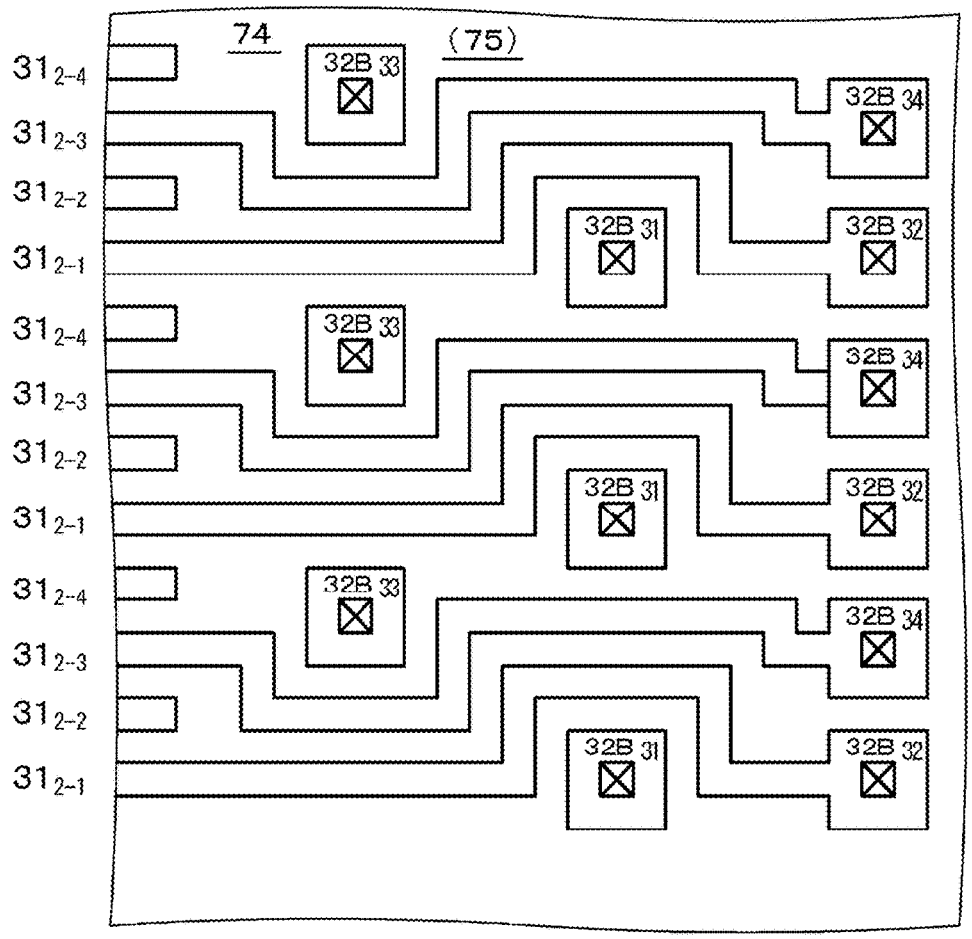
FIG. 37 is a schematic, partial plan view of the memory cell unit array according to Example 3 as viewed along an arrow mark 37 of FIG. 34.

In addition, as shown in FIG. 35, first contact holes $32B_{21}$, $32B_{22}$, $32B_{23}$, $32B_{24}$ extend upwardly from the first contact holes $32B_{11}$, $32B_{12}$, $32B_{13}$, $32B_{14}$ through an inter-layer insulating layer 73. As shown in FIG. 36, first contact holes $32B_{31}$, $32B_{32}$, $32B_{33}$, $32B_{34}$ extend upwardly from the first contact holes $32B_{21}$, $32B_{22}$, $32B_{23}$, $32B_{24}$ through an inter-layer insulating layer 74. As shown in FIG. 37, first wires $31_{2-1}$, $31_{2-3}$ extend in the first direction from the first contact holes $32B_{32}$, $32B_{34}$ on the inter-layer insulating layer 74.

Figure 38:
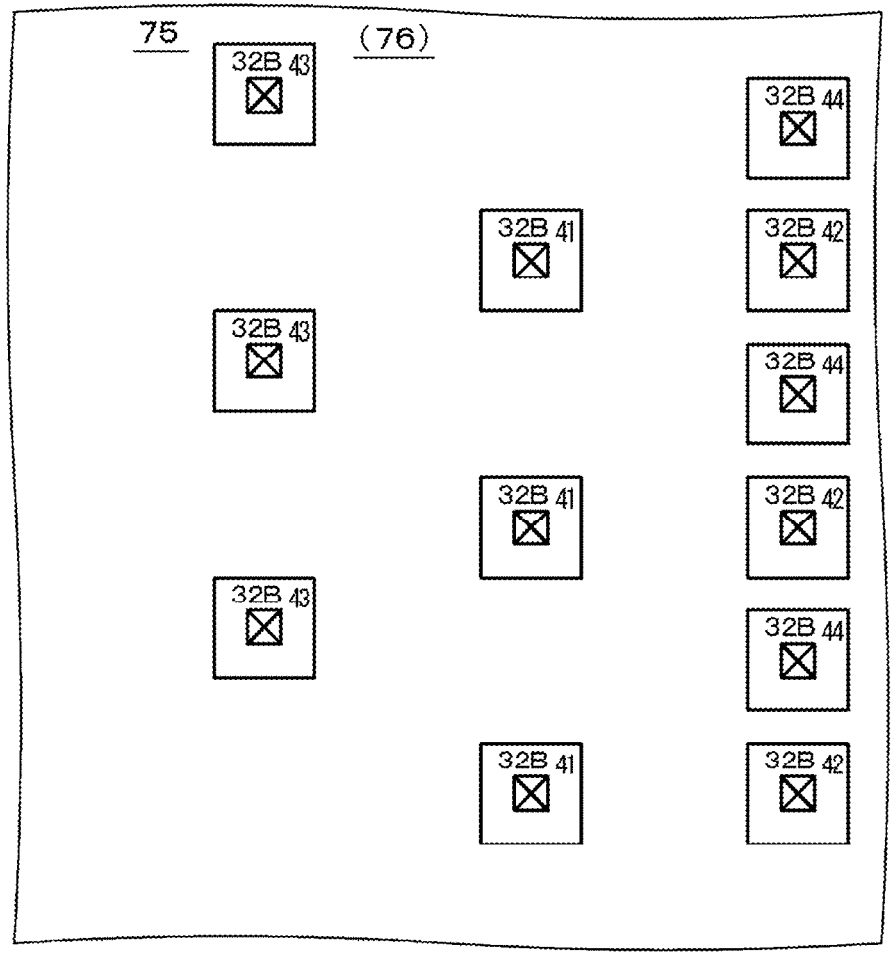
FIG. 38 is a schematic, partial plan views of the memory cell unit array according to Example 3 as viewed along an arrow mark 38 of FIG. 34.
Figure 39:
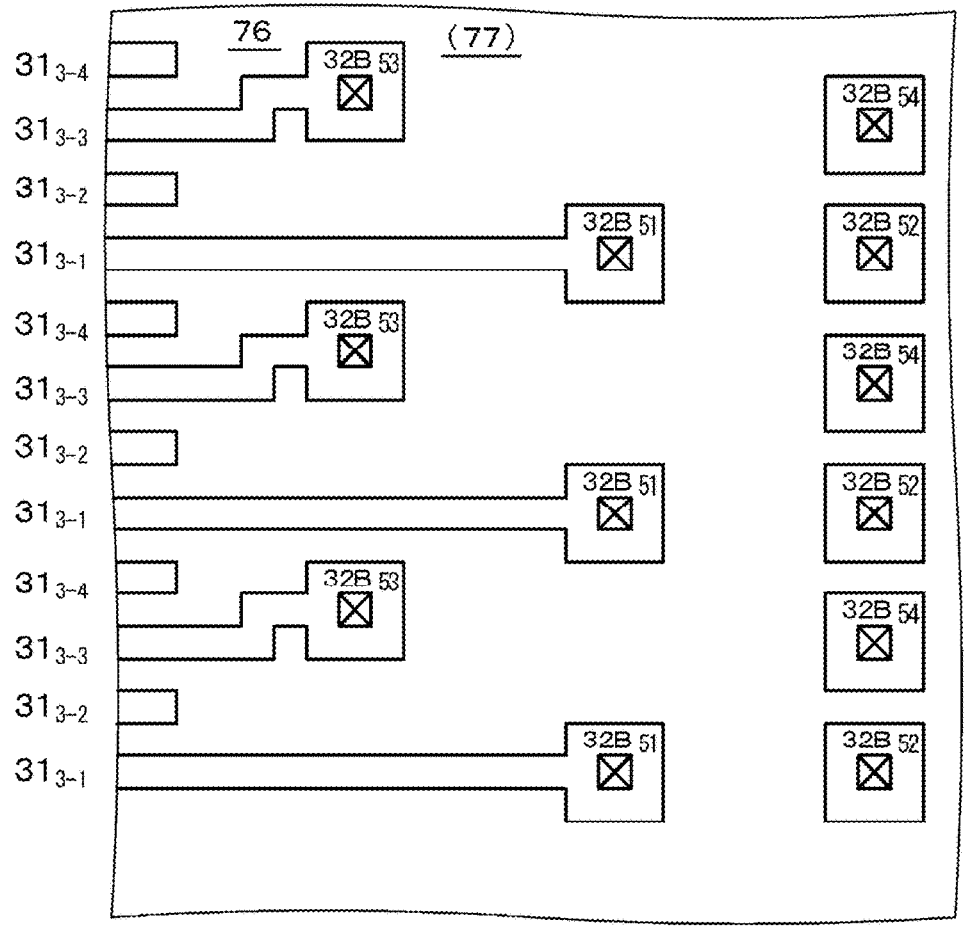
FIG. 39 is a schematic, partial plan view of the memory cell unit array according to Example 3 as viewed along an arrow mark 39 of FIG. 34.

In addition, as shown in FIG. 37, the first contact holes $32B_{31}$, $32B_{32}$, $32B_{33}$, $32B_{34}$ extend upwardly from the first contact holes $32B_{21}$, $32B_{22}$, $32B_{23}$, $32B_{24}$ through an inter-layer insulating layer 75. As shown in FIG. 38, first contact holes $32B_{41}$, $32B_{42}$, $32B_{43}$, $32B_{44}$ extend upwardly from the first contact holes $32B_{31}$, $32B_{32}$, $32B_{33}$, $32B_{34}$ through an inter-layer insulating layer 76. As shown in FIG. 39, first wires $31_3$-1, $31_3$-3 extend in the first direction from first contact holes $32B_{41}$, $32B_{43}$ on the inter-layer insulating layer 76.

Figure 40:
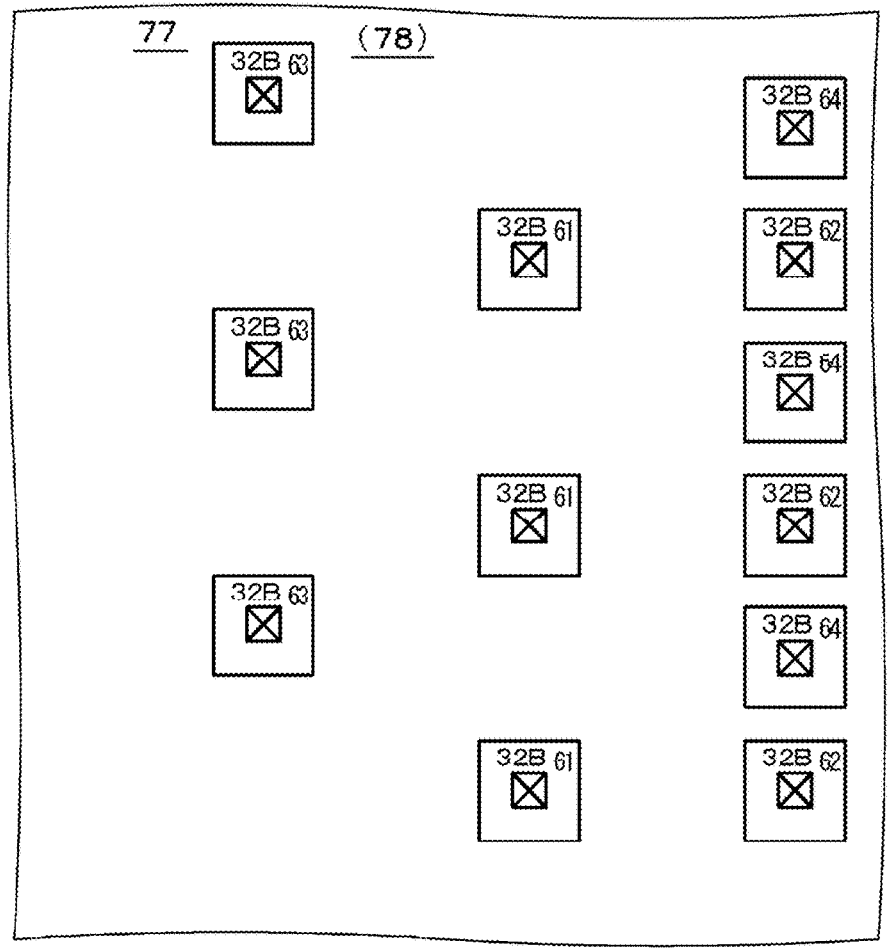
FIG. 40 is a schematic, partial plan view of the memory cell unit array according to Example 3 as viewed along an arrow mark 40 of FIG. 34.
Figure 41:
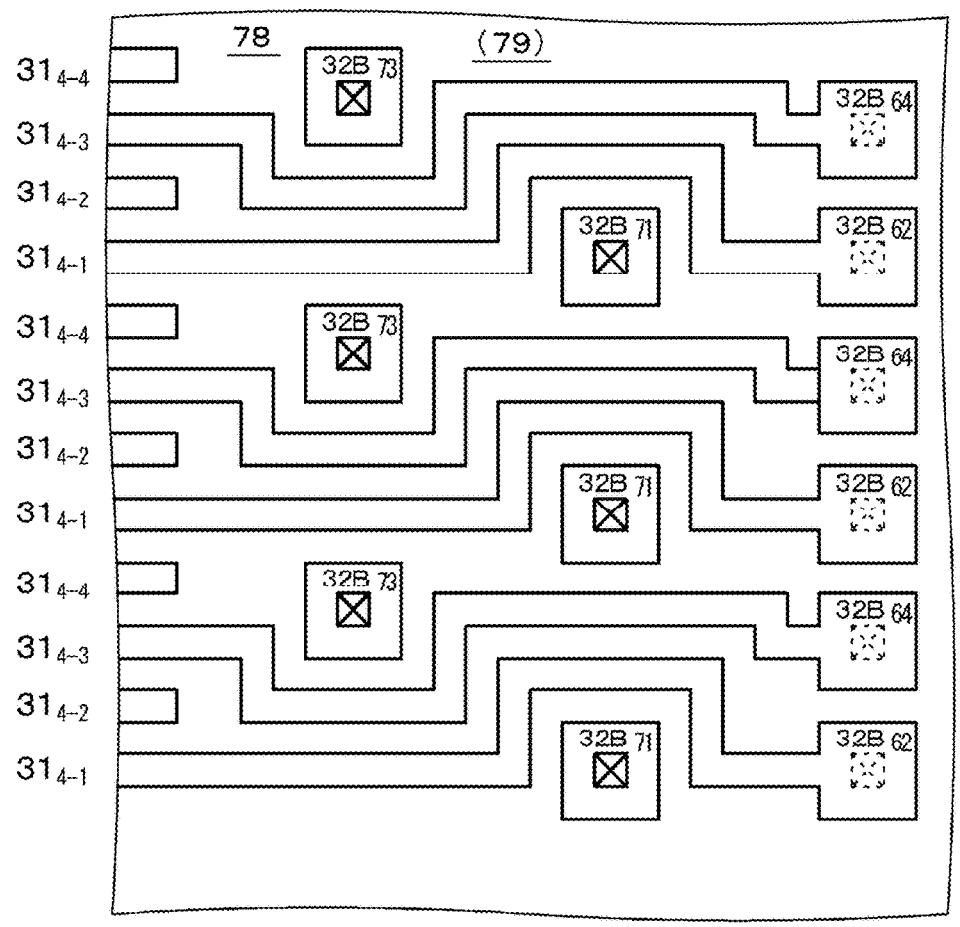
FIG. 41 is a schematic, partial plan view of the memory cell unit array according to Example 3 as viewed along an arrow mark 41 of FIG. 34.

In addition, as shown in FIG. 39, first contact holes $32B_{51}$, $32B_{52}$, $32B_{53}$, $32B_{54}$ extend upwardly from the first contact holes $32B_{41}$, $32B_{42}$, $32B_{43}$, $32B_{44}$ through an inter-layer insulating layer 77. As shown in FIG. 40, first contact holes $32B_{61}$, $32B_{62}$, $32B_{63}$, $32B_{64}$ extend upwardly from the first contact holes $32B_{51}$, $32B_{52}$, $32B_{53}$, $32B_{54}$ through an inter-layer insulating layer 78. As shown in FIG. 41, first wires $31_{4-1}$, $31_{4-3}$ extend in the first direction from first contact holes $32B_{62}$, $32B_{64}$ on the inter-layer insulating layer 78.

Figure 42:
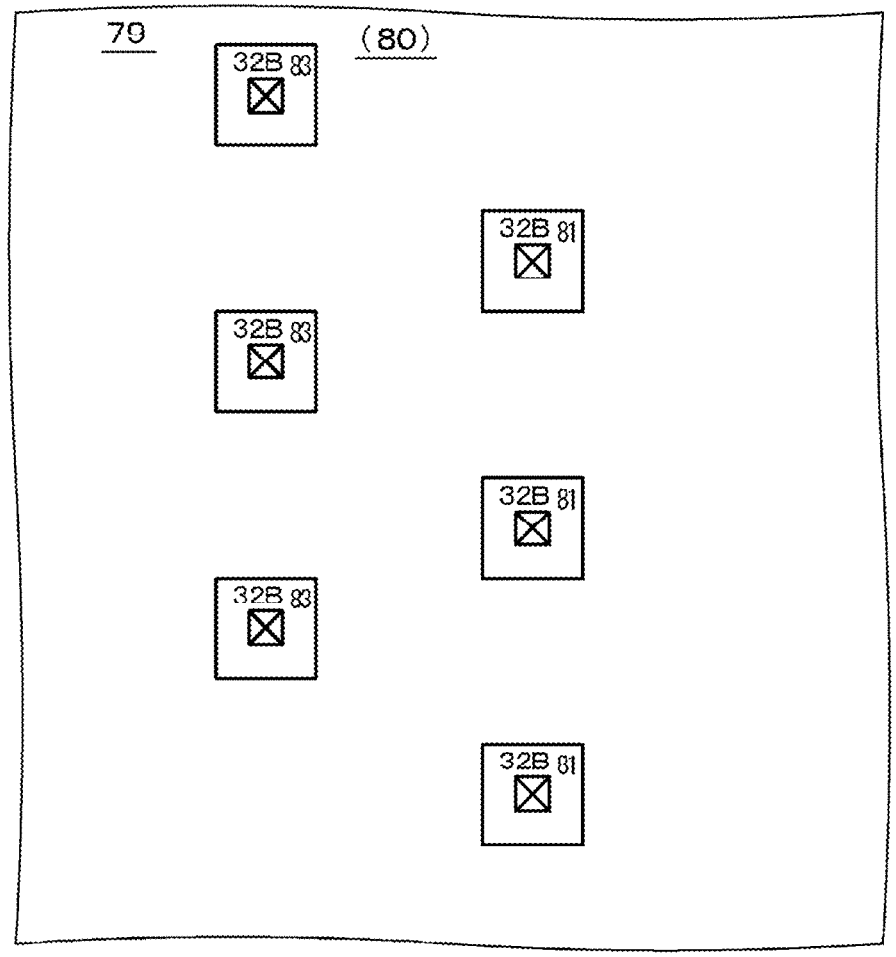
FIG. 42 is a schematic, partial plan view of the memory cell unit array according to Example 3 as viewed along an arrow mark 42 of FIG. 34.
Figure 43:
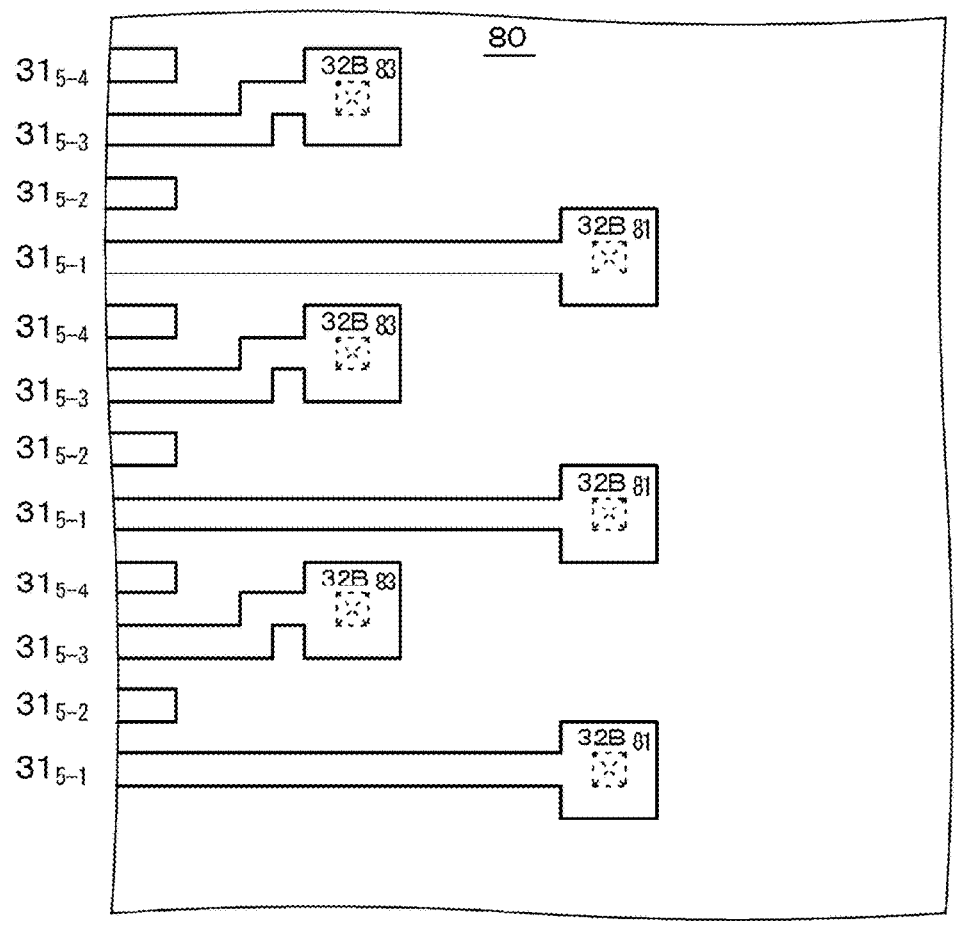
FIG. 43 is a schematic, partial plan view of the memory cell unit array according to Example 3 as viewed along an arrow mark 43 of FIG. 34.

In addition, as shown in FIG. 41, first contact holes $32B_{71}$, $32B_{73}$ extend upwardly from first contact holes $32B_{61}$, $32B_{63}$ through the inter-layer insulating layer 79. As shown in FIG. 42, first contact holes $32B_{81}$, $32B_{83}$ extend upwardly from the first contact holes $32B_{71}$, $32B_{73}$ through an inter-layer insulating layer 80. As shown in FIG. 43, first wires $31_{5-1}$, $31_{5-3}$ extend in the first direction from the first contact holes $32B_{81}$, $32B_{83}$ on the inter-layer insulating layer 80.

Except for the above-mentioned points, configuration and structure of the memory cell unit array according to Example 3 can be similar to the configuration and structure of the memory cell unit array described in Example 1, and hence detailed descriptions thereof will be omitted.

Example 4

Figure 44:
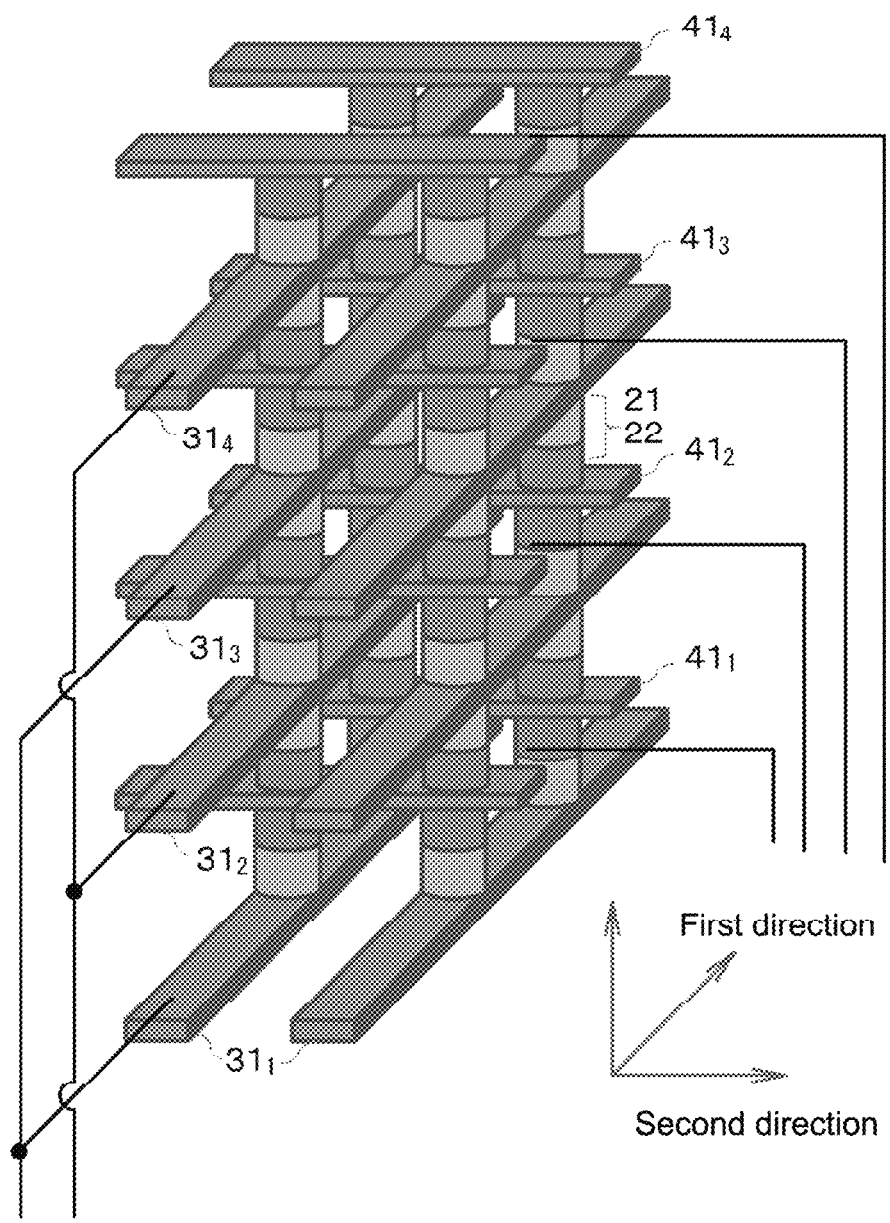
FIG. 44 is a perspective view schematically showing nonvolatile memory cells in Example 4.

Example 4 is also a modification of Example 1. A perspective view of FIG. 44 schematically shows nonvolatile memory cells in Example 4. In Example 4, first wires 31 are formed in first wire layers that are {(N+1)/2} layers (where N is an odd number equal to three or more), second wires 41 are formed in second wire layers that are {(N+1)/2} layers, and a nonvolatile memory cell is formed between the first wire layer and the second wire layer. Here, in Example 4, N=7 is set.

That is to say, the first wires 31 are formed in first wire layers that are four layers and the second wires 41 are formed second wire layers that are four layers. A total of seven nonvolatile memory cells 20 are formed between the first wire layers and the second wire layers in the upper and lower directions. The second wires are independently and separately driven. Further, odd-numbered first wires in the upper and lower directions are similarly driven at the same time while even-numbered first wires in the upper and lower directions are similarly driven at the same time. That is to say, the odd-numbered first wires in the upper and lower directions and the even-numbered first wires in the upper and lower directions are separately driven. All the odd- and even-numbered first wires in the upper and lower directions may be separately driven.

Connection of the first wires 31 to first control circuits 50A, 50B and connection of the second wires 41 to second control circuits 60A, 60B can be similar to those described in Example 2 or Example 3. Except for the above-mentioned points, configuration and structure of a memory cell unit array according to Example 4 can be similar to the configuration and structure of the memory cell unit array described in Example 1, and hence detailed descriptions thereof will be omitted.

Example 5

Figure 45:
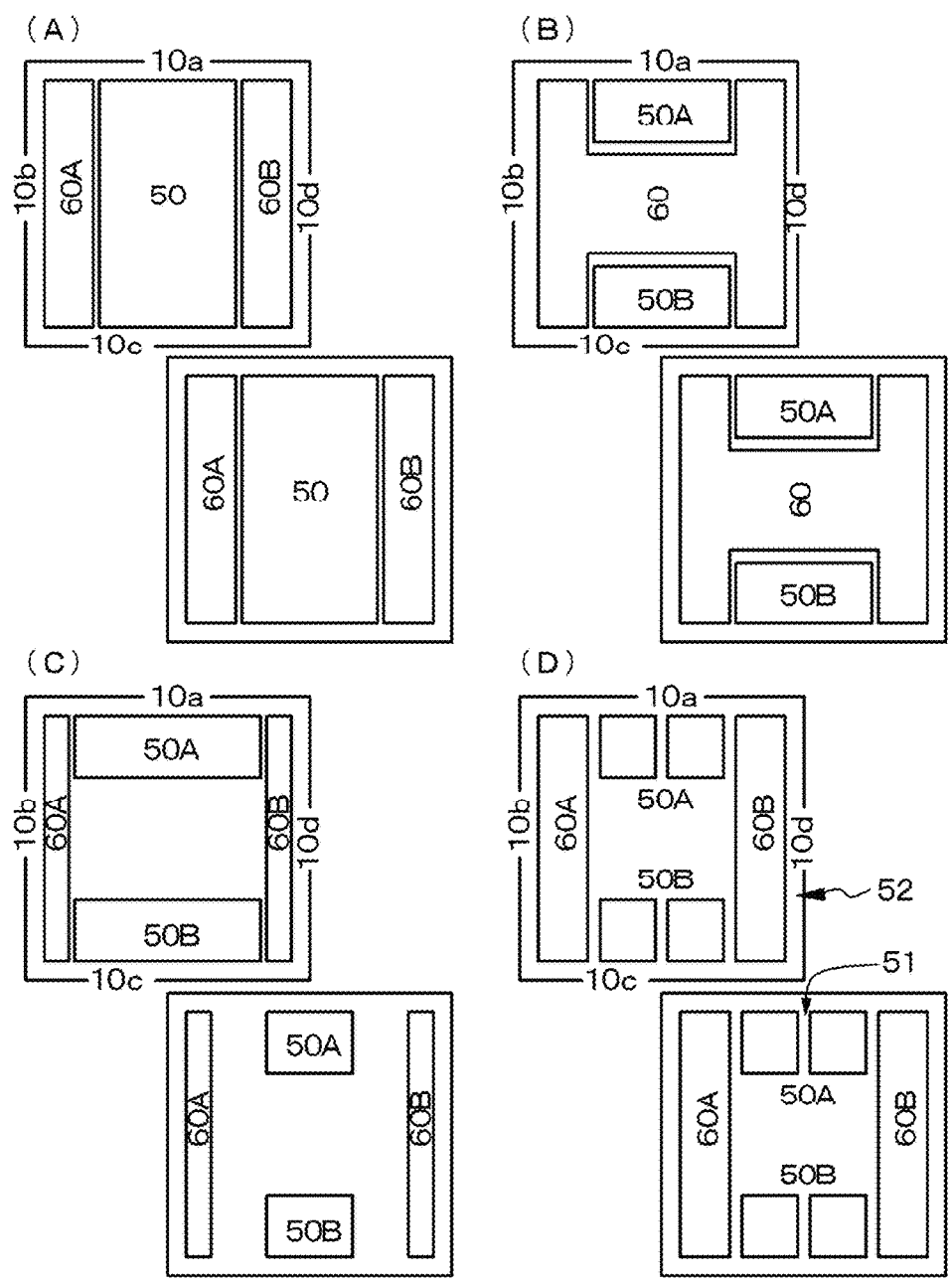
FIG. 45 is a diagram describing modified examples of an arrangement of memory cell units of Example 5.
Figure 46:
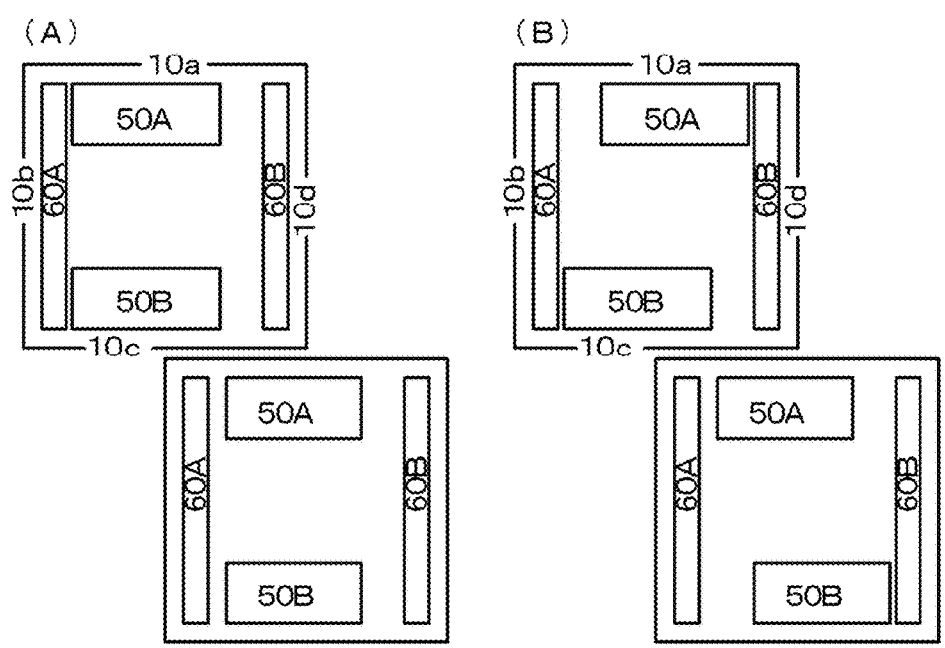
FIG. 46 is a diagram describing modified examples of the arrangement of the memory cell units of Example 5.

Example 5 is a modification of Example 1 to Example 4. Example 5 is a modification relating to planar shape and arrangement of the first control circuit and the second control circuit. In FIG. 45 and FIG. 46, two memory cell units arranged in the first direction are shown in each of examples of memory cell units. Further, in FIG. 47 and FIG. 48, a number of memory cell units arranged in the first direction and the second direction are shown.

In an example of a memory cell unit array shown in (A) of FIG. 45, a second control circuit is constituted of two circuits, a second(I) control circuit 60A and a second(II) control circuit 60B.

The second(I) control circuit 60A is disposed along a second side 10b of the control circuit, which extends in parallel to the first direction.

The second(II) control circuit 60B extends in parallel to the first direction and is disposed along a fourth side 10d of the control circuit, which is opposed to the second side 10b.

A first control circuit 50 is disposed to extend from a first side 10a of the control circuit, which extends in parallel to the second direction, to a third side 10c of the control circuit, which is opposed to the first side 10a.

In an example of a memory cell unit array shown in (B) of FIG. 45, a first control circuit is constituted of two circuits, a first(I) control circuit 50A and a first( ) control circuit 50B.

A second control circuit 60 is disposed to extend from a second side 10b of the control circuit, which extends in parallel to the first direction, to a fourth side 10d of the control circuit, which is opposed to the second side 10b.

The first( ) control circuit 50A is disposed along the first side 10a of the control circuit, which extends in parallel to the second direction.

The first(II) control circuit 50B extends in parallel to the first direction and is disposed along a third side 10c of the control circuit, which is opposed to the first side 10a.

Alternatively, in an example of a memory cell unit array shown in (C) of FIG. 45, a length of a first control circuit along the second direction in a certain memory cell unit and a length of a first control circuit along the second direction in a memory cell unit adjacent to this memory cell unit are different from each other. In an example of a memory cell unit array shown in (D) of FIG. 45, each of the first(I) control circuit and the first(II) control circuit is divided into two parts. Division regions 51 and a region 52 between the memory cell unit and the memory cell unit are continuous with each other in the first direction. Such an arrangement makes it easy to dispose a power supply line and various signal lines, for example. In the examples shown in (A), (B), (C), and (D) of FIG. 45, a region occupied by the first(I) control circuit 50A and a region occupied by the first(II) control circuit 50B are arranged in point symmetry with respect to a center of the control circuit, a region occupied by the second(I) control circuit 60A and a region occupied by the second(II) control circuit 60B are arranged in point symmetry with respect to the center of the control circuit. At the same time, the region occupied by the first(I) control circuit 50A and the region occupied by the first(II) control circuit 50B are arranged in line symmetry with respect to an axis parallel to the second direction, the axis passing through the center of the control circuit. Further, the region occupied by the second(I) control circuit 60A and the region occupied by the second(II) control circuit 60B are arranged in line symmetry with respect to an axis parallel to the first direction, the axis passing through the center of the control circuit.

In an example of a memory cell unit array shown in (A) of FIG. 46, a region occupied by a first(I) control circuit 50A and a region occupied by a first(II) control circuit 50B are arranged in line symmetry with respect to an axis parallel to the second direction, the axis passing through a center of a control circuit. A region occupied by a second(I) control circuit 60A and a region occupied by a second(II) control circuit 60B are arranged in line symmetry with respect to an axis parallel to the first direction, the axis passing through the center of the control circuit. Further, in an example of a memory cell unit array shown in (B) of FIG. 46, a region occupied by a first(I) control circuit 50A and a region occupied by a first(II) control circuit 50B are arranged in point symmetry with respect to a center of a control circuit and a region occupied by a second(I) control circuit 60A and a region occupied by a second(II) control circuit 60B are arranged in point symmetry with respect to the center of the control circuit.

Figure 47:
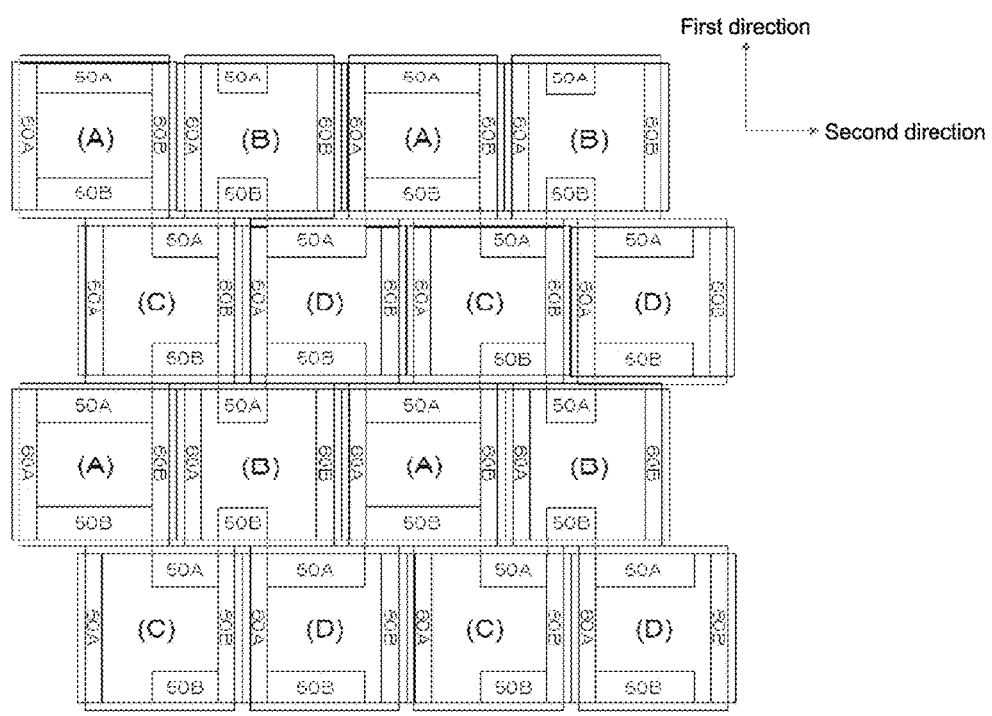
FIG. 47 is a diagram describing a modified example of the arrangement of the memory cell units of Example 5.
Figure 48:
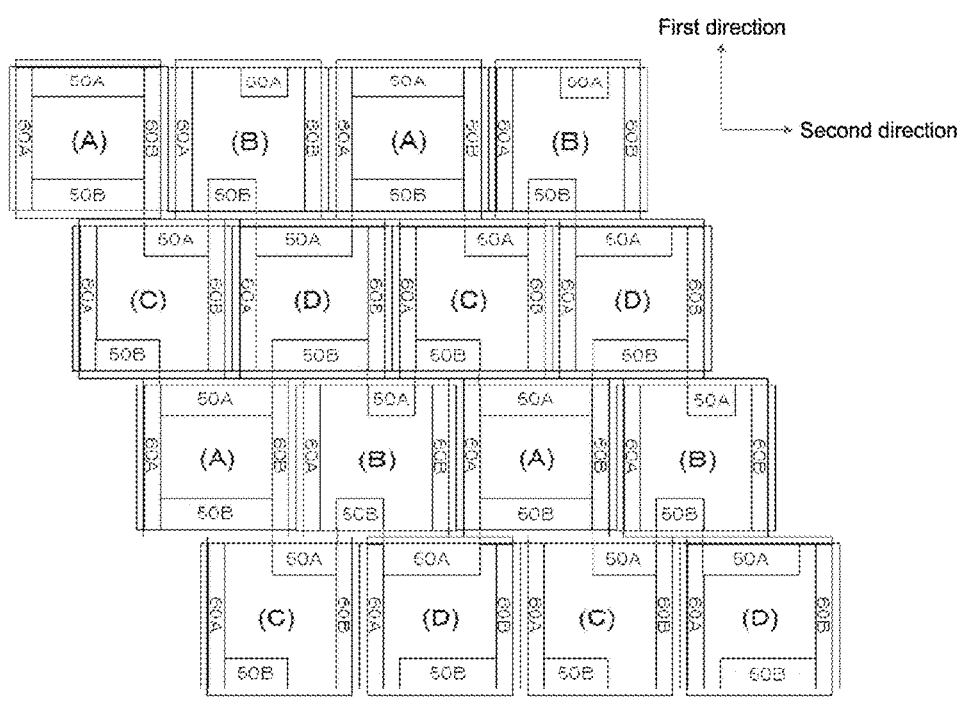
FIG. 48 is a diagram describing a modified example of the arrangement of the memory cell units of Example 5.
Figure 49:
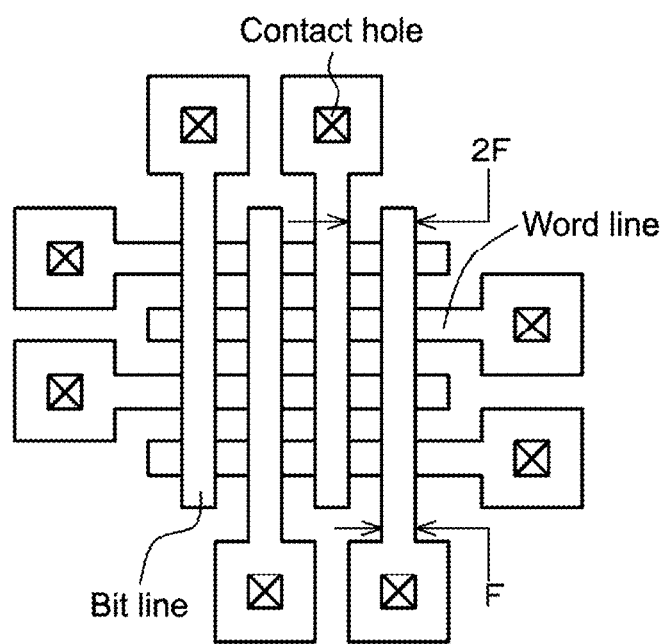
FIG. 49 is a view schematically showing of an arrangement of a bit line, a word line, a contact hole in a conventional cross-point memory cell unit.
Figure 50A:
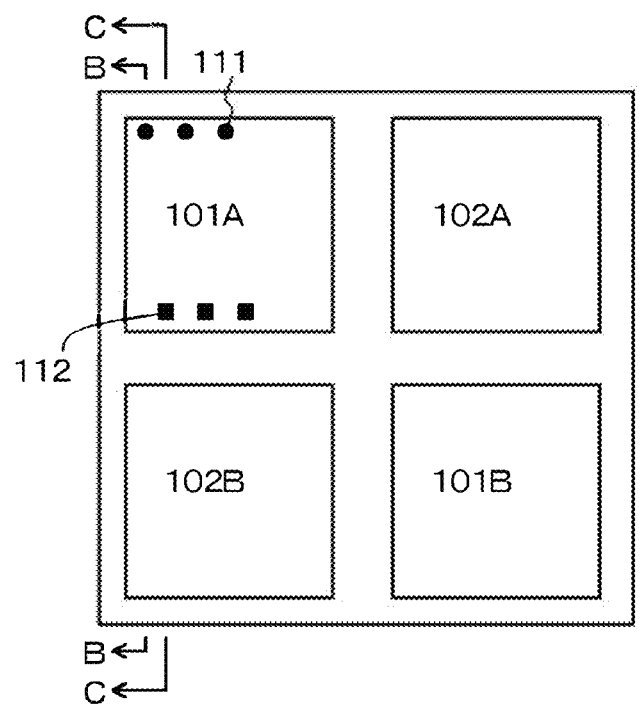
FIG. 50A and FIG. 50B are views schematically showing an arrangement of control circuits, contact holes, and the like in a cross-point memory cell unit as disclosed in Japanese Patent Application Laid-open No. 2009-223971.
Figure 50B:
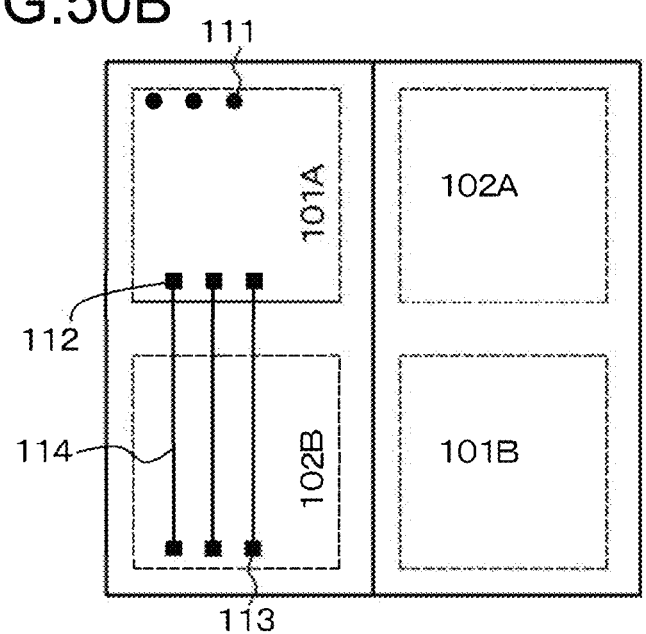
Figure 51A:
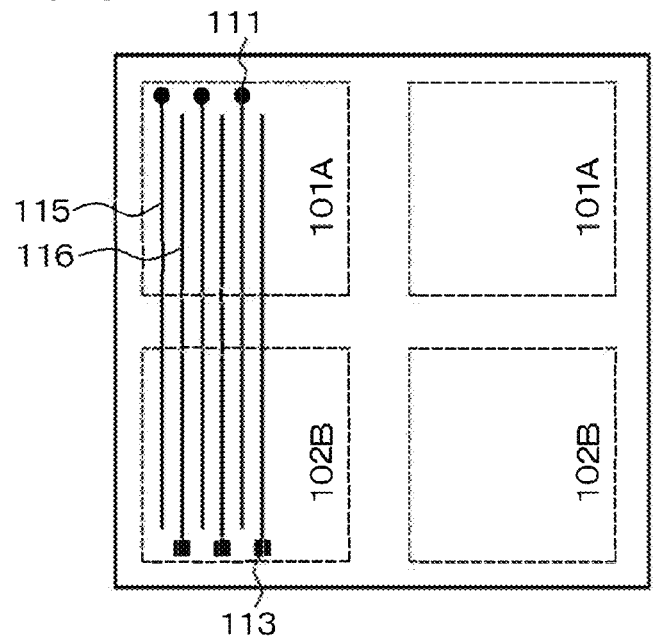
FIG. 51A is a view schematically showing an arrangement of first wires (bit lines) in the cross-point memory cell unit as disclosed in Japanese Patent Application Laid-open No. 2009-223971 shown in FIG. 50A and FIG. 50B, and FIG. 51B and FIG. 51C are schematic, partial cross-sectional views taken along an arrow mark B-B and an arrow mark C-C of FIG. 50A.
Figure 51B:
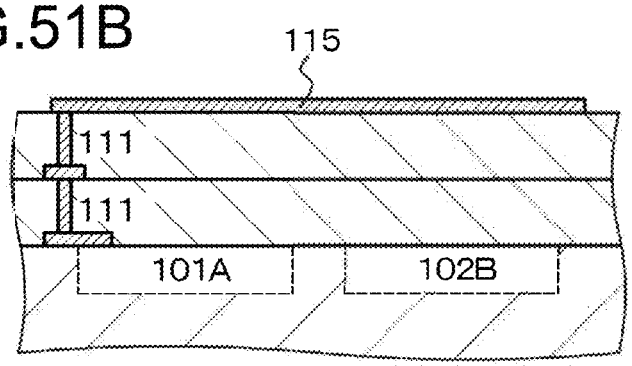
Figure 51C:
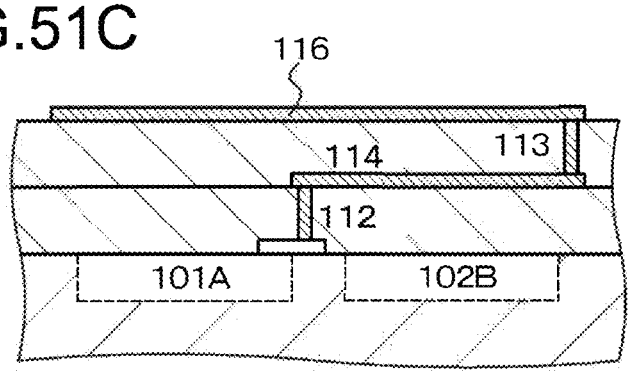

In examples of memory cell unit arrays shown in FIG. 47 and FIG. 48, the planar shapes and the arrangement positions of first(I) control circuits 50A and first(II) control circuits 50B are different among memory cell units A, memory cell units B, memory cell units C, and memory cell units D.

It should be noted that, also with the above-mentioned memory cell unit array according to Example 5, when a first contact hole in one of the memory cell units and a first contact hole in a memory cell unit adjacent to this memory cell unit in the first direction are projected in the virtual perpendicular plane parallel to the second direction, positions of projection images of the first contact holes are positioned at equal intervals along the second direction. Note that, in the examples shown in (D) of FIG. 45, in first contact holes in one of the memory cell units 10, some first contact holes are not positioned at equal intervals along the second direction.

The memory cell unit array according to the present disclosure has been described above on the basis of the favorable Examples. However, the memory cell unit array according to the present disclosure is not limited to those Examples. The arrangements of the first control circuits and the second control circuits, the configurations and structures of the memory cell unit arrays, which have been described in those Examples, are examples. The configurations and structures of the nonvolatile memory cells are also examples. They can be appropriately changed. Further, the planar shapes of the first control circuits and the second control circuits, the planar shapes and wirings of the first wires and the second wires, the first control wires, and the second control wires, and the like are examples. They can be appropriately changed. In addition, even if, in the structure of the memory cell unit array, the positions of the first wires and the second wires are exchanged with each other, i.e., the first wires are replaced by the second wires, an equivalent memory cell unit array can be obtained.

Note that the present disclosure may also take the following configurations.

[A01] <<Memory Cell Unit Array>>

A memory cell unit array, including memory cell units arranged in a two-dimensional matrix form in a first direction and a second direction, the memory cell units being each constituted of a plurality of first wires extending in the first direction, a plurality of second wires that are disposed separately
     from the first wires in upper and lower directions and
     extend in the second direction unlike the first wires, and a nonvolatile memory cell that is disposed in a region in
     which the first wires and the second wires overlap one
     another and connected to the first wires and the second
     wires, in which each of the memory cell units includes, below the memory cell unit, a control circuit that controls an operation of the memory cell unit, the control circuit is constituted of a first control circuit that controls an operation of the
     nonvolatile memory cell that constitutes the memory
     cell unit via the first wires, and a second control circuit that controls an operation of the nonvolatile memory cell that constitutes the memory cell unit via the second wires, the second wires that constitute the memory cell unit are connected to the second control circuit that constitutes the memory cell unit, some of the first wires that constitute the memory cell unit are connected to the first control circuit that constitutes the memory cell unit, and others of the first wires that constitute the memory cell unit are connected to a first control circuit that constitutes an adjacent memory cell unit adjacent thereto in the first direction.

[A02] The memory cell unit array according to [A01], in which in each of the memory cell units, the first wires connected to the first control circuit that constitutes the memory cell unit and the first wires connected to the first control circuit that constitutes the adjacent memory cell unit are alternately disposed.

[A03] The memory cell unit array according to [A01] or [A02], in which the control circuit is covered with an inter-layer insulating layer, the first control circuit and the first wires are connected to one another via a first contact hole formed in the inter-layer insulating layer, and the second control circuit and the second wires are connected to one another via a second contact hole formed in the inter-layer insulating layer.

[A04] The memory cell unit array according to [A03], in which the control circuit is covered with an inter-layer insulating layer, the first control circuit and the first wires are connected to one another via a first control wire and a first contact hole formed in the inter-layer insulating layer, the second control circuit and the second wires are connected to one another via a second control wire and a second contact hole formed in the inter-layer insulating layer, the first control circuit and the second control wire do not overlap each other in the upper and lower directions, and the second control circuit and the first control wire do not overlap each other in the upper and lower directions.

[A05] The memory cell unit according to [A03] or [A04], in which when the first contact hole in one of the memory cell units and the first contact hole in the memory cell unit adjacent to the one memory cell unit in the first direction are projected in a virtual perpendicular plane parallel to the second direction, positions of projection images of the first contact holes are positioned at equal intervals along the second direction.

[A06] The memory cell unit array according to any one of [A01] to [A05], in which the second wires are, at end portions thereof, connected to the second control circuit.

[A07] The memory cell unit array according to any one of [A01] to [A06], in which the memory cell units are arranged in-line along the second direction and arranged offset from each other along the first direction.

[A08] The memory cell unit array according to [A07], in which the memory cell units are arranged in-line along the second direction and arranged offset from each other along the first direction by ½ of a length of the memory cell unit along the second direction.

[A09] The memory cell unit array according to [A08], in which half of the first wires that constitute the memory cell unit are connected to the first control circuit that constitutes the memory cell unit, and the other half of the first wires that constitute the memory cell unit are connected to the first control circuit that constitutes the adjacent memory cell unit adjacent thereto in the first direction.

[A10] The memory cell unit array according to any one of [A01] to [A06], in which the memory cell units are arranged in a stretcher bond pattern of brick patterns.

[A11] The memory cell unit array according to [A10], in which half of the first wires that constitute the memory cell unit are connected to the first control circuit that constitutes the memory cell unit, and the other half of the first wires that constitute the memory cell unit are connected to the first control circuit that constitutes the adjacent memory cell unit adjacent thereto in the first direction.

[A12] The memory cell unit array according to any one of [A01] to [A11], in which the first control circuit is constituted of two circuits, a first(I) control circuit and a first(II) control circuit, the second control circuit is constituted of two circuits, a second(I) control circuit and a second(II) control circuit, the first(I) control circuit is disposed along a first side of the control circuit, which extends in parallel to the second direction, the first(II) control circuit extends in parallel to the second direction and is disposed along a third side of the control circuit, which is opposed to the first side, the second(I) control circuit is disposed along a second side of the control circuit, which extends in parallel to the first direction, and the second(II) control circuit extends in parallel to the first direction and is disposed along a fourth side of the control circuit, which is opposed to the second side.

[A13] The memory cell unit array according to [A12], in which the second(I) control circuit is disposed to occupy the entire second side and occupy a part of the first side and a part of the third side, the second(II) control circuit is disposed to occupy the entire fourth side and occupy a part of the first side and a part of the third side, the first(I) control circuit is disposed to occupy a part of the first side, and the first(II) control circuit is disposed to occupy a part of the third side.

[A14] The memory cell unit array according to any one of [A01] to [A11], in which the second control circuit is constituted of two circuits, a second(I) control circuit and a second(II) control circuit, the second(I) control circuit is disposed along a second side of the control circuit, which extends in parallel to the first direction, the second(II) control circuit extends in parallel to the first direction and is disposed along a fourth side of the control circuit, which is opposed to the second side, and the first control circuit is disposed to extend from the first side of the control circuit, which extends in parallel to the second direction, to the third side of the control circuit, which is opposed to the first side.

[A15] The memory cell unit array according to any one of [A01] to [A11], in which the first control circuit is constituted of two circuits, a first(I) control circuit and a first(II) control circuit, the second control circuit is disposed to extend from a second side of the control circuit, which extends in parallel to the first direction, to a fourth side of the control circuit, which is opposed to the second side, the first(I) control circuit is disposed along a first side of the control circuit, which extends in parallel to the second direction, and the first(II) control circuit extends in parallel to the first direction and is disposed along a third side of the control circuit, which is opposed to the first side.

[A16] The memory cell unit array according to any one of [A12], [A13], and [A15], in which a region occupied by the first(I) control circuit and a region occupied by the first(II) control circuit are arranged in point symmetry with respect to a center of the control circuit.

[A17] The memory cell unit array according to any one of [A12], [A13], [A15], and [A16], in which a region occupied by the first(I) control circuit and a region occupied by the first(II) control circuit are arranged in line symmetry with respect to an axis parallel to the second direction, the axis passing through a center of the control circuit.

[A18] The memory cell unit array according to any one of [A12] to [A14], in which a region occupied by the second(I) control circuit and a region occupied by the second(II) control circuit are arranged in point symmetry with respect to a center of the control circuit.

[A19] The memory cell unit array according to any one of [A12] to [A14] and [A18], in which a region occupied by the second(I) control circuit and a region occupied by the second(II) control circuit are arranged in line symmetry with respect to an axis parallel to the first direction, the axis passing through a center of the control circuit.

[A20] The memory cell unit array according to any one of [A01] to [A19], in which a ratio of (a length of the first control circuit along the second direction)/(an entire length of the control circuit along the second direction) is ⅓ to ⅔.

[A21] The memory cell unit array according to [A20], in which a ratio of (a length of the first control circuit along the second direction)/(an entire length of the control circuit along the second direction) is ½.

[A22] The memory cell unit array according to any one of [A01] to [A21], in which assuming that a length of a first control circuit along the second direction in one of the memory cell units is $L_1$, a length of a first control circuit along the second direction in an adjacent memory cell unit adjacent to the one memory cell unit is $L_1'$, and an entire length of the control circuit along the second direction is $L_0$, $L_0=L_1+L_1'$ is satisfied.

[A23] The memory cell unit array according to any one of [A01] to [A22], in which the nonvolatile memory cell is multi-layered having N layers (where N≥2).

[A24] The memory cell unit array according to [A23], in which the first wires are formed in first wire layers that are N layers, the second wires are formed in second wire layers that are N layers, and the nonvolatile memory cell is formed between the first wire layer and the second wire layer.

[A25] The memory cell unit array according to [A23], in which the first wires are formed in first wire layers that are (N/2+1) layers (where N is an even number equal to two or more), the second wires are formed in a second wire layer that is (N/2) layer, and the nonvolatile memory cell is formed between the first wire layer and the second wire layer.

[A26] The memory cell unit array according to [A23], in which the first wires are formed in a first wire layer that is (N/2) layer (where N is an even number equal to two or more), the second wires are formed in second wire layers that are (N/2+1) layers, and the nonvolatile memory cell is formed between the first wire layer and the second wire layer.

[A27] The memory cell unit array according to [A23], in which the first wires are formed in first wire layers that are {(N+1)/2} layers (where N is an odd number equal to three or more), the second wires are formed in second wire layers that are {(N+1)/2} layers, and the nonvolatile memory cell is formed between the first wire layer and the second wire layer.

[A28] The memory cell unit array according to any one of [A01] to [A27], in which the nonvolatile memory cell includes a nonvolatile memory device and a selection device, and the nonvolatile memory device includes a phase-change nonvolatile memory device.

REFERENCE SIGNS LIST

10 . . . memory cell unit, 10a . . . first side of control circuit, 10b . . . second side of control circuit, 10c . . . third side of control circuit, 10d . . . fourth side of control circuit, 20 . . . nonvolatile memory cell, 21 . . . nonvolatile memory device, 22 . . . selection device, 30 . . . first wire layer, 31, 31A, 32B . . . first wire, 32A, 32B . . . first contact hole, 33 . . . first control wire, 40 . . . second wire layer, 41 . . . second wire, 42A, 42B . . . second contact hole, 43 . . . second control wire, 50 . . . first control circuit, 50A . . . first(I) control circuit, 50B . . . first(II) control circuit, 51 . . . division region of first(I) control circuit, first(II) control circuit, 52 . . . region between memory cell unit and memory cell unit, 60 . . . second control circuit, 60A . . . second(I) control circuit, 60B . . . second(II) control circuit, 70 . . . silicon semiconductor substrate, 71, 72, 73, 74 . . . inter-layer insulating layer

What is claimed is:

1. A memory cell unit array, comprising
memory cell units arranged in a two-dimensional matrix form in a first direction and a second direction, the memory cell units being each constituted of
a plurality of first wires extending in the first direction,
a plurality of second wires that are disposed separately from the first wires in upper and lower directions and extend in the second direction unlike the first wires, and a nonvolatile memory cell that is disposed in a region in which the first wires and the second wires overlap one another and connected to the first wires and the second wires, wherein each of the memory cell units includes, below the memory cell unit, a control circuit that controls an operation of the memory cell unit, the control circuit is constituted of a first control circuit that controls an operation of the nonvolatile memory cell that constitutes the memory cell unit via the first wires, and a second control circuit that controls an operation of the nonvolatile memory cell that constitutes the memory cell unit via the second wires, the second wires that constitute the memory cell unit are connected to the second control circuit that constitutes the memory cell unit, some of the first wires that constitute the memory cell unit are connected to the first control circuit that constitutes the memory cell unit, and others of the first wires that constitute the memory cell unit are connected to a first control circuit that constitutes an adjacent memory cell unit adjacent thereto in the first direction.

2. The memory cell unit array according to claim 1, wherein, in each of the memory cell units, the first wires connected to the first control circuit that constitutes the memory cell unit and the first wires connected to the first control circuit that constitutes the adjacent memory cell unit are alternately disposed.

3. The memory cell unit array according to claim 1, wherein, the control circuit is covered with an inter-layer insulating layer, the first control circuit and the first wires are connected to one another via a first contact hole formed in the inter-layer insulating layer, and the second control circuit and the second wires are connected to one another via a second contact hole formed in the inter-layer insulating layer.

4. The memory cell unit array according to claim 1, wherein the control circuit is covered with an inter-layer insulating layer, the first control circuit and the first wires are connected to one another via a first control wire and a first contact hole formed in the inter-layer insulating layer, the second control circuit and the second wires are connected to one another via a second control wire and a second contact hole formed in the inter-layer insulating layer, the first control circuit and the second control wire do not overlap each other in the upper and lower directions, and the second control circuit and the first control wire do not overlap each other in the upper and lower directions.

5. The memory cell unit array according to claim 3, wherein when the first contact hole in one of the memory cell units and the first contact hole in the memory cell unit adjacent to the one memory cell unit in the first direction are projected in a virtual perpendicular plane parallel to the second direction, positions of projection images of the first contact holes are positioned at equal intervals along the second direction.

6. The memory cell unit array according to claim 1, wherein the second wires are, at end portions thereof, connected to the second control circuit.

7. The memory cell unit array according to claim 1, wherein the memory cell units are arranged in-line along the second direction and arranged offset from each other along the first direction.

8. The memory cell unit array according to claim 7, wherein the memory cell units are arranged in-line along the second direction and arranged offset from each other along the first direction by ½ of a length of the memory cell unit along the second direction.

9. The memory cell unit array according to claim 8, wherein half of the first wires that constitute the memory cell unit are connected to the first control circuit that constitutes the memory cell unit, and the other half of the first wires that constitute the memory cell unit are connected to the first control circuit that constitutes the adjacent memory cell unit adjacent thereto in the first direction.

10. The memory cell unit array according to claim 1, wherein the memory cell units are arranged in a stretcher bond pattern of brick patterns.

11. The memory cell unit array according to claim 10, wherein half of the first wires that constitute the memory cell unit are connected to the first control circuit that constitutes the memory cell unit, and the other half of the first wires that constitute the memory cell unit are connected to the first control circuit that constitutes the adjacent memory cell unit adjacent thereto in the first direction.

12. The memory cell unit array according to claim 1, wherein the first control circuit is constituted of two circuits, a first(I) control circuit and a first(II) control circuit, the second control circuit is constituted of two circuits, a second(I) control circuit and a second(II) control circuit, the first(I) control circuit is disposed along a first side of the control circuit, which extends in parallel to the second direction, the first(II) control circuit extends in parallel to the second direction and is disposed along a third side of the control circuit, which is opposed to the first side, the second(I) control circuit is disposed along a second side of the control circuit, which extends in parallel to the first direction, and the second(II) control circuit extends in parallel to the first direction and is disposed along a fourth side of the control circuit, which is opposed to the second side.

13. The memory cell unit array according to claim 12, wherein the second(I) control circuit is disposed to occupy the entire second side and occupy a part of the first side and a part of the third side, the second(II) control circuit is disposed to occupy the entire fourth side and occupy a part of the first side and a part of the third side, the first(I) control circuit is disposed to occupy a part of the first side, and the first(II) control circuit is disposed to occupy a part of the third side.

14. The memory cell unit array according to claim 1, wherein
the second control circuit is constituted of two circuits, a second(I) control circuit and a second(II) control circuit,
the second(I) control circuit is disposed along a second side of the control circuit, which extends in parallel to the first direction,
the second(II) control circuit extends in parallel to the first direction and is disposed along a fourth side of the control circuit, which is opposed to the second side, and
the first control circuit is disposed to extend from a first side of the control circuit, which extends in parallel to the second direction, to a third side of the control circuit, which is opposed to the first side.

15. The memory cell unit array according to claim 1, wherein
the first control circuit is constituted of two circuits, a first(I) control circuit and a first(II) control circuit,
the second control circuit is disposed to extend from a second side of the control circuit, which extends in parallel to the first direction, to a fourth side of the control circuit, which is opposed to the second side,
the first(I) control circuit is disposed along a first side of the control circuit, which extends in parallel to the second direction, and
the first(II) control circuit extends in parallel to the first direction and is disposed along a third side of the control circuit, which is opposed to the first side.

16. The memory cell unit array according to claim 1, wherein the nonvolatile memory cell is multi-layered having N layers (where N≥2).

17. The memory cell unit array according to claim 16, wherein
the first wires are formed in first wire layers that are N layers,
the second wires are formed in second wire layers that are N layers, and
the nonvolatile memory cell is formed between the first wire layer and the second wire layer.

18. The memory cell unit array according to claim 16, wherein
the first wires are formed in first wire layers that are (N/2+1) layers (where N is an even number equal to two or more),
the second wires are formed in a second wire layer that is (N/2) layer, and
the nonvolatile memory cell is formed between the first wire layer and the second wire layer.

19. The memory cell unit array according to claim 16, wherein
the first wires are formed in a first wire layer that is (N/2) layer (where N is an even number equal to two or more),
the second wires are formed in second wire layers that are (N/2+1) layers, and
the nonvolatile memory cell is formed between the first wire layer and the second wire layer.

20. The memory cell unit array according to claim 16, wherein
the first wires are formed in first wire layers that are {(N+1)/2} layers (where N is an odd number equal to three or more),
the second wires are formed in second wire layers that are {(N+1)/2} layers, and
the nonvolatile memory cell is formed between the first wire layer and the second wire layer.

* * * * *